(12) United States Patent
Yanagita et al.

(10) Patent No.: US 6,979,629 B2
(45) Date of Patent: Dec. 27, 2005

(54) METHOD AND APPARATUS FOR PROCESSING COMPOSITE MEMBER

(75) Inventors: Kazutaka Yanagita, Kanagawa (JP); Kazuaki Ohmi, Kanagawa (JP); Kiyofumi Sakaguchi, Kanagawa (JP); Hirokazu Kurisu, Hyogo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/678,146

(22) Filed: Oct. 6, 2003

(65) Prior Publication Data

US 2004/0067621 A1 Apr. 8, 2004

Related U.S. Application Data

(62) Division of application No. 09/910,017, filed on Jul. 23, 2001, now Pat. No. 6,653,206.

(30) Foreign Application Priority Data

Jul. 31, 2000 (JP) .............................. 2000-231781

(51) Int. Cl.[7] .......................... H01L 21/30; H01L 21/46
(52) U.S. Cl. ................... 438/458; 438/406; 438/455; 438/977; 156/64; 156/230; 156/241; 156/378; 156/380.8; 156/580
(58) Field of Search ............................ 438/455, 458, 438/977; 117/58, 94; 216/20, 95; 257/347, 257/466; 73/104, 863, 432; 156/60, 64, 351, 156/358, 378, 379, 379.8, 380.2, 380.6, 380.8, 156/580, 230, 247, 344

(56) References Cited

U.S. PATENT DOCUMENTS

| | | | |
|---|---|---|---|
| 5,109,701 A * | 5/1992 | Jacobsen et al. | 73/782 |
| 5,371,037 A | 12/1994 | Yonehara | 437/86 |
| 5,811,348 A | 9/1998 | Matsushita et al. | 438/455 |
| 5,856,229 A | 1/1999 | Sakaguchi et al. | 438/406 |
| 5,869,386 A | 2/1999 | Hamajima et al. | 438/455 |
| 6,096,155 A * | 8/2000 | Harden et al. | 156/250 |
| 6,136,684 A * | 10/2000 | Sato et al. | 438/624 |
| 6,214,701 B1 | 4/2001 | Matsushita et al. | 438/458 |
| 6,376,332 B1 * | 4/2002 | Yanagita et al. | 438/458 |
| 6,830,985 B2 * | 12/2004 | Oi et al. | 438/401 |
| 2002/0096717 A1 | 7/2002 | Chu et al. | 257/347 |

FOREIGN PATENT DOCUMENTS

| | | |
|---|---|---|
| JP | 5-21338 | 1/1993 |
| JP | 7-302889 | 11/1995 |

OTHER PUBLICATIONS

Uhlir, A., Jr. "Electrolytic Shaping of Germanium and Silicon," *The Bell System Technical Journal*, V. 35. 1956. Pp. 333-347.

(Continued)

*Primary Examiner*—Amir Zarabian
*Assistant Examiner*—Pamela E Perkins
(74) *Attorney, Agent, or Firm*—Fitzpatrick, Cella, Harper & Scinto

(57) ABSTRACT

A detection apparatus for detecting a feature portion of a composite member having a structure in which a first member having a separation layer inside is brought into tight contact with a second member. The composite member has, as the feature portion, a portion at which a peripheral edge of the first member projects outside a peripheral edge of the second member. The apparatus includes a shift detection section which detects a shift between the peripheral edge of the first member and the peripheral edge of the second member along an outer periphery of the composite member and a determination section which determines the feature portion on the basis of a detection result by the shift detection section.

11 Claims, 44 Drawing Sheets

OTHER PUBLICATIONS

Unagami, T. "Formation Mechanisms of Porous Silicon Layer by Anodization in HF Solution," *Journal of the Electrochemical Society*, V. 127, No. 2, Feb. 1980. Pp. 476-483.

Imai, K. "A New Dielectric Isolation Method Using Porous Silicon," *Solid State Electronics, An International Journal*, V. 24, No. 2, Feb. 1981, Pp. 159-164.

Holmstrom, R.P., et al., "Complete dielectric isolation by highly selective and self-stopping formation of oxidized porous silicon," *Applied Physics Letter*, V. 42, No. 4, Feb. 15, 1983. Pp. 386-388.

Nagano, K, et al. "Oxidized Porous Silicon and It's Application," Semiconductor Research Lab, Matsushita Electric Industrial Co., Ltd., IEICE Technical Report, vol. 79, SSD79-9549 (1979).

* cited by examiner

F I G. 1F
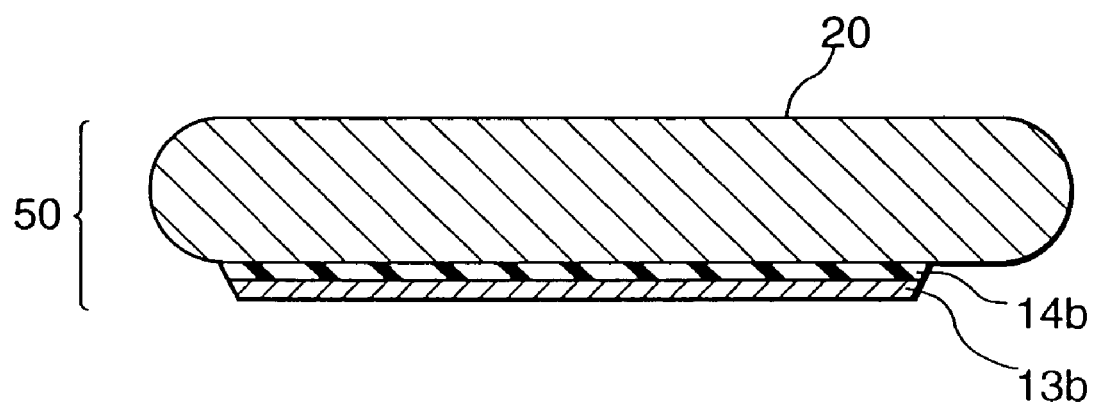

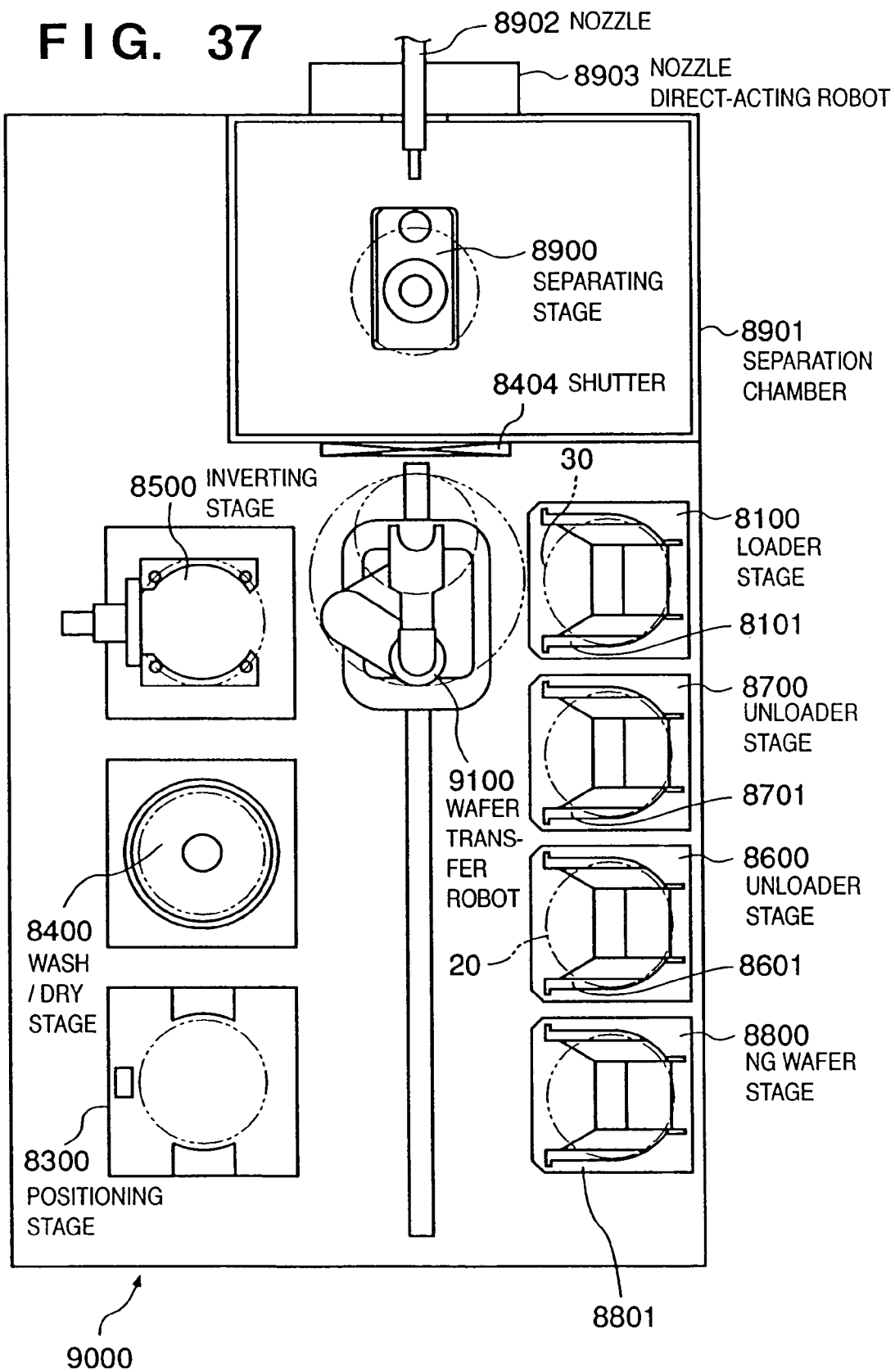

METHOD AND APPARATUS FOR PROCESSING COMPOSITE MEMBER

This application is a divisional application of U.S. patent application Ser. No. 09/910,017, filed Jul. 23, 2001 now U.S. Pat. No. 6,653,206.

FIELD OF THE INVENTION

The present invention relates to a method and an apparatus for separating a composite member such as a bonded substrate stack, a thin film manufacturing method, a method and an apparatus for detecting a feature portion of a composite member, and a composite member processing apparatus.

BACKGROUND OF THE INVENTION

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A complete depletion type field effect transistor can be formed by thin film formation.

Since an SOI structure has the above various advantages, researches have been made on its formation method for several decades.

As a method, an SOI structure is formed by bonding a single-crystal Si substrate to another thermally oxidized single-crystal Si substrate by annealing or an adhesive. In this method, an active layer for forming a device must be uniformly thin. More specifically, a single-crystal Si substrate having a thickness of several hundred microns must be thinned down to the micron order or less.

To thin the substrate, polishing or selective etching can be used.

A single-crystal Si substrate can hardly be uniformly thinned by polishing. Especially, in thinning to the submicron order, the variation range is several tens of percent. As the wafer size becomes large, this difficulty becomes more pronounced.

Selective etching is effective to uniformly thin the substrate. However, the selectivity ratio is as low as about $10^2$, the surface planarity after etching is poor, and the crystallinity of the SOI layer is unsatisfactory.

The present applicant has disclosed a new SOI technique in Japanese Patent Laid-Open No. 5-21338. In this technique, a first substrate obtained by forming a porous layer on a single-crystal Si substrate and a non-porous single-crystal layer on its surface is bonded to a second substrate via an insulating layer. After this, the bonded substrate stack is separated into two substrates at the porous layer, thereby transferring the non-porous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred-Å to 10-μm thick SOI films can be manufactured by a single manufacturing apparatus.

The present applicant has also disclosed, in Japanese Patent Laid-Open No. 7-302889, a technique of bonding first and second substrates, separating the first substrate from the second substrate without breaking the first substrate, smoothing the surface of the separated first substrate, forming a porous layer again, and reusing the substrate. Since the first substrate is not wasted, this technique is advantageous in largely reducing the manufacturing cost and simplifying the manufacturing process.

To separate the bonded substrate stack into two substrates without breaking the first and second substrates, the following methods are available: the two substrates are pulled in opposite directions while applying a force in a direction perpendicular to the bonding interface; a shearing force is applied parallel to the bonding interface (for example, the two substrates are moved in opposite directions in a plane parallel to the bonding interface, or the two substrates are rotated in opposite directions while applying a force in the circumferential direction); pressure is applied in a direction perpendicular to the bonding interface; a wave energy such as an ultrasonic wave is applied to the separation region; a peeling member (e.g., a sharp blade such as a knife) is inserted into the separation region parallel to the bonding interface from the side surface side of the bonded substrate stack; the expansion energy of a substance filling the pores of the porous layer functioning as the separation region is used; the porous layer functioning as the separation region is thermally oxidized from the side surface of the bonded substrate stack to expand the volume of the porous layer and separate the substrates; and the porous layer functioning as the separation region is selectively etched from the side surface of the bonded substrate stack to separate the substrates.

Porous Si was found in 1956 by Uhlir et al. who were studying electropolishing of semiconductors (A. Uhlir, Bell Syst. Tech. J., vol. 35, 333 (1956)). Porous Si can be formed by anodizing an Si substrate in an HF solution.

Unagami et al. studied the dissolution reaction of Si upon anodizing and reported that holes were necessary for anodizing reaction of Si in an HF solution, and the reaction was as follows (T. Unagami, J. Electrochem. Soc., vol. 127, 476 (1980)).

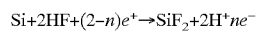

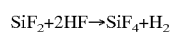

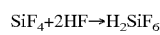

or

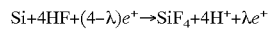

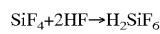

where $e^+$ and $e^-$ represent a hole and an electron, respectively, and n and λ are the number of holes necessary to dissolve one Si atom. According to them, when n>2 or λ>4, porous Si is formed.

The above fact suggests that p-type Si having holes is converted into porous Si while n-type Si is not converted. The selectivity in this conversion has been reported by Nagano et al. and Imai (Nagano, Nakajima, Anno, Onaka, and Kajiwara, IEICE Technical Report, vol. 79, SSD79-9549 (1979)), (K. Imai, Solid-State Electronics, vol. 24, 159 (1981)).

However, it has also been reported that n-type at a high concentration is converted into porous Si (R. P. Holmstrom and J. Y. Chi, Appl. Phys. Lett., vol. 42, 386 (1983)). Hence, it is important to select a substrate which can be converted into a porous Si substrate independently of p- or n-type.

To form a porous layer, instead of the above anodizing method, for example, a method of implanting ions into a silicon substrate may also be used.

For example, in the method described in Japanese Patent Laid-Open No. 5-21338, i.e., the method of preparing a substrate (to be referred to as a bonded substrate stack hereinafter) by bonding a first substrate having a non-porous layer such as a single-crystal Si layer on a porous layer to a second substrate via an insulating layer, and separating the bonded substrate stack at the porous layer so as to transfer the non-porous layer formed on the first substrate side to the second substrate, the technique of separating the bonded substrate stack is very important.

For example, in separating the bonded substrate stack, if the bonded substrate stack is separated at a portion other than the porous layer serving as a separation layer, for example, the non-porous layer (e.g., a single-crystal Si layer) to be used as an active layer breaks, and no desired SOI substrate is obtained.

SUMMARY OF THE INVENTION

The present invention has been made in consideration of the above situation, and has as its object to appropriately separate a composite member such as a bonded substrate stack at a separation layer such as a porous layer.

A processing method according to the first aspect of the present invention relates to a method of separating a composite member having a structure in which a first member having a separation layer inside is brought into tight contact with a second member. The composite member has a projecting portion at which a peripheral edge of the first member projects outside a peripheral edge of the second member. The processing method comprises the detection step of detecting the projecting portion of the composite member, and the separation step of starting separating the composite member from the projecting portion detected in the detection step and then separating the composite member into two members at the separation layer.

The composite member preferably has a structure in which the first and second members are brought into tight contact with each other while shifting central positions.

The separation step preferably comprises, e.g., the pre-separation step of forming a separation start portion by processing the projecting portion, and the main separation step of starting separating the composite member from the separation start portion and then substantially breaking only the separation layer to separate the composite member into two members at the separation layer.

In the detection step, the projecting portion is detected using, e.g., a noncontact or contact sensor.

In the detection step, the projecting portion can be detected using, e.g., a sensor arranged on a side of a peripheral edge of the composite member.

In the detection step, the projecting portion can be detected using, e.g., a sensor arranged at a position opposing a bonding interface between the first and second members.

In the detection step, the projecting portion can be detected by, e.g., detecting a shift amount between the peripheral edge of the first member and the peripheral edge of the second member along an outer periphery of the composite member.

In the detection step, the projecting portion can be detected by, e.g., sensing the composite member with an image sensing device and processing a sensed image.

In the detection step, the projecting portion can be detected by, e.g., sensing the composite member with an image sensing device while illuminating the composite member so as to form a shadow at the projecting portion, and processing a sensed image.

In the detection step, the projecting portion can be detected by, e.g., sensing a peripheral edge of the composite member with an image sensing device arranged in a tangent direction and processing a sensed image.

This separating method preferably further comprises the arrangement step of, before execution of the separation step, arranging the composite member to make the projecting portion detected in the detection step match a work position in the separation step.

In the detection step, preferably, a portion where the peripheral edge of the first member most largely projects is detected as the projecting portion.

According to the second aspect of the present invention, there is provided a thin film manufacturing method including the step of transferring a transfer layer on a surface of a first member to a second member, comprising the preparation step of bringing the first member having a separation layer inside and the transfer layer on the separation layer into tight contact with the second member to prepare a composite member having a projecting portion at which a peripheral edge of the first member projects outside a peripheral edge of the second member, the detection step of detecting the projecting portion of the composite member, and the separation step of starting separating the composite member from the projecting portion detected in the detection step and then separating the composite member into two members at the separation layer, thereby transferring the transfer layer of the first member to the second member.

A processing method according to the third aspect of the present invention relates to a separating method of separating a bonded substrate stack, which has a structure in which a transfer layer of a first substrate having a separation layer inside and the transfer layer on the separation layer is brought into tight contact with a second substrate, into two substrates. The bonded substrate stack has a projecting portion at which a peripheral edge of the first substrate projects outside a peripheral edge of the second substrate. The separating method comprises the detection step of detecting the projecting portion of the bonded substrate stack, and the separation step of starting separating the bonded substrate stack from the projecting portion detected in the detection step and then separating the bonded substrate stack into two substrates at the separation layer.

Preferably, the first and second substrates have the same size, and the bonded substrate stack has a structure in which the first and second substrates are brought into tight contact with each other while shifting central positions.

The separation step preferably comprises the pre-separation step of forming a separation start portion by processing the projecting portion, and the main separation step of starting separating the bonded substrate stack from the separation start portion and then substantially breaking only the separation layer to separate the bonded substrate stack into two substrates at the separation layer.

In the detection step, the projecting portion can be detected using, e.g., a noncontact or contact sensor.

In the detection step, the projecting portion can be detected using, e.g., a sensor arranged on a side of a peripheral edge of the bonded substrate stack.

In the detection step, the projecting portion can be detected using, e.g., a sensor arranged at a position opposing a bonding interface between the first and second substrates.

In the detection step, the projecting portion can be detected by, e.g., detecting a shift amount between the peripheral edge of the first substrate and the peripheral edge of the second substrate along an outer periphery of the bonded substrate stack.

In the detection step, the projecting portion can be detected by, e.g., sensing the bonded substrate stack with an image sensing device and processing a sensed image.

In the detection step, the projecting portion can be detected by, e.g., sensing the bonded substrate stack with an image sensing device while illuminating the bonded substrate stack so as to form a shadow at the projecting portion, and processing a signal of a sensed image.

In the detection step, the projecting portion can be detected by, e.g., sensing a peripheral edge of the bonded substrate stack with an image sensing device arranged in a tangent direction and processing a signal of a sensed image.

This processing method preferably further comprises the arrangement step of, before execution of the separation step, arranging the bonded substrate stack to make the projecting portion detected in the detection step match a work position in the separation step.

In the detection step, preferably, a portion where the peripheral edge of the first substrate most largely projects is detected as the projecting portion.

According to the fourth aspect of the present invention, there is provided a thin film manufacturing method including the step of transferring a transfer layer on a surface of a first substrate to a second substrate, comprising the preparation step of bonding the transfer layer of the first substrate having a separation layer inside and the transfer layer on the separation layer to the second substrate to prepare a bonded substrate stack having a projecting portion at which a peripheral edge of the first substrate projects outside a peripheral edge of the second substrate, the detection step of detecting the projecting portion of the bonded substrate stack, and the separation step of starting separating the bonded substrate stack from the projecting portion detected in the detection step and then separating the bonded substrate stack at the separation layer, thereby transferring the transfer layer of the first substrate to the second substrate.

According to the fifth aspect of the present invention, there is provided a thin film manufacturing method comprising the preparation step of bonding a surface of a first substrate having a separation layer inside and a transfer layer on the separation layer to a second substrate to prepare a bonded substrate stack having a projecting portion at which a peripheral edge of the first substrate projects outside a peripheral edge of the second substrate, the detection step of detecting the projecting portion of the bonded substrate stack, and the separation step of starting separating the bonded substrate stack from the projecting portion detected in the detection step and then separating the bonded substrate stack at the separation layer, thereby transferring the transfer layer of the first substrate to the second substrate.

The transfer layer includes, e.g., a single-crystal Si layer. The transfer layer may have not only the single-crystal Si layer but also an insulating layer on the single-crystal Si layer.

In the preparation step, for example, the first and second substrates having the same size are preferably brought into tight contact with each other while shifting central positions to prepare the bonded substrate stack.

The separation step preferably comprises the pre-separation step of forming a separation start portion by processing the projecting portion, and the main separation step of starting separating the bonded substrate stack from the separation start portion and then substantially breaking only the separation layer to separate the bonded substrate stack into two substrates at the separation layer.

In the pre-separation step, the separation start portion can be formed by, e.g., injecting a fluid to the projecting portion.

In the pre-separation step, the separation start portion can be formed by, e.g., inserting a wedge-shaped member to a gap between the first substrate and the second substrate at the projecting portion.

In the separation step, the separation start portion can be formed on the bonded substrate stack by injecting a fluid to the projecting portion, and then, separation of the bonded substrate stack can be continued while changing a position to which the fluid is injected.

In the separation step, the bonded substrate stack can be separated by, e.g., inserting a wedge-shaped member to a gap between the first substrate and the second substrate at the projecting portion.

The separation start portion is, e.g., a portion at which the separation layer has a most fragile structure.

The separation start portion is, e.g., a portion at which the transfer layer is removed and the separation layer under the transfer layer is exposed.

At the separation start portion, for example, the separation layer is exposed and a peripheral edge of the separation layer has a recess inward of the bonded substrate stack.

In the detection step, the projecting portion is detected using, e.g., a noncontact or contact sensor.

In the detection step, the projecting portion can be detected using, e.g., a sensor arranged on a side of a peripheral edge of the bonded substrate stack.

In the detection step, the projecting portion can be detected using, e.g., a sensor arranged at a position opposing a bonding interface between the first and second substrates.

In the detection step, the projecting portion can be detected by, e.g., detecting a shift amount between the peripheral edge of the first substrate and the peripheral edge of the second substrate along an outer periphery of the bonded substrate stack.

In the detection step, the projecting portion can be detected by, e.g., sensing the bonded substrate stack with an image sensing device and processing a signal of a sensed image.

In the detection step, the projecting portion can be detected by, e.g., sensing the bonded substrate stack with an image sensing device while illuminating the bonded substrate stack so as to form a shadow at the projecting portion, and processing a signal of a sensed image.

In the detection step, the projecting portion can be detected by, e.g., sensing a peripheral edge of the bonded substrate stack with an image sensing device arranged in a tangent direction and processing a signal of a sensed image.

The substrate manufacturing method preferably further comprises the arrangement step of, before execution of the separation step, arranging the bonded substrate stack to make the projecting portion detected in the detection step match a work position in the separation step.

In the detection step, preferably, a portion where the peripheral edge of the first substrate most largely projects is detected as the projecting portion.

A detection method according to the sixth aspect of the present invention relates to a detection method of detecting a feature portion of a composite member having a structure in which a first member having a separation layer inside is brought into tight contact with a second member. The composite member has, as the feature portion, a portion at which a peripheral edge of the first member projects outside a peripheral edge of the second member. The detection method comprises the shift detection step of detecting a shift between the peripheral edge of the first member and the peripheral edge of the second member along an outer periphery of the composite member, and the determination step of determining the feature portion on the basis of a detection result in the shift detection step.

In the shift detection step, for example, the shift between the peripheral edge of the first member and the peripheral edge of the second member is preferably detected along a perimeter of the composite member.

In the shift detection step, the shift is detected using, e.g., a noncontact or contact sensor.

In the shift detection step, the shift can be detected using, e.g., a sensor arranged on a side of a peripheral edge of the composite member.

In the shift detection step, the shift can be detected using, e.g., a sensor arranged at a position opposing a bonding interface between the first and second members.

In the shift detection step, the shift can be detected by, e.g., sensing the composite member with an image sensing device and processing a signal of a sensed image.

In the shift detection step, the shift can be detected by, e.g., sensing the composite member with an image sensing device while illuminating the composite member so as to form a shadow at the projecting portion, and processing a sensed image.

In the shift detection step, the shift can be detected by, e.g., sensing a peripheral edge of the composite member with an image sensing device arranged in a tangent direction and processing a sensed image.

In the determination step, preferably, a portion where the peripheral edge of the first member most largely projects is determined as the feature portion.

A processing method according to the seventh aspect of the present invention relates to a processing method of positioning, to a predetermined position, a feature portion of a composite member having a structure in which a first member having a separation layer inside is brought into tight contact with a second member. The composite member has, as the feature portion, a portion at which a peripheral edge of the first member projects outside a peripheral edge of the second member. The processing method comprises the shift detection step of detecting a shift between the peripheral edge of the first member and the peripheral edge of the second member along an outer periphery of the composite member, the determination step of determining the feature portion on the basis of a detection result in the shift detection step, and the arrangement step of arranging the composite member to make the feature portion determined in the determination step match the predetermined position.

A detection apparatus according to the eighth aspect of the present invention relates to a detection apparatus for detecting a feature portion of a composite member having a structure in which a first member having a separation layer inside is brought into tight contact with a second member. The composite member has, as the feature portion, a portion at which a peripheral edge of the first member projects outside a peripheral edge of the second member. The detection apparatus comprises shift detection means for detecting a shift between the peripheral edge of the first member and the peripheral edge of the second member along an outer periphery of the composite member, and determination means for determining the feature portion on the basis of a detection result by the shift detection means.

The shift detection means preferably detects the shift between the peripheral edge of the first member and the peripheral edge of the second member along a perimeter of the composite member.

The shift detection means detects the shift using, e.g., a noncontact or contact sensor.

The shift detection means has, e.g., a sensor arranged on a side of a peripheral edge of the composite member and can detect the shift using the sensor.

The shift detection means has, e.g., a sensor arranged at a position opposing a bonding interface between the first and second members and can detect the shift using the sensor.

The shift detection means has, e.g., an image sensing device and can detect the shift by sensing the composite member and processing a sensed image.

The shift detection means has, e.g., an illumination device and an image sensing device and can detect the shift by sensing the composite member with the image sensing device while illuminating the composite member with the illumination device so as to form a shadow at the projecting portion, and processing a sensed image.

The shift detection means has, e.g., an image sensing device arranged in a tangent direction of a peripheral edge of the composite member and can detect the shift by sensing the peripheral edge of the composite member with the image sensing device and processing a sensed image.

The determination means preferably determines, as the feature portion, a portion where the peripheral edge of the first member most largely projects.

A positioning apparatus according to the ninth aspect of the present invention relates to a positioning apparatus for positioning, to a predetermined position, a feature portion of a composite member having a structure in which a first member having a separation layer inside is brought into tight contact with a second member. The composite member has, as the feature portion, a portion at which a peripheral edge of the first member projects outside a peripheral edge of the second member, The positioning apparatus comprises shift detection means for detecting a shift between the peripheral edge of the first member and the peripheral edge of the second member along an outer periphery of the composite member, determination means for determining the feature portion on the basis of a detection result by the shift detection means, and arrangement means for arranging the composite member to make the feature portion determined by the determination means match the predetermined position.

A processing apparatus according to the tenth aspect of the present invention comprises a positioning apparatus for positioning a feature portion of a composite member having a structure in which a first member having a separation layer inside is brought into tight contact with a second member, and a processing device for processing the composite member at a work position. In the processing apparatus, the composite member has, as the feature portion, a portion at which a peripheral edge of the second member, and the positioning apparatus positions the feature portion of the composite member to the work position of the processing apparatus.

The processing device preferably comprises a separating apparatus for starting separating the composite member from the feature portion and then separating the composite member into two members at the separation layer.

A semiconductor device manufacturing method according to the eleventh aspect of the present invention comprises the steps of preparing an SOI substrate made using the thin film manufacturing method according to the fifth aspect of the present invention, and element-isolating an SOI layer of the SOI substrate so as to form a transistor on the element-isolated SOI layer.

The transistor is, e.g., a partial depletion type FET or a complete depletion type FET.

A semiconductor device according to the twelfth aspect of the present invention can be manufactured by the semiconductor device manufacturing method according to the eleventh aspect of the present invention.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1F is a schematic view for explaining the step of removing the porous layer on the second substrate side and the substrate to be manufactured in the substrate manufacturing method according to the preferred embodiment of the present invention;

FIG. 37 is a view showing a processing system according to the third arrangement example.

DETAILED DESCRIPTION OF THE PREFERRED EMBODIMENTS

Preferred embodiments of the present invention will be described below with reference to the accompanying drawings.

FIGS. 1A to 1E are schematic views for explaining a method of manufacturing a substrate having, e.g., an SOI structure according to a preferred embodiment of the present invention.

Figure 1A:
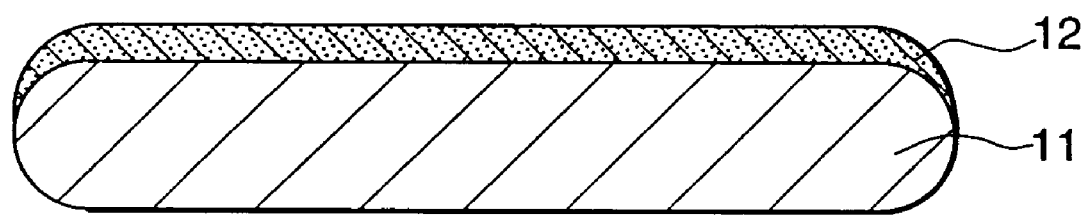
FIG. 1A is a schematic view for explaining the step of forming a porous layer in a substrate manufacturing method according to a preferred embodiment of the present invention.

In the step shown in FIG. 1A, a single-crystal Si substrate 11 to be used to form a first substrate (prime wafer or seed wafer) 10 is prepared, and a porous Si layer 12 is formed on the major surface of the single-crystal Si substrate 11. The porous Si layer 12 can be formed by, e.g., anodizing the single-crystal Si substrate 11 in an electrolyte solution (anodizing solution).

As the electrolyte solution, for example, a solution containing hydrogen fluoride, a solution containing hydrogen fluoride and ethanol, a solution containing hydrogen fluoride and isopropyl alcohol, or the like can be used. More specifically, as the electrolyte solution, for example, a solution mixture containing an HF aqueous solution (HF concentration=49 wt %) and ethanol at a volume ratio of 2:1 can be used.

The porous Si layer 12 may have a multilayered structure including two or more layers with different porosities. The porous Si layer 12 having a multilayered structure preferably includes the first porous Si layer with the first porosity on the surface side of the first substrate, and, under the first porous Si layer, the second porous Si layer with the second porosity higher than the first porosity. Another porous layer (third porous layer) is also preferably formed under the second porous Si layer. With such a multilayered structure, a non-porous layer 13 free from defects can be formed on the first porous Si layer in the step of forming the non-porous layer 13 later, and a bonded substrate stack can be separated at a desired position in the separation step layer. The first porosity is preferably 10% to 30% and, more preferably, 15% to 25%. The second porosity is preferably 35% to 70% and, more preferably, 40% to 60%.

When the above solution mixture (49 wt % hydrofluoric acid: ethanol=2:1) is used as the electrolyte solution, preferably, for example, the first layer (surface side) is formed at a current density of 8 mA/cm² for a process time of 5 to 11 min, and the second layer (inner surface side) is formed at a current density of 23 to 33 mA/cm² for a process time of 80 sec to 2 min.

Next, at least one of the following steps (1) to (4) is preferably executed. The steps (1) and (2) are preferably executed in this order. More preferably, the steps (1), (2), and (3), or (1), (2), and (4) are executed in this order. Most preferably, the steps (1), (2), (3), and (4) are executed in this order.

(1) Step of forming protective film on porous walls in porous Si layer (pre-oxidation step).

In this step, a protective film such as an oxide film or nitride film is formed on the porous walls in the porous Si layer 12, thereby preventing any increase in porous size by later annealing. The protective film can be formed by performing annealing in an oxygen atmosphere (preferably at, e.g., 200° C. to 700° C., and more preferably at 300° C. to 500° C.). After that, the oxide film or the like formed on the surface of the porous Si layer 12 is preferably removed. This can be done by, e.g., exposing the surface of the porous Si layer 12 to a solution containing hydrofluoric acid.

(2) Hydrogen baking step (pre-baking step).

In this step, the first substrate 10 on which the porous Si layer 12 is formed is annealed in a reduction atmosphere containing hydrogen at 800° C. to 1,200° C. With this annealing, pores on the surface of the porous Si layer 12 can be sealed to some extent. If a native oxide film is present on the surface of the porous Si layer 12, it can be removed.

(3) Trace material supply step (pre-injection step).

When the non-porous layer 13 is to be grown on the porous Si layer 12, the non-porous layer 13 is preferably grown at a low speed by supplying a trace of raw material substance of the non-porous layer 13 at the initial stage of growth. With this growing method, atomic migration on the surface of the porous Si layer 12 is promoted, and pores on the surface of the porous Si layer 12 can be sealed. More specifically, the supply of the raw material is controlled such that the growth rate becomes 20 nm/min or less, preferably 10 nm/min or less, and more preferably, 2 nm/min or less.

(4) High-temperature baking step (intermediate baking step).

When annealing is executed in a reduction atmosphere containing hydrogen at a temperature higher than that in the above hydrogen baking step and/or trace material supply step, further sealing and flattening of the porous Si layer 12 can be realized.

Figure 1B:
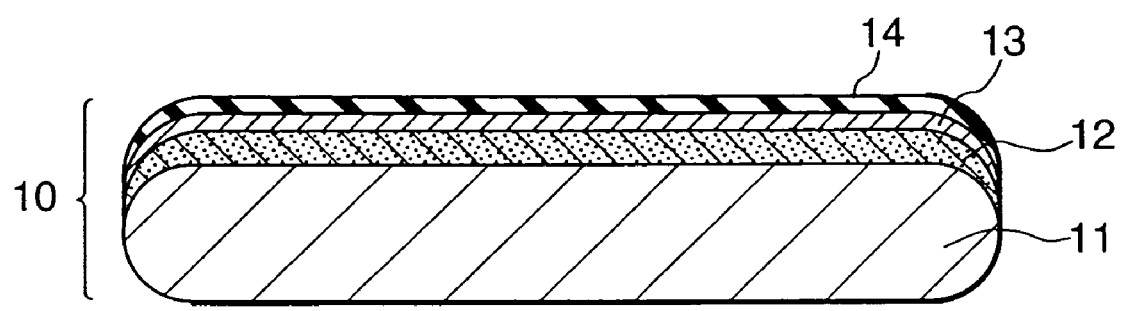
FIG. 1B is a schematic view for explaining the step of forming a non-porous layer (e.g., a single-crystal Si layer and insulating layer) in the substrate manufacturing method according to the preferred embodiment of the present invention.

At the first stage of the step shown in FIG. 1B, the first non-porous layer 13 is formed on the porous Si layer 12. As the first non-porous layer 13, an Si layer such as a single-crystal Si layer, poly-Si layer, or amorphous Si layer, Ge layer, SiGe layer, SiC layer, C layer, GaAs layer, GaN layer, AlGaAs layer, InGaAs layer, InP layer, or InAs layer can be used.

At the second stage of the step shown in FIG. 1B, an SiO₂ layer (insulating layer) 14 as the second non-porous layer is formed on the first non-porous layer 13. With this process, the first substrate 10 is obtained. The SiO$_2$ layer 14 can be formed, e.g., in an O$_2$/H$_2$ atmosphere at 1,100° C. for 10 to 33 min.

Figure 1C:
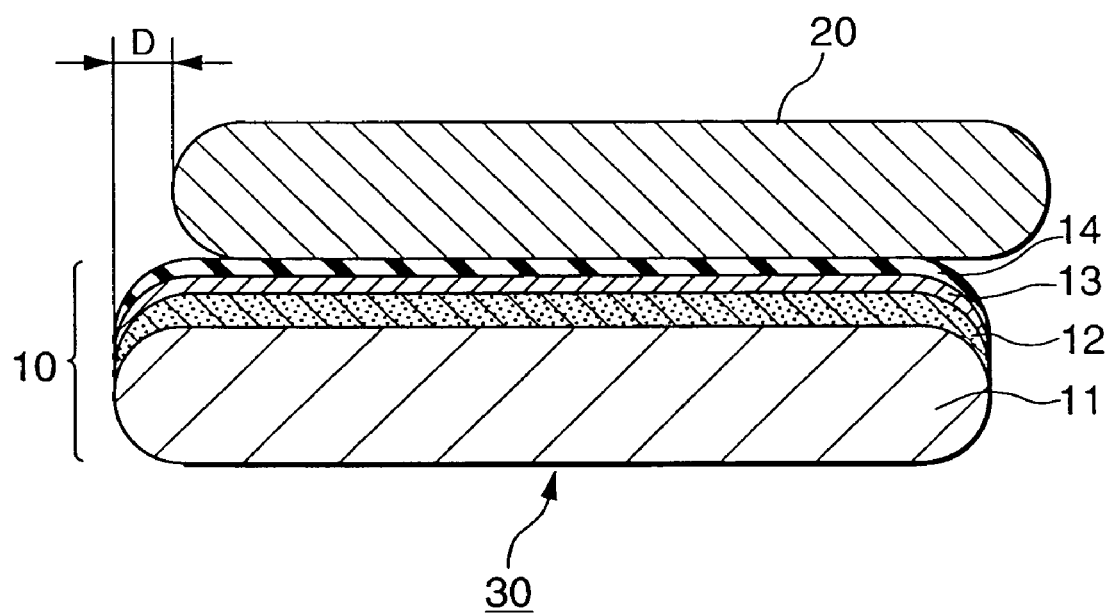
FIG. 1C is a schematic view for explaining the bonding step in the substrate manufacturing method according to the preferred embodiment of the present invention.

In the step shown in FIG. 1C, a second substrate (handle wafer) 20 is prepared and brought into tight contact with the first substrate 10 at room temperature while making the insulating layer 14 face the second substrate 20, thereby forming a bonded substrate stack 30.

In the preferred embodiment of the present invention, the bonded substrate stack 30 is formed such that the substrate (i.e., first substrate 10) having the porous layer 12 as a layer for separation (separation layer) has a portion (to be referred to as a projecting portion hereinafter) where the peripheral edge is partially located outside that of the second substrate 20. To form this bonded substrate stack 30, for example, a method of bringing the first and second substrates 10 and 20 having the same size into tight contact with each other while shifting their central positions may be used.

Figure 2:
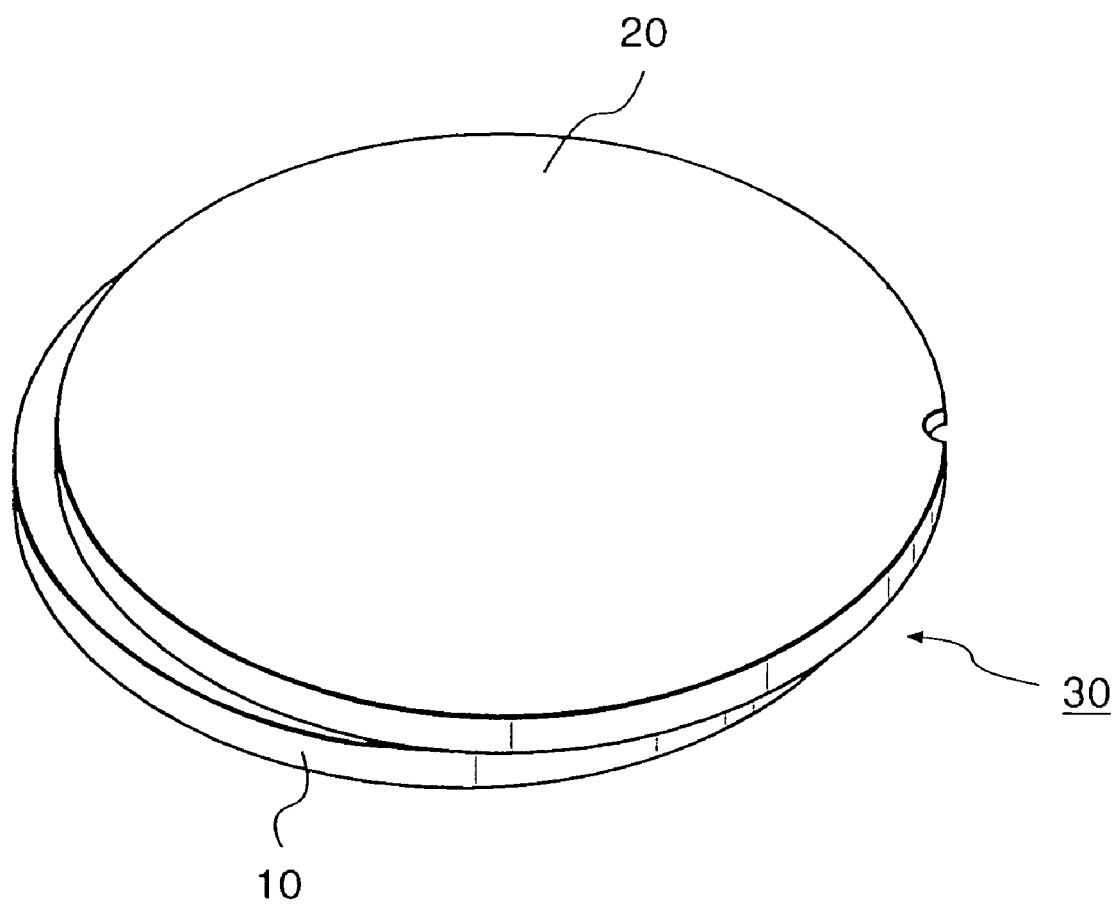
FIG. 2 is a perspective view showing an example of a bonded substrate stack having a projecting portion formed by bonding first and second substrates whose central positions are shifted.

FIG. 1C is a schematic view for explaining an example in which the method of bringing the first and second substrates 10 and 20 having the same size into tight contact with each other while shifting their central positions is applied. For example, 0.1 to 0.5 mm suffices as a projecting amount D of part of the first substrate 10, though the projecting amount D may be larger. FIG. 2 is a perspective view schematically showing an example of the bonded substrate stack 30 shown in FIG. 1C.

The SiO$_2$ layer 14 can be formed either on the single-crystal Si layer 13 side, or on the second substrate 20, or on both the single-crystal Si layer 13 and the second substrate 20 as long as the state shown in FIG. 1C is obtained when the first and second substrates are brought into tight contact with each other. However, when the insulating layer 14 is formed on the first non-porous layer (e.g., a single-crystal Si layer) 13 side serving as an active layer, as described above, the bonding interface between the first substrate 10 and the second substrate 20 can be separated from the active layer, and a semiconductor substrate such as an SOI substrate with a higher quality can be obtained.

After the substrates 10 and 20 are completely brought into tight contact, processing of strengthening bonding between the substrates is preferably executed. As an example of this processing, processing of, e.g., (1) executing annealing in an N$_2$ atmosphere at 1,100° C. for 10 minutes and (2) executing annealing (oxidation) in an O$_2$/H$_2$ atmosphere at 1,100° C. for 50 to 100 minutes is preferably performed. In addition to this processing, or in place of this processing, anodic bonding and/or compression may be executed.

As the second substrate 20, an Si substrate, a substrate obtained by forming an SiO$_2$ layer on an Si substrate, a transparent substrate formed from quartz or the like, or a sapphire substrate can be used. However, a substrate of another type which has a sufficiently flat surface to be bonded may be used as the second substrate 20.

In the step shown in FIG. 1D, the position of a projecting portion 41 is detected by a method to be described later, and a separation start portion 40 where separation should start is formed at the projecting portion 41. More specifically, a transfer layer (first and second non-porous layers 13 and 14) in at least a partial region of the projecting portion 41 of the first substrate 10 is removed, and the porous layer under the transfer layer is removed as needed, thereby forming the separation start portion 40. To form the separation start portion 40, for example, the following methods can be used.

(1) A fluid is injected to the projecting portion to break and remove the transfer layer and underlying porous layer 12 at that portion.

(2) A wedge is inserted near the bonding interface (bonding interface between the first substrate 10 and the second substrate 20) at the projecting portion so as to break and remove the transfer layer and underlying porous layer 12 at that portion.

Figure 1D:
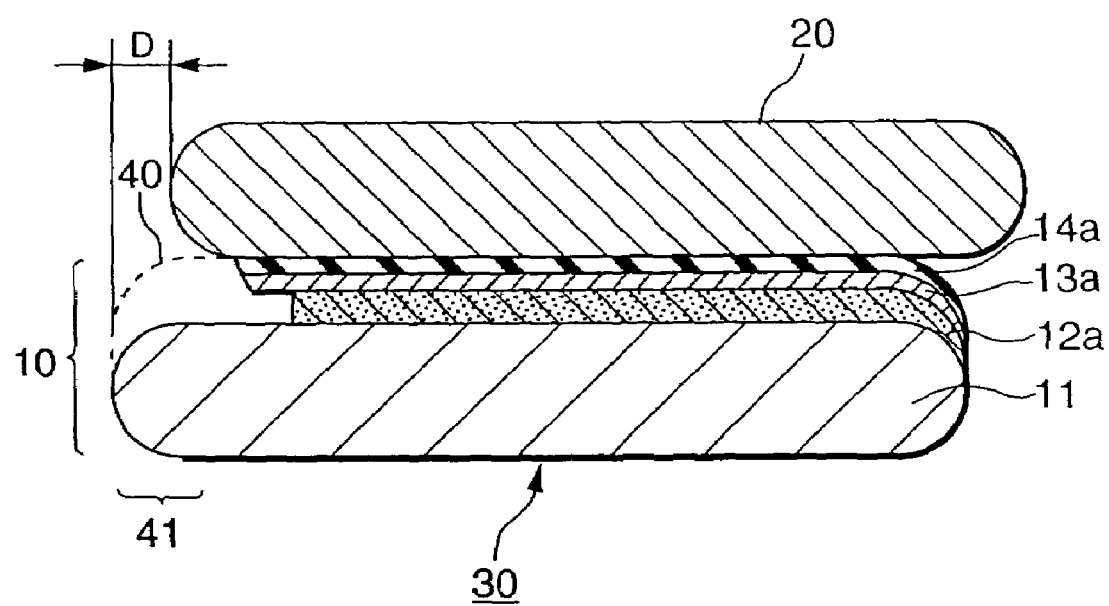
FIG. 1D is a schematic view for explaining the step of forming a separation start region (pre-separation step) in the substrate manufacturing method according to the preferred embodiment of the present invention.

Referring to FIG. 1D, reference numeral 12*a* denotes a porous layer after formation of the separation start portion 40; 13*a*, a first non-porous layer (e.g., a single-crystal Si layer) after formation of the separation start portion 40; and 14*a*, an insulating layer as the second non-porous layer after formation of the separation start portion 40.

The separation start portion 40 preferably has a structure that actually allows only the porous layer 12 to break to separate the bonded substrate stack into two substrates in the subsequent separation step. Alternatively, the separation start portion 40 is preferably a portion where the porous layer 12 is mechanically more fragile than the first non-porous layer (e.g., a single-crystal Si layer) 13*a*, second non-porous layer (insulating layer) 14*a*, second substrate 20, single-crystal Si substrate 11, and the interfaces between the layers or substrates.

More specifically, the separation start portion 40 preferably has a structure in which, e.g., the porous layer 12*a* is exposed to the side surface of the bonded substrate stack. More preferably, the peripheral edge of the porous layer 12*a* is located inside that of the transfer layer (first and second non-porous layers 13*a* and 14*a*), as shown in FIG. 1D.

When the bonded substrate stack 30 having a projecting portion is formed, the transfer layer and underlying porous layer at that portion can easily be removed. This is because the transfer layer at the projecting portion is exposed to a larger degree than the transfer layer at the remaining portions. Hence, when a bonded substrate stack having a projecting portion is formed, the separation start portion can easily be formed.

When the separation start portion 40 is formed, the porous layer 12 can be selectively broken to separate the bonded substrate stack in the subsequent separating step. This effectively prevents defects in the separation step.

Figure 1E:
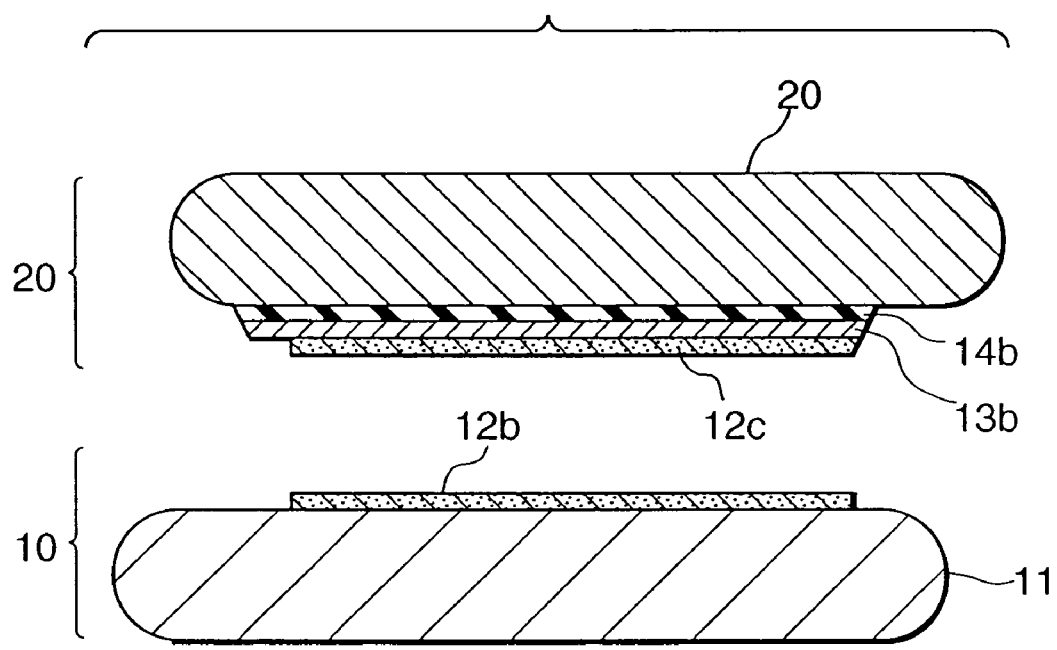
FIG. 1E is a schematic view for explaining the separation step (main separation step) in the substrate manufacturing method according to the preferred embodiment of the present invention.

In the step shown in FIG. 1E, for the bonded substrate stack having the separation start portion 40, separation at the porous layer 12*a* of the separation start portion 40 is started. Finally, the bonded substrate stack is completely separated into two substrates at the porous layer 12*a*. To separate the bonded substrate stack, for example, at least one or a combination of two of the following methods can be used.

(1) Separation Using Fluid.

A stream of fluid is injected to the gap at the peripheral portion of a bonded substrate stack. The bonded substrate stack is separated into two substrates at the porous layer 12 by the fluid. As the fluid, it is possible to use, e.g., water, an organic solvent such as alcohol, an acid such as hydrofluoric acid, an alkali such as potassium hydroxide, or a liquid having an etching function capable of selectively etching the porous layer. As the fluid, a low-temperature cooling refrigerant or ultra-cooling refrigerant may be employed. Alternatively, as the fluid, a gas such as air, nitrogen gas, carbonic acid gas, or a rare gas may be employed. Furthermore, the bonded substrate stack may be separated by applying static pressure to the bonded substrate stack using a fluid without injecting the fluid.

(2) Separation Using Wedge.

When a thin wedge of, e.g., a resin is gradually inserted into the gap at the peripheral portion of a bonded substrate stack, the bonded substrate stack is separated into two substrates at the porous layer 12.

(3) Separation by Peeling.

One surface of a bonded substrate stack is fixed, and the other surface is pulled at the end portion of the bonded substrate stack using a flexible tape or the like, thereby separating the bonded substrate stack at the porous layer.

(4) Separation Using Shearing Stress.

One surface of a bonded substrate stack is fixed, and a force is applied to the other surface so as to move the other surface in the planar direction of the bonded substrate stack, thereby separating the bonded substrate stack at the porous layer by shearing stress.

The separation start portion formation step (pre-separation step) shown in FIG. 1D and the separation step (main separation step) shown in FIG. 1E may be continuously executed by one processing apparatus. For example, preferably, a water jet apparatus (separating apparatus using a fluid) is used, and the separation start portion formation step (pre-separation step) and the separation step (main separation step) are continuously executed using a fluid such as water. In this case, separation processing is started at the projecting portion and continued until the bonded substrate stack is completely separated.

As described above, when the separation start portion is formed, and then, separation processing is started from the separation start portion, the bonded substrate stack can actually be separated only at the porous layer. Hence, break (generation of defects) of the first non-porous layer (e.g., a single-crystal Si layer) 13a, second non-porous layer (insulating layer) 14a, second substrate 20, and single-crystal Si substrate 11, and the interfaces between the layers or substrates can be prevented.

In addition, when a bonded substrate stack having a projecting portion is used, a separation start portion is formed at the projecting portion first, and full separation is started from the separation start portion, so that the bonded substrate stack can actually be separated only at the porous layer. Hence, the single-crystal Si layer 13, insulating layer 14, second substrate 20, single-crystal Si substrate 11, and the interfaces between the layers or substrates can be prevented from breaking.

When, e.g., a bonded substrate stack (normal bonded substrate stack) formed by bonding the first substrate 10 and second substrate 20 having the same size while making their centers match each other is directly separated, the single-crystal Si layer 13, insulating layer 14, second substrate 20, single-crystal Si substrate 11, and the interfaces between the layers or substrates may break to generate a defect. This mechanism can be understood in the following way.

In a bonded substrate stack, it is ideal that the porous layer 12 is most fragile. In fact, however, a portion (to be referred to as a defect inducing portion hereinafter) that is equivalent to or more fragile than the porous layer 12 may be locally formed due to a bonding error as well as stress that acts between, e.g., the porous layer 12, the first non-porous layer (e.g., a single-crystal Si layer) 13, the second non-porous layer (insulating layer) 14, and the second substrate 20.

Such a defect inducing portion preferentially breaks to generate a defect in separation processing. Such a defect readily occurs at a portion where the separation processing starts, i.e., at a portion to which a force for separation is applied for the first time. This is probably because at the portion where the separation processing starts, i.e., the peripheral portion of the bonded substrate stack, almost the same force acts on the porous layer 12, first non-porous layer (e.g., a single-crystal Si layer) 13, second non-porous layer (insulating layer) 14, and second substrate 20, and therefore, if a defect inducing portion is present, the defect inducing portion breaks before the porous layer 12 at a high possibility. When the separation processing progresses, and the force for separation (separation force) concentrates to the porous layer 12 that is the most fragile layer in terms of average strength. The separation force rarely acts on the remaining portions. For this reason, the porous layer 12 is selectively separated independently of the presence/absence of the defect inducing portion.

Hence, preferably, the bonded substrate stack 30 having a projecting portion is formed, a separation start portion is formed at the projecting portion, and the subsequent separation processing is started from the separation start portion 40, as in this embodiment.

With the separation step shown in FIG. 1E, a separated first substrate 10' has a structure in which a porous layer 12b is formed on the single-crystal Si substrate 11. On the other hand, the separated second substrate 20' has a multilayered structure of a porous Si layer 12c/first non-porous layer (e.g., a single-crystal Si layer) 13b/second non-porous layer (insulating layer) 14b/single-crystal Si substrate 20.

That is, with the above process, the first non-porous layer (e.g., a single-crystal Si layer) 13 and second non-porous layer (insulating layer) 14 on the porous layer 12 on the first substrate can be transferred to the second substrate.

In the step shown in FIG. 1F, the porous Si layer 12c on the surface of the separated second substrate 20' is selectively removed. With this process, a substrate 50 having a multilayered structure of the first non-porous layer (e.g., a single-crystal Si layer) 13b/second non-porous layer (insulating layer) 14b/single-crystal Si substrate 20 is obtained, as shown in FIG. 1F. A substrate which has an Si layer as the first non-porous layer and an insulating layer as the second non-porous layer is an SOI substrate. To remove the porous layer, for example, etching, and more specifically, a method of dipping the second substrate having the porous layer on its surface into an etchant that is formed from a solution mixture of hydrofluoric acid, hydrogen peroxide, ethanol, and water at an HF concentration of 0.13 to 0.2 wt %, $H_2O_2$ concentration of 5 to 6 wt %, and ethanol concentration of 1 to 3 wt % can be used. As another removing method, for example, the porous layer may be removed by polishing or the like. If the residual porous layer is very thin, it can be converted into a non-porous layer by annealing in a reduction atmosphere containing hydrogen.

Figure 1G:
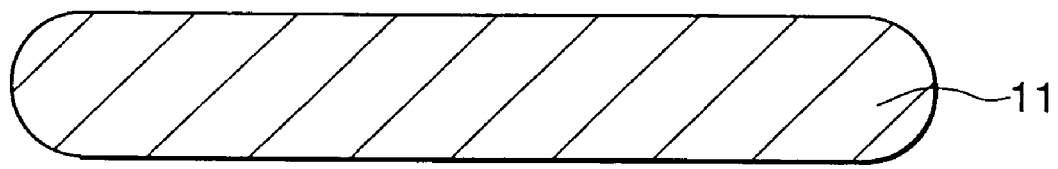
FIG. 1G is a schematic view for explaining the step of removing the porous layer on the first substrate side in the substrate manufacturing method according to the preferred embodiment of the present invention.

In the step shown in FIG. 1G, the porous layer 12b on the single-crystal Si substrate 11 on the separated first substrate 10' is selectively removed by etching or the like. The single-crystal Si substrate 11 obtained in this way can be reused as a substrate for forming the first substrate 10 or as the second substrate 20.

As described above, according to the preferred embodiment of the present invention, since a bonded substrate stack having a projecting portion is formed, and a separation start portion is formed at the projecting portion at the start of separation processing such that the separation start portion preferentially breaks in the subsequent separation processing, any defects can be prevented.

As a bonded substrate stack, a substrate prepared by the following method may be employed. First, a semiconductor substrate represented by a single-crystal Si substrate such as a mirror wafer or epitaxial wafer is prepared. An insulating film such as a thermal silicon oxide film is formed on the surface of the substrate, as needed. Next, ions such as hydrogen ions or rare gas ions are implanted into the substrate by ion implantation using a line beam or plasma immersion, thereby forming a relatively heavily doped ion implantation layer serving as a separation layer at a predetermined depth from the surface. The first substrate is obtained in the above manner.

Next, the second substrate is prepared according to the same procedure as described above and bonded to the first substrate in accordance with the above-described bonding method. With this process, a bonded substrate stack having a layer to be transferred (transfer layer) can be obtained.

Next, the projecting portion of the bonded substrate stack is detected, and the bonded substrate stack is separated from the projecting portion along the ion implantation layer as a separation layer, as described above.

The ion implantation layer is distorted or contains defects or pores formed from microcavities due to the implanted ions. Such an ion implantation layer has a relatively low mechanical strength and therefore functions as a separation layer.

A processing apparatus suitable for execution of the separation start portion formation step (pre-separation step) and separation step (main separation step) shown in FIGS. 1D and 1E will be described next.

[First Arrangement Example of Processing Apparatus]

Figure 3:
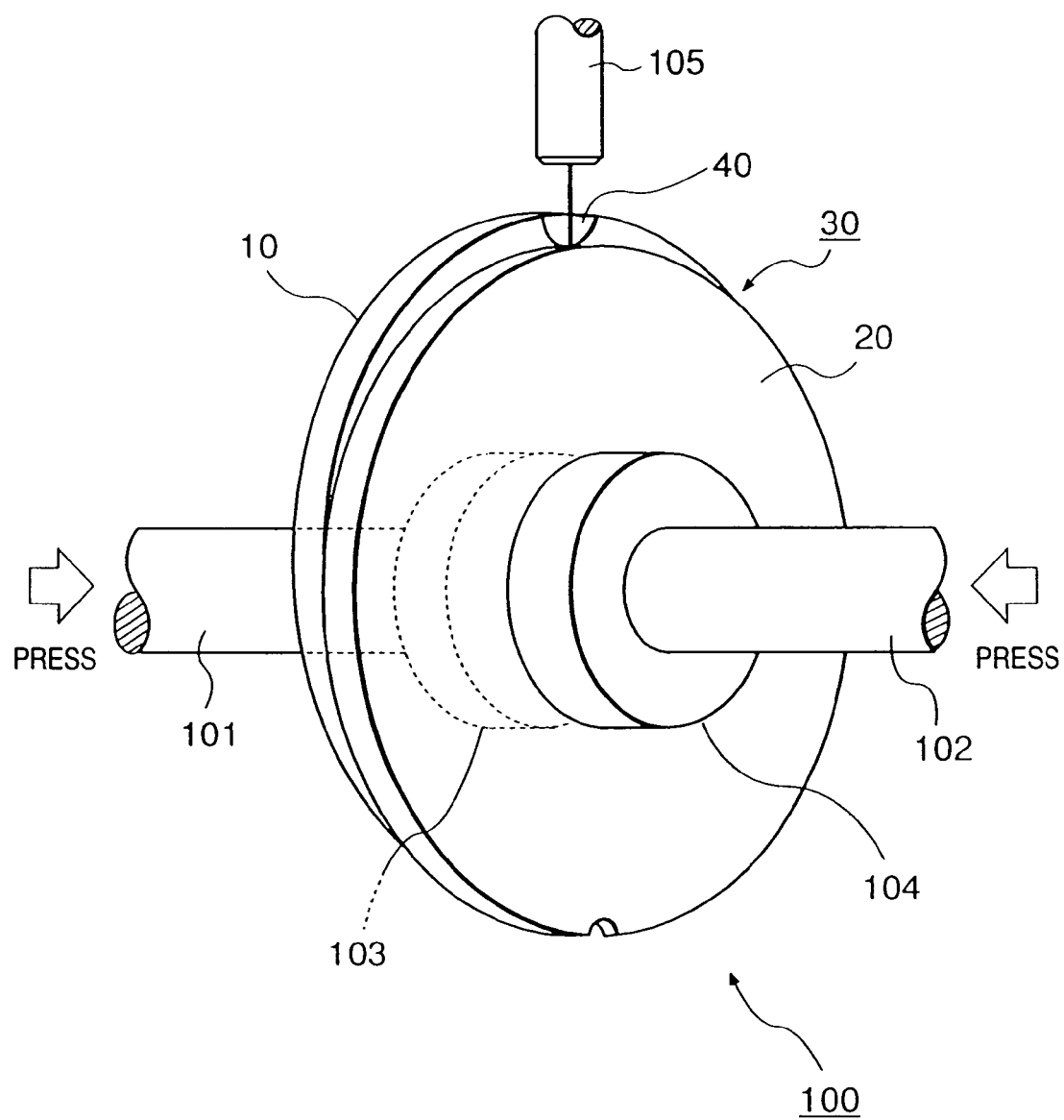
FIG. 3 is a view schematically showing the arrangement of a bonded substrate stack processing apparatus according to the preferred embodiment of the present invention.
Figure 4:
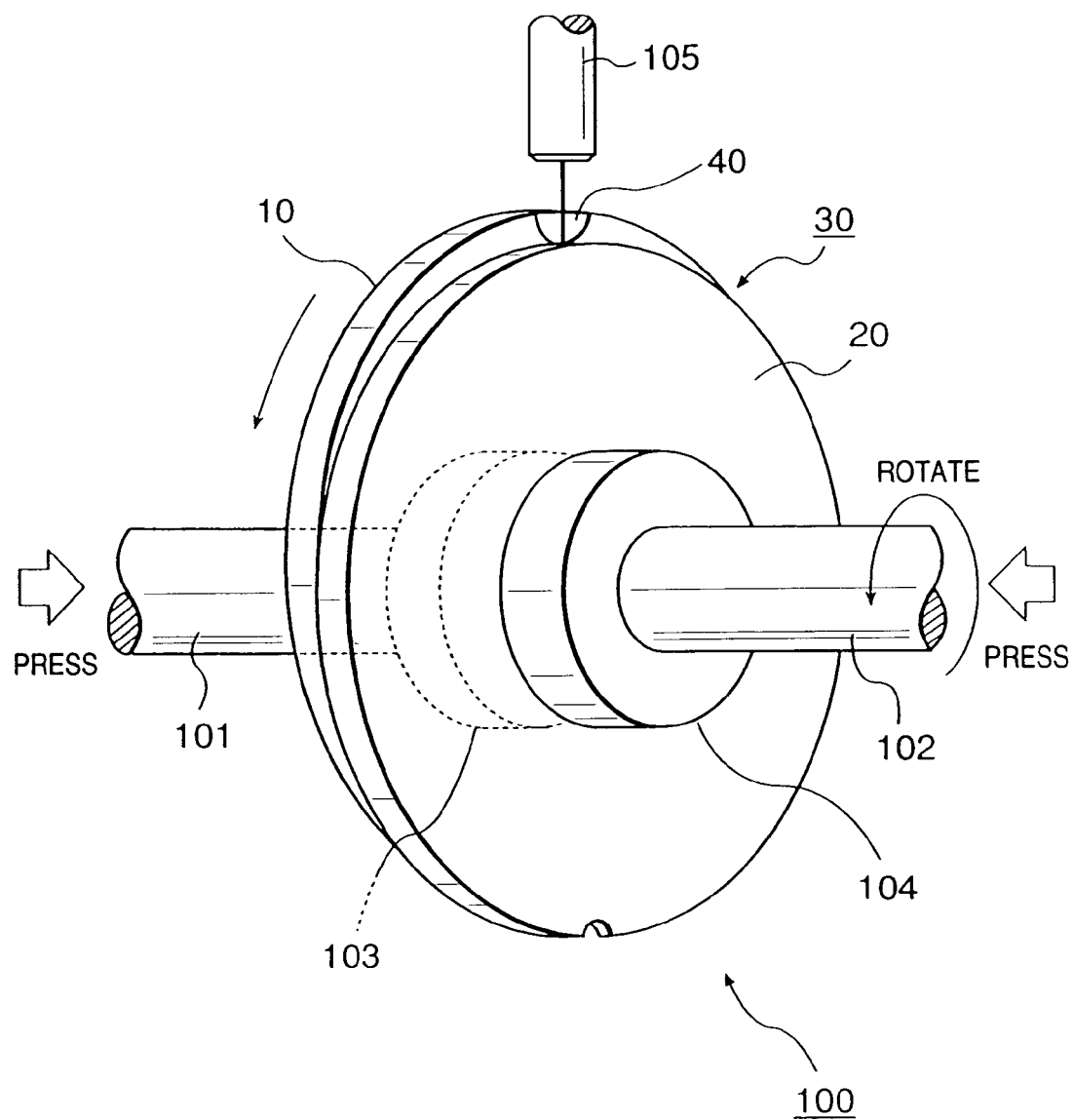
FIG. 4 is a view schematically showing the arrangement of the bonded substrate stack processing apparatus according to the preferred embodiment of the present invention.

FIGS. 3 and 4 are views schematically showing the arrangement of a bonded substrate stack processing apparatus according to a preferred embodiment of the present invention.

A processing apparatus 100 shown in FIGS. 3 and 4 has a pair of substrate holding portions 103 and 104. A bonded substrate stack 30 is pressed and held from both sides by the substrate holding portions 103 and 104. The substrate holding portions 103 and 104 are coupled to rotating shafts 101 and 102 rotatably axially supported, respectively.

At least one of the rotating shafts 101 and 102 is coupled to an actuator (e.g., an air cylinder) for applying a press force to the bonded substrate stack 30 and increasing/decreasing the interval between the substrate holding portions 103 and 104. At least one of the rotating shafts 101 and 102 is coupled to the rotating shaft of a rotation source (e.g., a motor). The bonded substrate stack 30 can be rotated by a driving force generated by the rotation source.

The processing apparatus 100 also has an injection nozzle 105 for injecting a liquid such as water or a gas such as air or nitrogen, i.e., a fluid. The injection nozzle 105 preferably has a diameter of, e.g., about 0.1 mm. An apparatus using water as the fluid is especially called a water jet apparatus.

When the processing apparatus 100 is to be used in the separation start portion formation step (pre-separation step) shown in FIG. 1D, the bonded substrate stack 30 is fixed while keeping the projecting portion of the bonded substrate stack 30 opposing the injection nozzle 105, as shown in FIG. 3. In this state, a fluid is injected from the injection nozzle 105 to the projecting portion of the bonded substrate stack 30.

When the processing apparatus 100 is to be used in the separation step (main separation step) shown in FIG. 1E, the bonded substrate stack 30 having the separation start portion 40 is set such that the separation start portion 40 opposes the injection nozzle 105, as shown in FIG. 4. In this state, a fluid is injected from the injection nozzle 105 to the separation start portion 40. After that, separation is continued while rotating the bonded substrate stack 30.

When the processing apparatus 100 is to be continuously used in the separation start portion formation step (pre-separation step) and the separation step (main separation step), first, the bonded substrate stack is fixed, and in this state, a fluid is injected from the injection nozzle 105 to the projecting portion of the bonded substrate stack 30, as shown in FIG. 3 (pre-separation step). When the separation start portion 40 is formed, the bonded substrate stack 30 is rotated as shown in FIG. 4 to shift the process to the separation step (main separation step). After that, the bonded substrate stack 30 is completely separated at the porous layer while rotating the bonded substrate stack 30.

To form the separation start portion at the projecting portion of the bonded substrate stack 30, the projecting portion must be accurately placed at the work position (i.e., a position opposing the injection nozzle 105). In this embodiment, using a positioning apparatus (to be described later), the position of the projecting portion of the bonded substrate stack 30 is detected, the projecting portion is aligned to a reference position (e.g., the reference position of the positioning apparatus) on the basis of the detection result, and then, the bonded substrate stack 30 is transferred to the processing apparatus 100 by a transfer robot such that the projecting portion matches the work position.

[Second Arrangement Example of Processing Apparatus]

Figure 5:
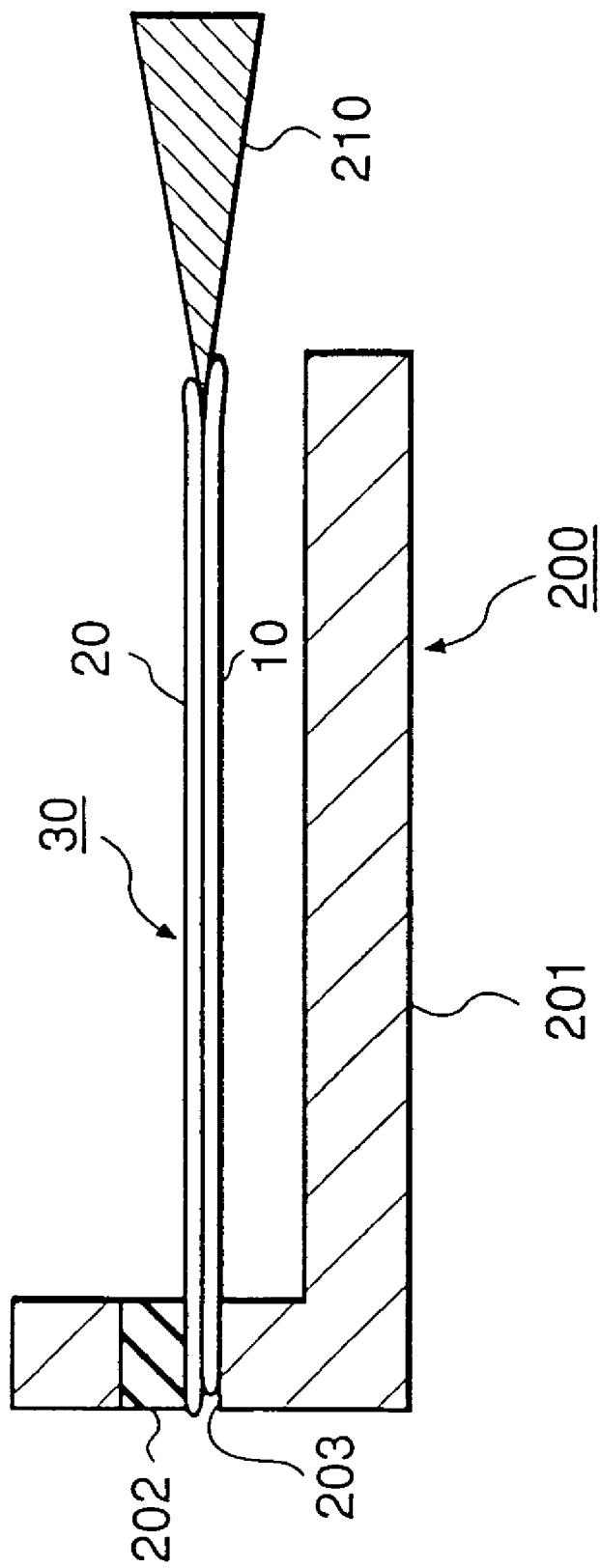
FIG. 5 is a view showing the schematic arrangement of a processing apparatus according to another preferred embodiment of the present invention.

FIG. 5 is a view schematically showing the arrangement of a bonded substrate stack processing apparatus according to another preferred embodiment of the present invention. A processing apparatus 200 shown in FIG. 5 has a support table 201 having a support portion 203 for supporting a bonded substrate stack 30, an elastic body 202 for pressing the bonded substrate stack 30 against the support portion 203, and a wedge 210.

When the processing apparatus 200 is to be used in the separation start portion formation step (pre-separation step) shown in FIG. 1D, the opposite side of the projecting portion of the bonded substrate stack 30 is supported by the support portion 203. In this state, the wedge 210 is gradually inserted near the bonding interface of the bonded substrate stack at the projecting portion by a predetermined amount. With this process, the porous layer and overlying transfer layer at the projecting portion break to form a separation start portion on the bonded substrate stack 30.

When the processing apparatus 200 is to be used in the separation step (main separation step) shown in FIG. 1E, the bonded substrate stack 30 having the separation start portion is supported by the support portion 203 on the opposite side of the separation start portion. In this state, the wedge 210 is gradually inserted and then pressed into the separation start portion to separate the bonded substrate stack.

When the processing apparatus 200 is to be continuously used in the separation start portion formation step (pre-separation step) and the separation step (main separation step), the separation start portion is formed, and after that, the wedge 210 is pressed into the bonded substrate stack 30.

To form the separation start portion at the projecting portion of the bonded substrate stack 30, the projecting portion must be accurately placed at the work position (i.e., on the moving path of the wedge 210). In this embodiment, using a positioning apparatus (to be described later), the position of the projecting portion of the bonded substrate stack 30 is detected, the projecting portion is aligned to a reference position (e.g., the reference position of the positioning apparatus) on the basis of the detection result, and then, the bonded substrate stack 30 is transferred to the processing apparatus 100 by a transfer robot such that the projecting portion matches the work position.

The above method can also be applied to a method of manufacturing a composite member formed by bonding the first member having a separation layer inside of the second member or a method of separating the composite member. The first member corresponds to the first substrate 10, the second member corresponds to the second substrate 20, the separation layer corresponds to the porous layer, and the composite member corresponds to the bonded substrate stack 30.

A positioning apparatus for positioning the projecting portion of the bonded substrate stack 30 to the work position of the processing apparatus 100 or 200 will be described next. In this embodiment, the positioning apparatus detects the position of the projecting portion of the bonded substrate stack 30 and aligns the projecting portion to a reference position (e.g., the reference position of the positioning apparatus) on the basis of the detection result. After that, the bonded substrate stack 30 is transferred and fed to the processing apparatus by a transfer robot. At this time, the transfer robot transfers the bonded substrate stack 30 such that the projecting portion of the bonded substrate stack 30, which is aligned to the reference position, matches the work position of the processing apparatus 100 or 200.

A positioning apparatus according to a preferred embodiment of the present invention will be described below. Of two projecting portions of the bonded substrate stack 30, a projecting portion at which the outer periphery of the first substrate 10 projects will be referred to as a first projecting portion, and a projecting portion at which the outer periphery of the second substrate 20 projects will be referred to as a second projecting portion hereinafter. In addition, the position of the first projecting portion is detected and aligned to the reference position, and consequently, the first projecting portion is aligned to the work position of the processing apparatus 100 or 200. With this operation, the separation start portion 40 is formed at the first projecting portion. Any defect by separation processing can be suppressed by forming the separation start portion 40 at the first projecting portion rather than at the second projecting portion.

[First Arrangement Example of Positioning Apparatus]

Figure 6:
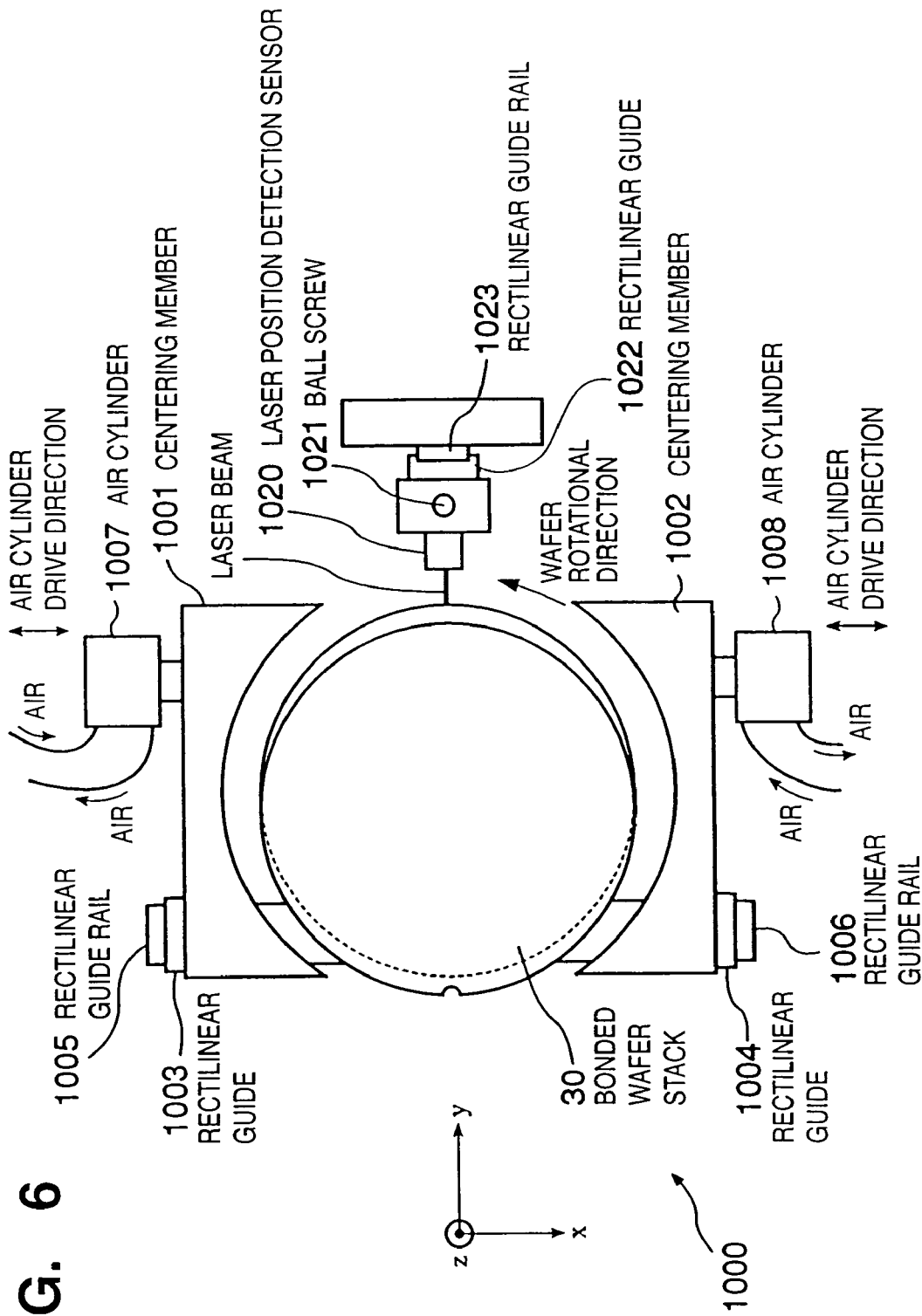
FIG. 6 is a view showing a positioning apparatus according to the first arrangement example.
Figure 7:
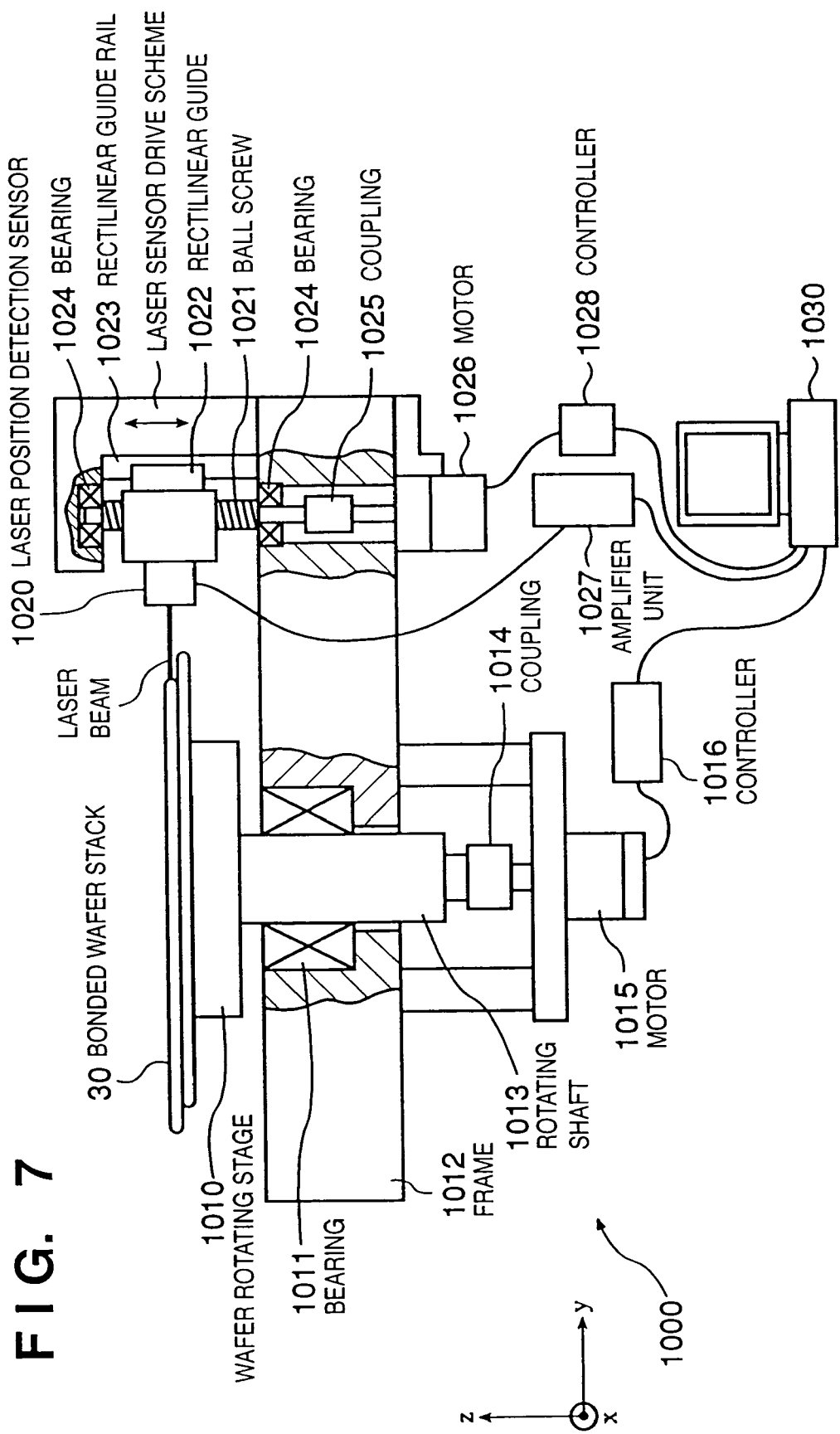
FIG. 7 is a view showing the positioning apparatus according to the first arrangement example.

FIGS. 6 and 7 are views showing a positioning apparatus according to the first arrangement example. A positioning apparatus 1000 centers a bonded substrate stack 30, detects, throughout the perimeter of the bonded substrate stack 30, the shift amount between the edge (peripheral edge) of a first substrate 10 and the edge (peripheral edge) of a second substrate 20, detects the position of the first projecting portion on the basis of the shift amount, and rotates the bonded substrate stack 30 to make the first projecting portion match the reference position.

The positioning apparatus 1000 has a substrate rotating stage 1010 for rotating the bonded substrate stack 30 in the X-Y plane. The substrate rotating stage 1010 is connected to the rotating shaft of a motor 1015 through a rotating shaft 1013 and coupling 1014. The motor 1015 operates in accordance with an instruction from a controller 1016 controlled by a computer 1030.

The positioning apparatus 1000 has a pair of centering members 1001 and 1002 for sandwiching the edge (peripheral edge) of the bonded substrate stack 30 from both sides as a mechanism for centering the bonded substrate stack 30 placed on the substrate rotating stage 1010 by a transfer robot (not shown). The centering member 1001 is driven along a guide rail 1005 by an air cylinder 1007. The centering member 1002 is driven along a guide rail 1006 by an air cylinder 1008. The centering members 1001 and 1002 are pushed by the air cylinders 1007 and 1008, and the bonded substrate stack 30 is sandwiched by the centering members 1001 and 1002 from both sides, thereby centering the bonded substrate stack 30.

The positioning apparatus 1000 also has a laser position detection sensor 1020 as a position detection device for detecting the position (the position in the Y direction) of the edge of the bonded substrate stack 30 (the edges of the first and second substrates). The laser position detection sensor 1020 is driven in the vertical direction (Z direction) by a ball screw 1021 rotatably driven by a motor 1026. The motor 1026 operates in accordance with an instruction from a controller 1028 controlled by the computer 1030. The output from the laser position detection device 1020 is amplified by an amplifier unit 1027 and supplied to the computer 1030. In this arrangement, the substrate rotating table 1010 is kept stopped, and in this state, the position (the position in the Y direction) of the edge of the bonded substrate stack 30 is detected along the Z direction (the axial direction of the bonded substrate stack) while moving the laser position detection sensor 1020 upward or downward.

Figure 8:
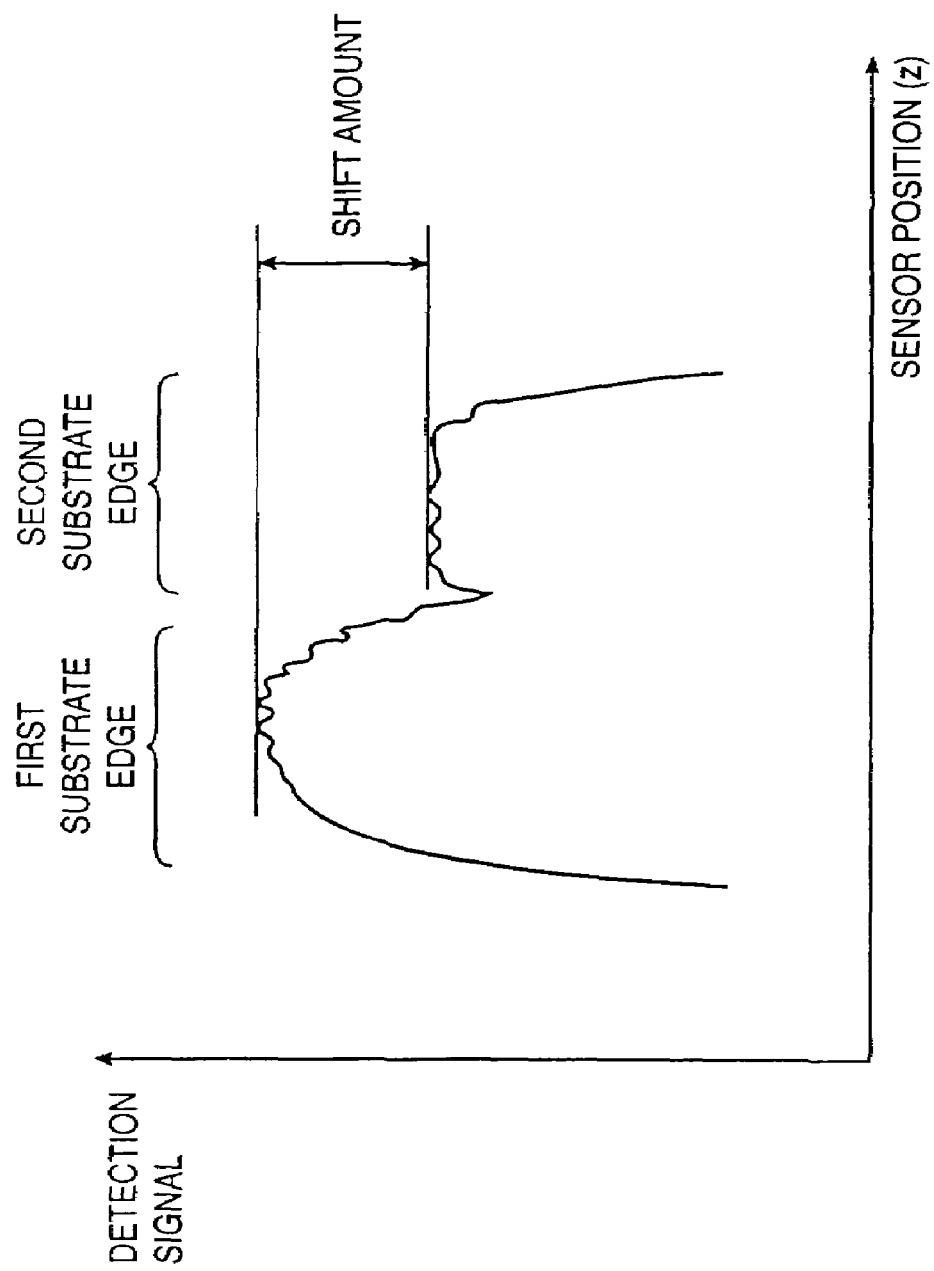
FIG. 8 is a graph showing an example of the edge of a bonded substrate stack, which is detected by a laser position detection sensor in the positioning apparatus according to the first arrangement example.

FIG. 8 is a graph showing an example of the edge of the bonded substrate stack 30, which is detected by the laser position detection sensor 1020. Referring to FIG. 8, the abscissa represents the Z-direction position of the laser position detection sensor 1020 (or the bonded substrate stack 30), and the ordinate represents a signal (detection signal) obtained by amplifying the output from the laser position detection sensor 1020 by the amplifier unit 1027. When the bonded substrate stack 30 with the first substrate set on the lower side is placed on the substrate rotating stage 1010, the left side of the graph in FIG. 8 represents the position of the edge of the first substrate 10, and the right side represents the position of the edge of the second substrate 20. The computer 1030 can detect the shift amount (projecting amount) between the edge of the first substrate 10 and the edge of the second substrate 20 by calculating the difference between the peak on the left side and that on the right side of the graph shown in FIG. 8 on the basis of the detection signal.

Figure 9:
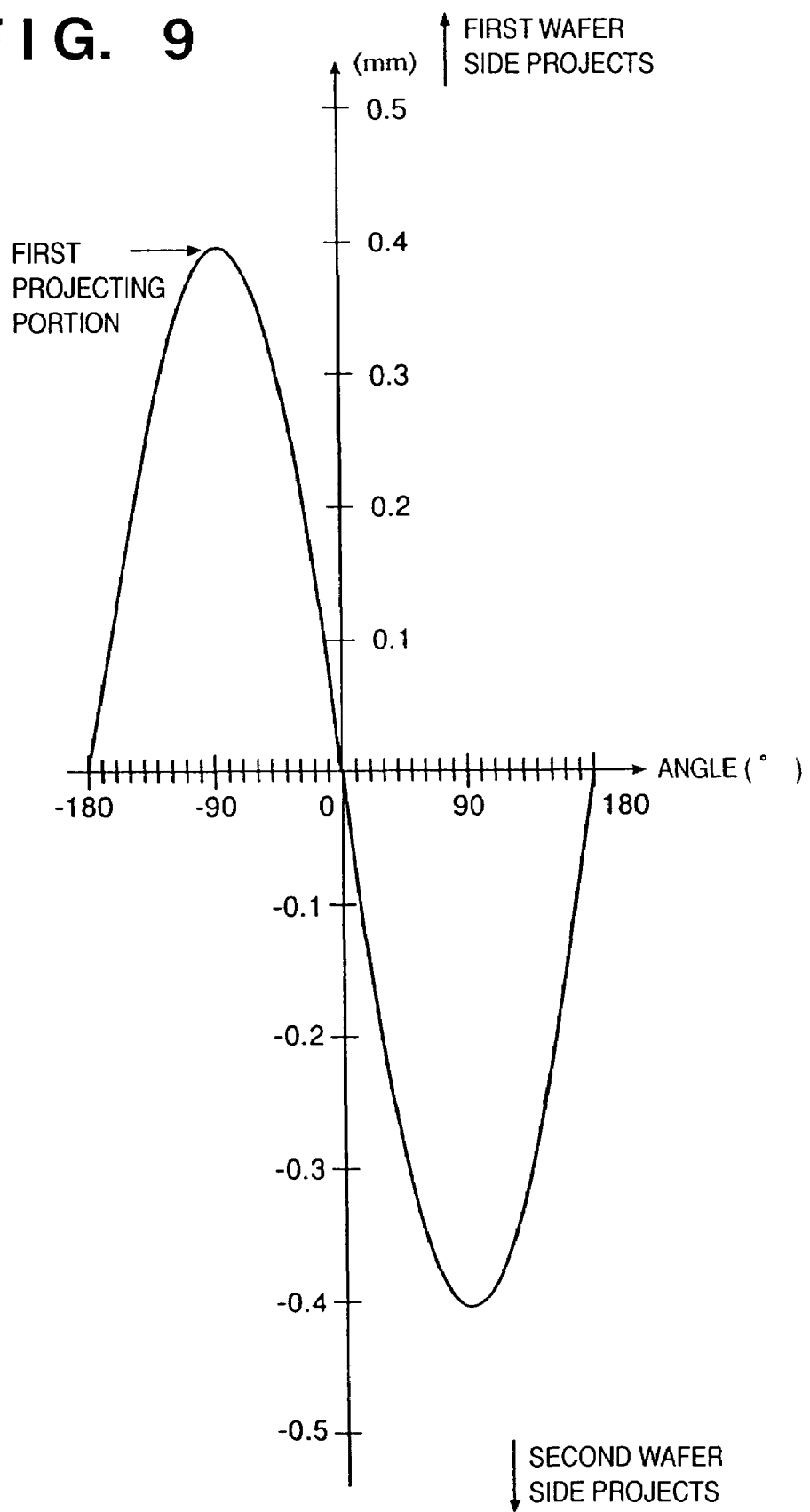
FIG. 9 is a graph showing the result of shift amount detection executed throughout the perimeter of the bonded substrate stack in the positioning apparatus according to the first arrangement example.

Such shift amount detection is executed every time the substrate rotating table or stage 1010 pivots by a predetermined angle and stops. With this processing, the shift amount (projection amount) between the edge of the first substrate 10 and that of the second substrate 20 can be detected throughout the perimeter of the bonded substrate stack 30. FIG. 9 is a graph showing the result of the shift amount detection executed throughout the perimeter of the bonded substrate stack 30. Referring to FIG. 9, the abscissa represents the angle of rotation of the substrate rotating stage 1010, and the ordinate represents the shift amount between the edge of the first substrate 10 and that of the second substrate 20. That is, FIG. 9 shows the shift amount between the edge of the first substrate 10 and that of the second substrate 20, which is detected along the edge of the bonded substrate stack 30. A shift amount detected when the edge of the first substrate 10 projects outside the edge of the second substrate 20 is represented by a positive value, and a shift amount detected when the edge of the first substrate 10 is represented by a negative value. As shown in FIG. 9, at the first projecting portion, the shift amount has a positive value. The position of the first projecting portion is expressed by, e.g., a representative position. The representative position is preferably a position where the shift amount has a positive maximal value. The position (representative position) of the first projecting portion is specified by, e.g., the angle of rotation of the substrate rotating stage 1010 (in the case shown in FIG. 9, the position of the first projecting portion corresponds to −90°).

After the position of the first projecting portion is detected, the bonded substrate stack 30 is positioned by the substrate rotating stage 1010 such that the first projecting portion matches a predetermined reference position (e.g., a position opposing the laser position detection sensor 1020).

Figure 10:
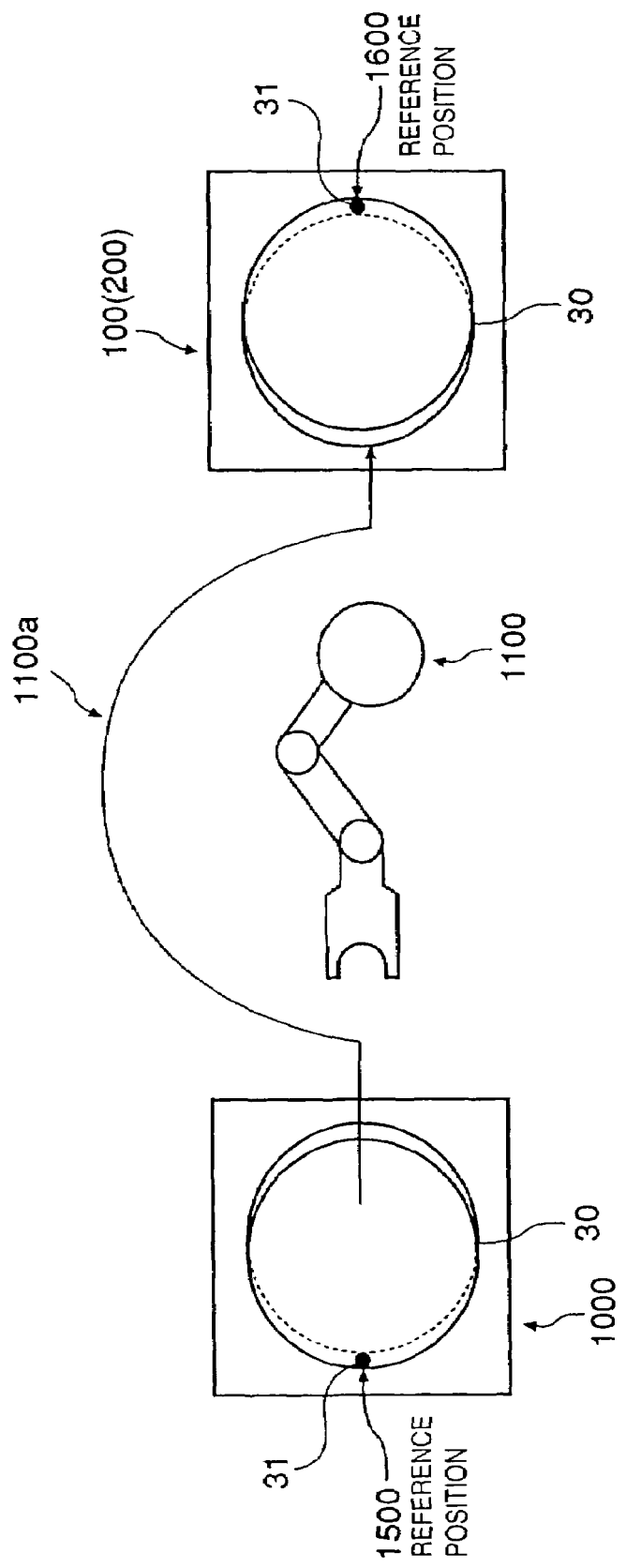
FIG. 10 is a view showing the relationship between positioning in the positioning apparatus and that in a separating apparatus.

FIG. 10 is a view showing the relationship between positioning in the positioning apparatus and that in a separating apparatus. The bonded substrate stack 30 whose first projecting portion 31 is positioned to a reference position 1500 by the positioning apparatus 1000 in the above-described way is transferred by a transfer robot 1100 such that the first projecting portion 31 matches a work position 1600 in a separating apparatus 100 (200). This positioning method can also be applied to positioning apparatuses according to the second to sixth arrangement examples.

According to another scheme, after the first projecting portion 31 is detected by the positioning apparatus (in this case, a position detection apparatus) 1000, the bonded substrate stack 30 is transferred to a transfer robot (not shown) without being positioned to the reference position by the positioning apparatus 1000. The transfer robot manipulates (rotates and translates) the bonded substrate stack 30 on the basis of the detection result such that the first projecting portion 31 matches the work position 1600 in the separating apparatus 100 (200) and transfers the bonded substrate stack 30 to the separating apparatus 100 (200). This scheme can also be applied to positioning apparatuses according to the second to sixth arrangement examples.

Figure 11:
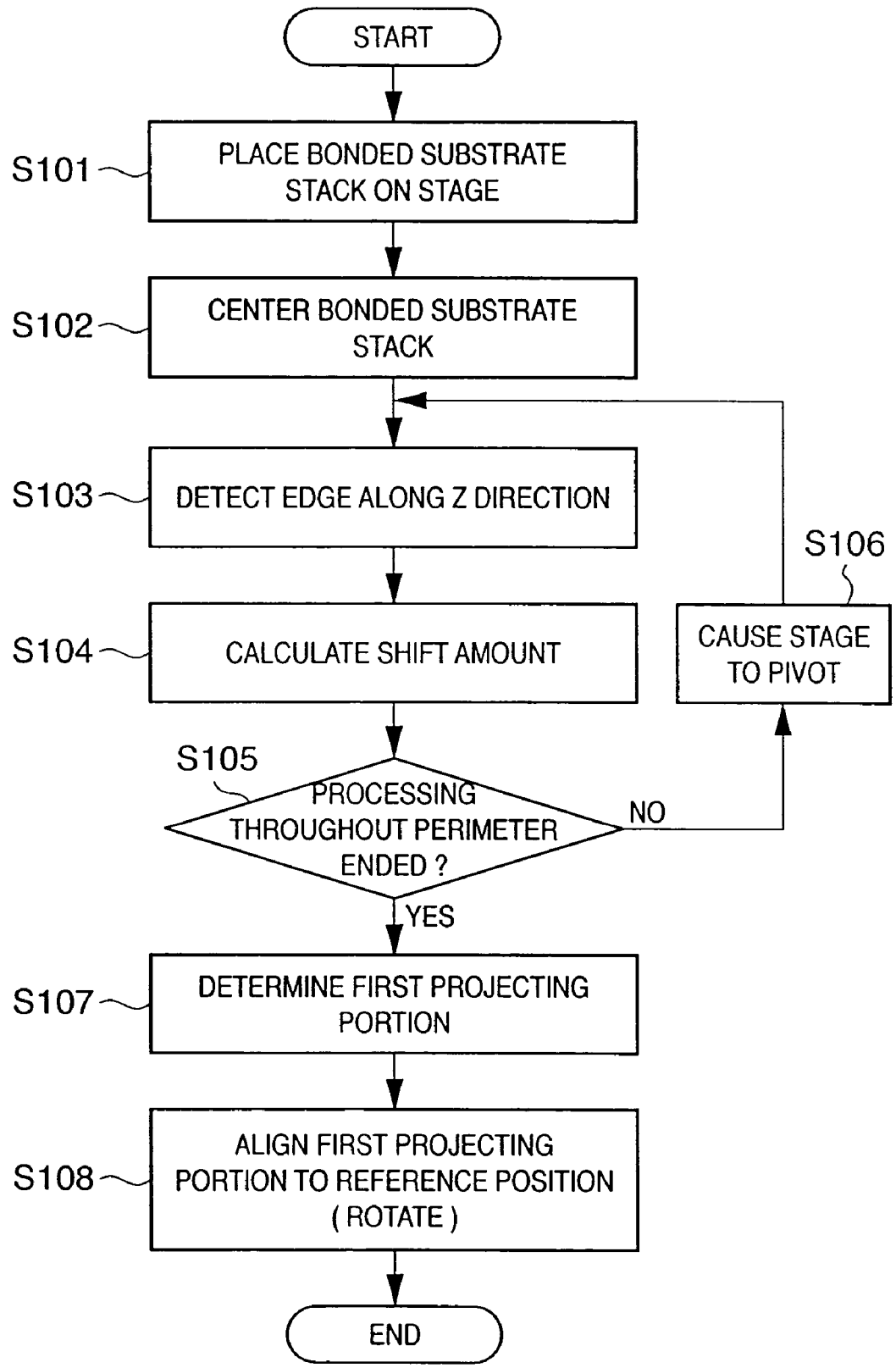
FIG. 11 is a flow chart for explaining the procedure of positioning in the positioning apparatus according to the first arrangement example.

The procedure of positioning in the positioning apparatus 1000 will be described next with reference to the flow chart shown in FIG. 11. The processing shown in this flow chart is controlled by the computer 1030.

In step S101, the bonded substrate stack 30 is placed on the substrate rotating stage 1010 by a transfer robot (e.g., the transfer robot 1100 shown in FIG. 10). At this time, the center of the bonded substrate stack 30 is roughly aligned to the rotational center of the substrate rotating stage 1010. The upper and lower sides of the bonded substrate stack 30 (which of the two substrates 10 and 20 is set on the upper side) to be placed on the substrate rotating stage 1010 are determined in advance, supplied from another apparatus or operator to the computer 1030 in placing the bonded substrate stack 30 on the substrate rotating stage 1010, or acquired (e.g., detected) by the computer 1030.

In step S102, the centering members 1001 and 1002 sandwich the bonded substrate stack 30 from both sides to align the center of the bonded substrate stack 30 to the rotational center of the substrate rotating stage 1010.

In steps S103 to S106, the position of the edge of the bonded substrate stack 30 is measured by the laser position detection sensor 1020 every predetermined angle throughout the perimeter of the bonded substrate stack 30 along the axial direction (Z direction) of the bonded substrate stack, and the shift amount between the substrates 10 and 20 of the bonded substrate stack 30 is calculated.

More specifically, in step S103, the substrate rotating stage 1010 is kept stopped, and in this state, the position of the edge of the bonded substrate stack 30 is measured using the laser position detection sensor 1020 along the axial direction (Z direction) of the bonded substrate stack. FIG. 8 schematically shows an example of the measurement result.

In step S104, the shift amount between the edges of the substrates 10 and 20 of the bonded substrate stack 30 is calculated on the basis of the result of measurement in step S103, and the calculation result is stored. The shift amount is calculated such that, e.g., the shift amount at a portion where the first substrate 10 projects has a positive value.

In step S105, it is determined whether execution of steps S103 and S104 is ended throughout the perimeter of the bonded substrate stack 30. If NO in step S105, the substrate rotating stage 1010 is made to pivot by a predetermined angle (e.g., 10°) in step S106. After that, steps S103 and S104 are executed.

When the above processing is ended throughout the perimeter of the bonded substrate stack 30, the position (representative position) of the first projecting portion is determined in step S107 on the basis of the shift amount (FIG. 9) between the two substrates throughout the perimeter of the bonded substrate stack 30. More specifically, the shift amount data obtained for every predetermined angle are approximated to a curve, thereby determining the angle of rotation of the substrate rotating stage 1010, at which, e.g., the shift amount has the maximum positive value.

In step S108, the substrate rotating table 1010 is made to pivot such that the position of the first projecting portion matches the reference position, as shown in FIG. 10.

According to this embodiment, independently of which of the first substrate 10 and second substrate of the bonded substrate stack 30 is set on the upper side (or lower side), the position of the first projecting portion 31 (or a portion at which a separation start portion is to be formed) can be detected and made to match the reference position. To do this, however, the upper and lower sides of the bonded substrate stack 30 must be determined in advance, supplied to the computer 1030 in placing the bonded substrate stack 30 on the substrate rotating stage 1010, or acquired by the computer 1030. Typically, a plurality of bonded substrate stacks 30 whose upper and lower sides are set in the same directions are extracted one by one from a wafer carrier that stores the bonded substrate stacks 30 and supplied to the positioning apparatus 1000. The upper and lower sides are determined in advance.

[Second Arrangement Example of Positioning Apparatus]

Figure 12:
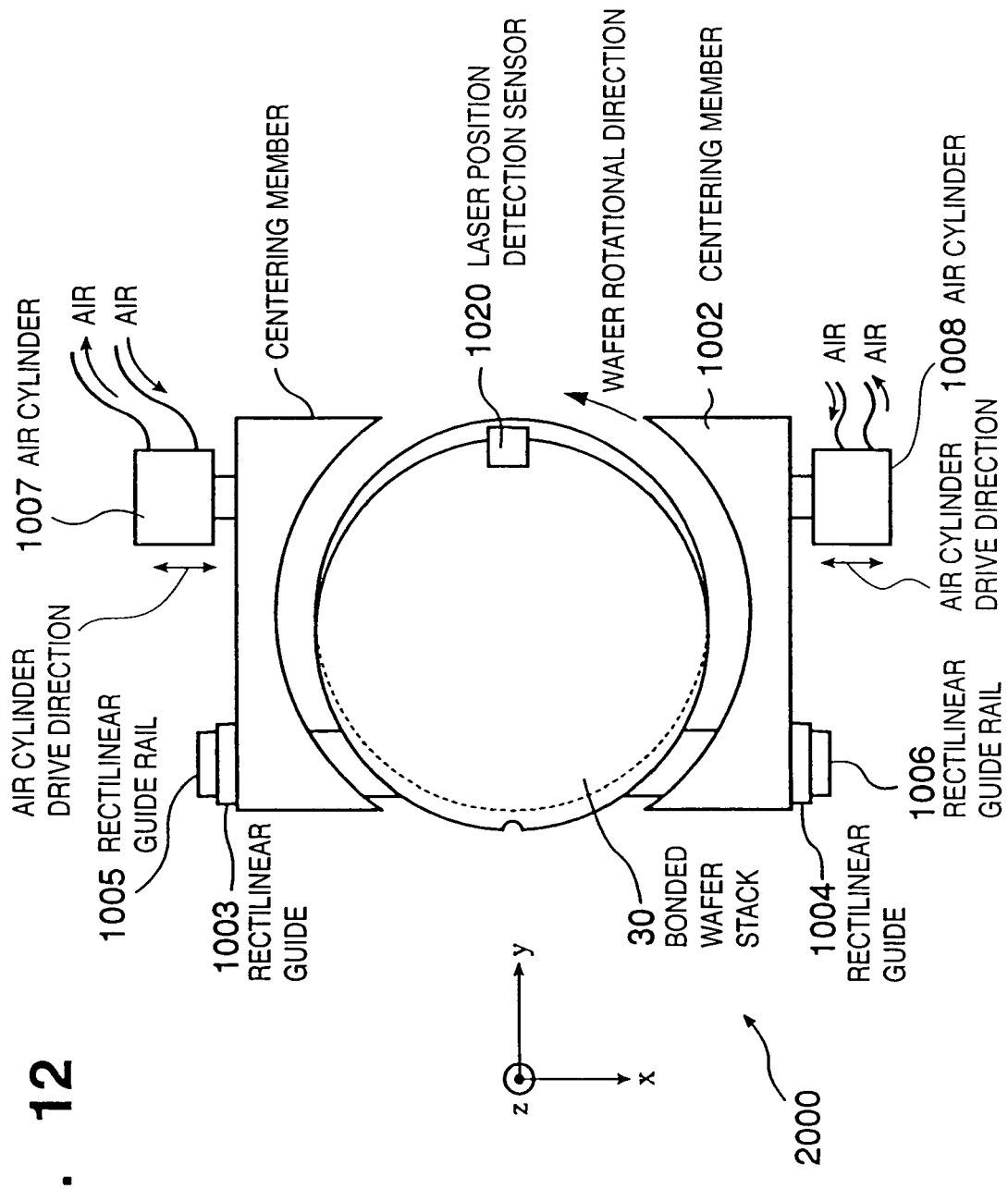
FIG. 12 is a view showing a positioning apparatus according to the second arrangement example.
Figure 13:
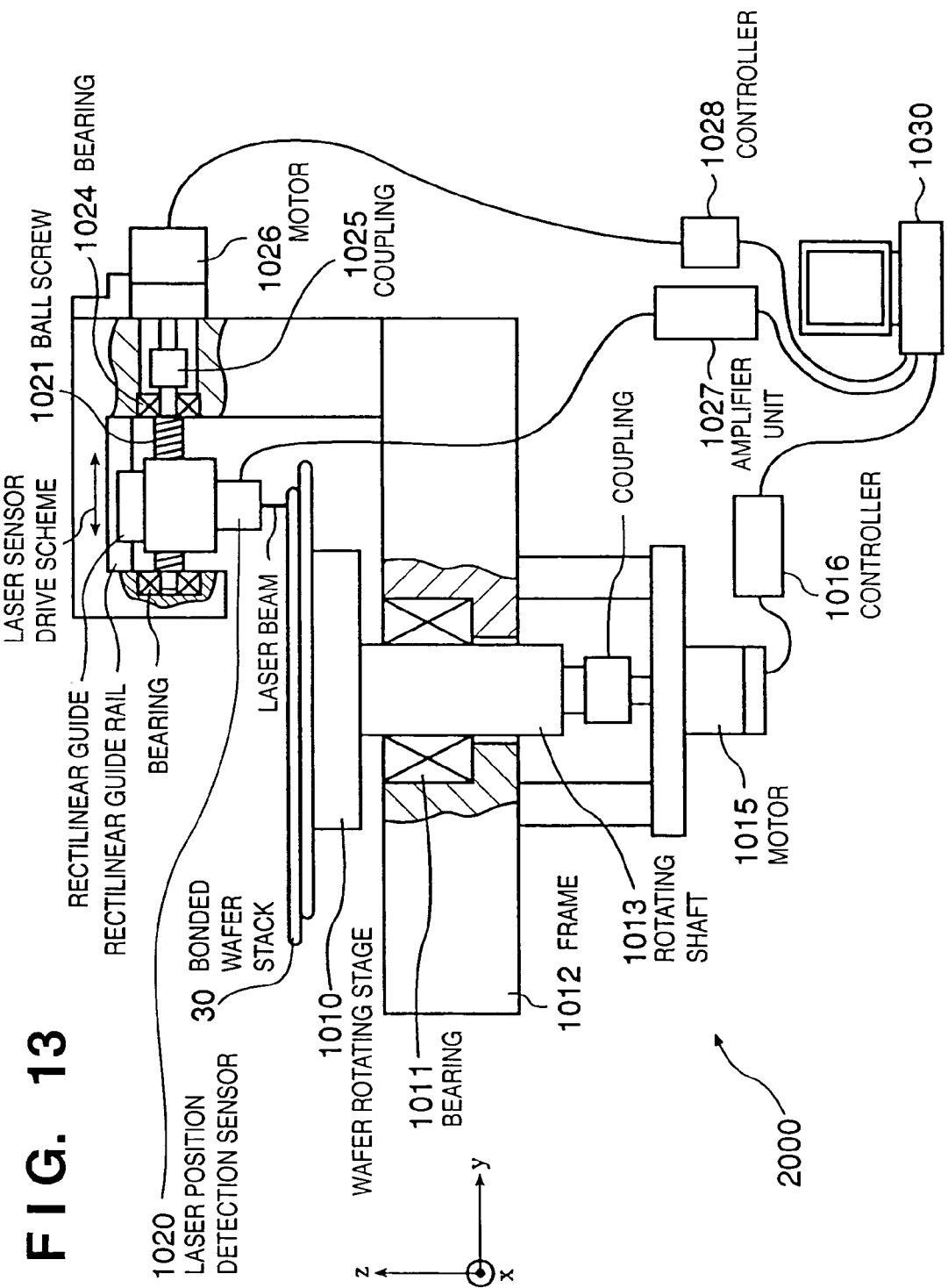
FIG. 13 is a view showing the positioning apparatus according to the second arrangement example.

FIGS. 12 and 13 are views showing a positioning apparatus according to the second arrangement example. A positioning apparatus 2000 centers a bonded substrate stack 30, detects the shift amount between the edge of a first substrate 10 and the edge of a second substrate 20 by a position detection device arranged at a position opposing one surface of the bonded substrate stack 30, detects the position of the first projecting portion on the basis of the shift amount, and rotates the bonded substrate stack 30 to make the first projecting portion match the reference position.

The positioning apparatus 2000 has a substrate rotating stage 1010 for rotating the bonded substrate stack 30 in the X-Y plane. The substrate rotating stage 1010 is connected to the rotating shaft of a motor 1015 through a rotating shaft 1013 and coupling 1014. The motor 1015 operates in accordance with an instruction from a controller 1016 controlled by a computer 1030.

The positioning apparatus 2000 has a pair of centering members 1001 and 1002 for sandwiching the edge of the bonded substrate stack 30 from both sides as a mechanism for centering the bonded substrate stack 30 placed on the substrate rotating stage 1010 by a transfer robot (not shown). The centering member 1001 is driven along a guide rail 1005 by an air cylinder 1007. The centering member 1002 is driven along a guide rail 1006 by an air cylinder 1008. The centering members 1001 and 1002 are pushed by the air cylinders 1007 and 1008, and the bonded substrate stack 30 is sandwiched by the centering members 1001 and 1002 from both sides, thereby centering the bonded substrate stack 30.

The positioning apparatus 2000 also has a laser position detection sensor 1020 opposing one surface of the bonded substrate stack 30. In the example shown in FIGS. 12 and 13, the laser position detection sensor 1020 is arranged on the opposite side of the substrate rotating stage 1010. The bonded substrate stack 30 is placed on the substrate rotating stage 1010 while setting the first substrate 10 on the lower side and the second substrate 20 on the upper side. This aims at observing with the laser position detection sensor 1020 the projecting amount of the first projecting portion at which the first substrate 10 projects.

The laser position detection sensor 1020 is driven by a ball screw 1021 rotatably driven by a motor 1026 in the Y direction within a plane opposing the bonded substrate stack 30. The motor 1026 operates in accordance with an instruction from a controller 1028 controlled by the computer 1030. The output from the laser position detection device 1020 is amplified by an amplifier unit 1027 and supplied to the computer 1030. In this arrangement, the substrate rotating table 1010 is kept stopped, and in this state, the Z-direction position of the bonded substrate stack 30 is detected along the surface of the bonded substrate stack 30 while moving the laser position detection sensor 1020 in the positive or negative direction of the Y-axis.

Figure 14:
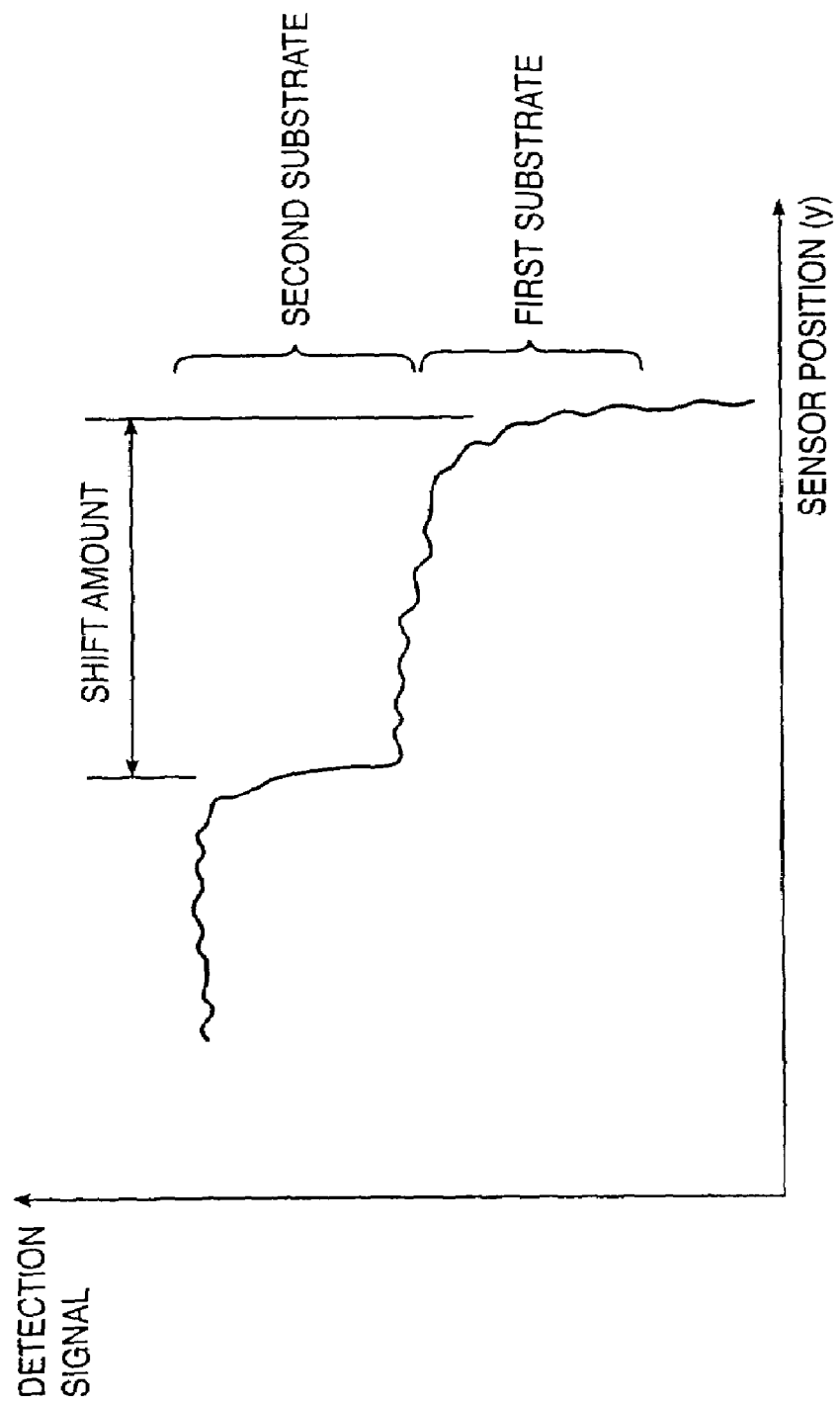
FIG. 14 is a graph showing an example of the step at the edge of a bonded substrate stack between the first substrate and the second substrate, which is detected by a laser position detection sensor in the positioning apparatus according to the second arrangement example.

FIG. 14 is a graph showing an example of the step between the first substrate 10 and the second substrate 20 at the edge of the bonded substrate stack 30, which is detected by the laser position detection sensor 1020. Referring to FIG. 14, the abscissa represents the Y-direction position of the laser position detection sensor 1020 (or the bonded substrate stack 30), and the ordinate represents a signal (detection signal) obtained by amplifying the output from the laser position detection sensor 1020 (Z-direction position near the edge of the bonded substrate stack) by the amplifier unit 1027. That is, the graph shown in FIG. 14 corresponds to the sectional shape (step shape) of the edge of the bonded substrate stack 30. The computer 1030 can detect the shift amount (projecting amount) between the edge of the first substrate 10 and the edge of the second substrate 20 by detecting the edge of the first substrate 10 and that of the second substrate 20 and calculating the distance therebetween on the basis of the detection signal.

Figure 15:
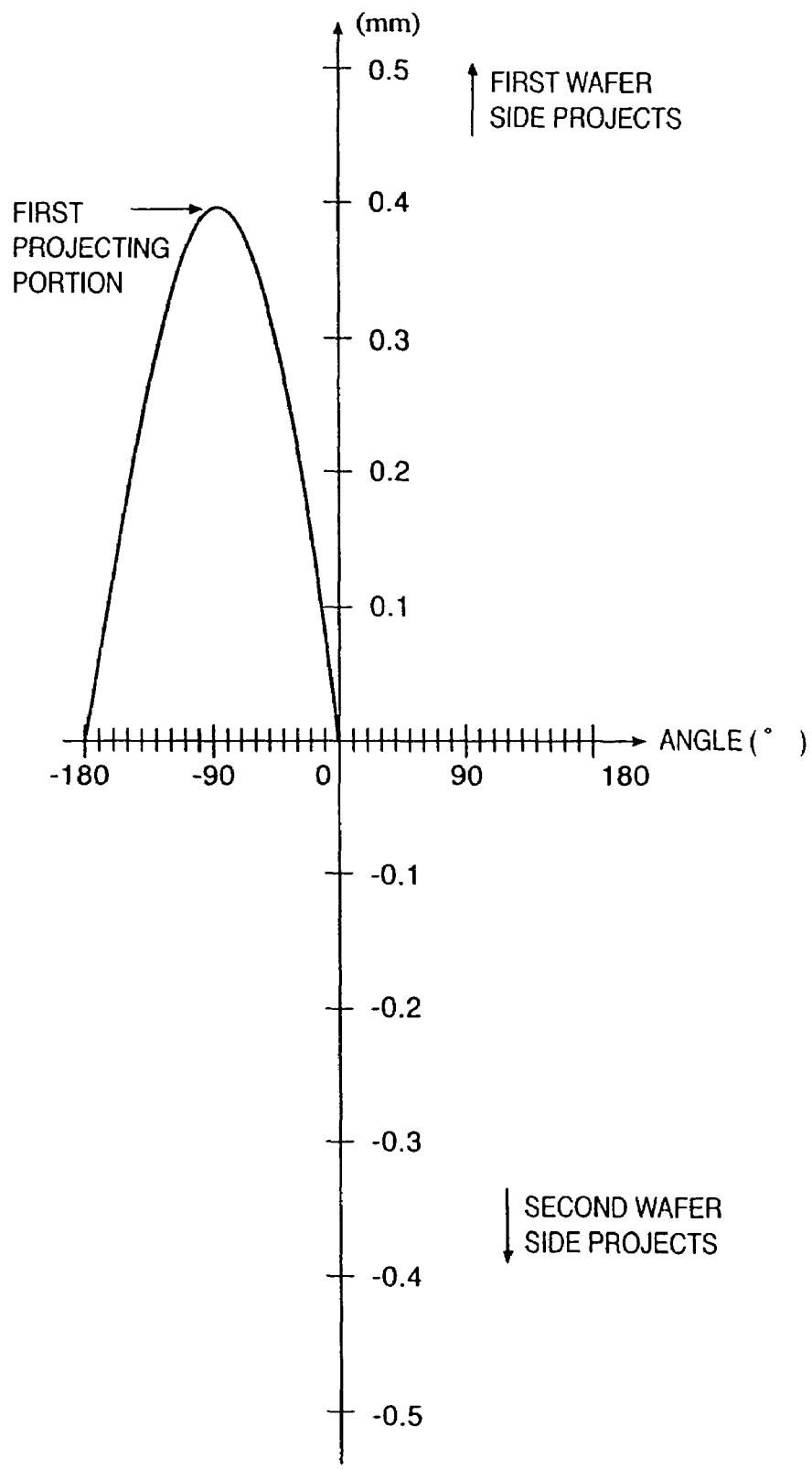
FIG. 15 is a graph showing the result of shift amount detection executed throughout the perimeter of the bonded substrate stack in the positioning apparatus according to the second arrangement example.

Such shift amount detection is executed every time the substrate rotating stage 1010 pivots by a predetermined angle and stops. With this processing, the shift amount (projecting amount) between the edge of the first substrate 10 and that of the second substrate 20 can be detected for a portion of the perimeter of the bonded substrate stack 30 where the first substrate 10 projects. FIG. 15 is a graph showing the result of shift amount detection executed throughout the perimeter of the bonded substrate stack 30. Referring to FIG. 15, the abscissa represents the angle of rotation of the substrate rotating stage 1010, and the ordinate represents the shift amount (only for the portion where the first substrate 10 projects) between the edge of the first substrate 10 and that of the second substrate 20. The first projecting portion is a portion where the shift amount has a value larger than 0, and its representative position is preferably a portion where the shift amount has a maximal value. The position (representative position) of the first projecting portion is specified by, e.g., the angle of rotation of the substrate rotating stage 1010 (in the case shown in FIG. 15, the position of the first projecting portion corresponds to −90°).

After the position of the first projecting portion is detected, the bonded substrate stack 30 is positioned by the substrate rotating stage 1010 such that the first projecting portion matches a predetermined reference position (e.g., a position opposing the laser position detection sensor 1020).

In this arrangement example, although the layout direction of the bonded substrate stack 30 (the first substrate 10 must be set on the lower side) is limited by the layout position of the laser position detection sensor 1020, this limitation can be eliminated by, e.g., arranging another laser position detection sensor opposing the laser position detection sensor 1020.

Figure 16:
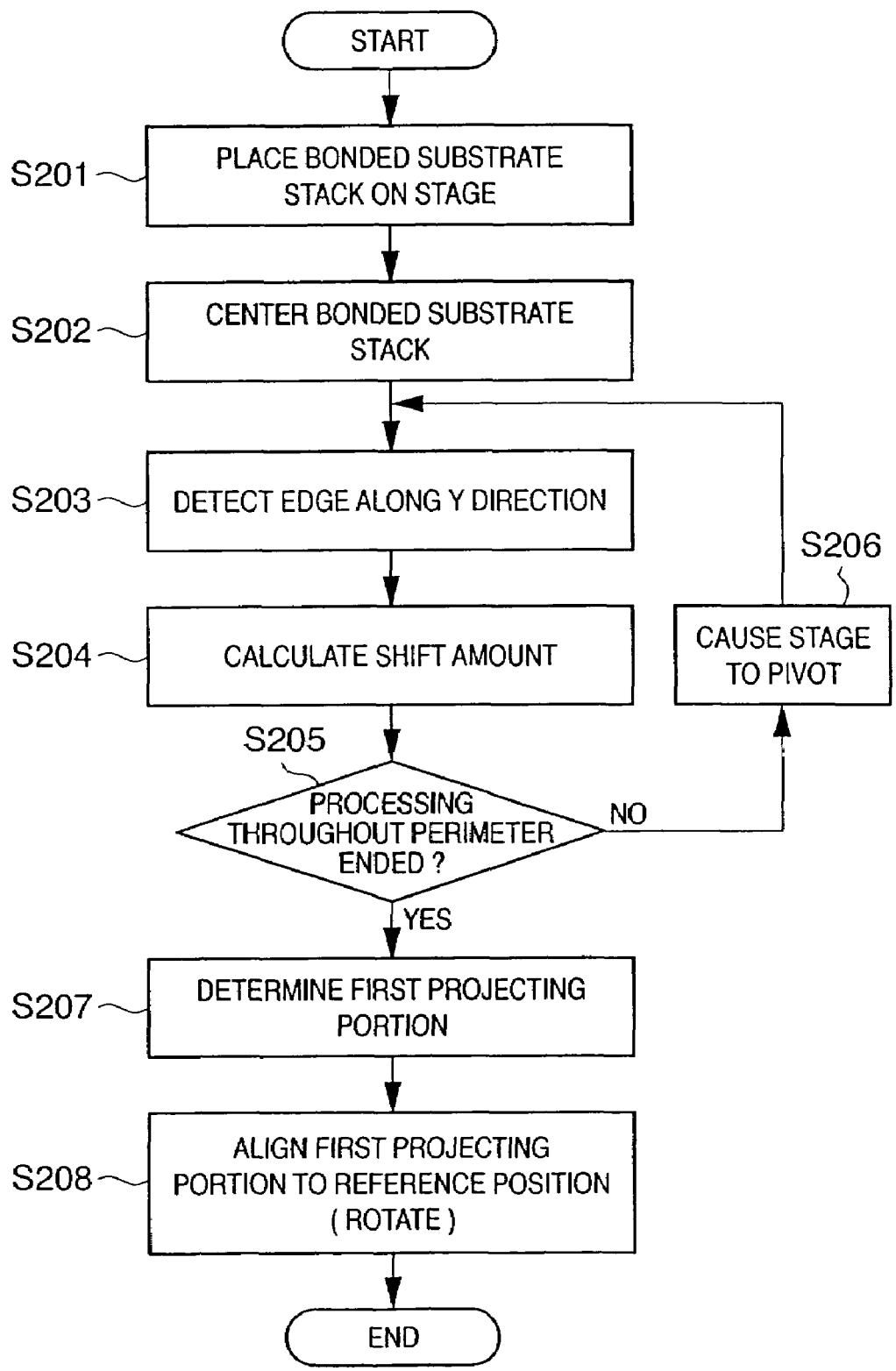
FIG. 16 is a flow chart for explaining the procedure of positioning in the positioning apparatus according to the second arrangement example.

The procedure of positioning in the positioning apparatus 2000 will be described next with reference to the flow chart shown in FIG. 16. The processing shown in this flow chart is controlled by the computer 1030.

In step S201, the bonded substrate stack 30 with the first substrate 10 set on the lower side is placed on the substrate rotating stage 1010 by a transfer robot (e.g., a transfer robot 1100 shown in FIG. 10). At this time, the center of the bonded substrate stack 30 is roughly aligned to the rotational center of the substrate rotating stage 1010.

In step S202, the centering members 1001 and 1002 sandwich the bonded substrate stack 30 from both sides to align the center of the bonded substrate stack 30 to the rotational center of the substrate rotating stage 1010.

In steps S203 to S206, the sectional shape of the edge of the bonded substrate stack 30 is measured by the laser position detection sensor 1020 for every predetermined angle throughout the perimeter of the bonded substrate stack 30 along the surface (Y direction) of the bonded substrate stack, and the shift amount (only for the first projecting portion) between the substrates 10 and 20 of the bonded substrate stack 30 is calculated on the basis of the sectional shape.

More specifically, in step S203, the substrate rotating stage 1010 is kept stopped, and in this state, the Y-direction position (sectional shape) of the edge of the bonded substrate stack 30 is measured using the laser position detection sensor 1020 along the plane (Y direction) of the bonded substrate stack. FIG. 14 schematically shows an example of the measurement result.

In step S204, the shift amount between the edges of the substrates 10 and 20 of the bonded substrate stack 30 is calculated on the basis of the result of measurement in step S203, and the calculation result is stored.

In step S205, it is determined whether execution of steps S203 and S204 is ended throughout the perimeter of the bonded substrate stack 30. If NO in step S205, the substrate rotating stage 1010 is made to pivot by a predetermined angle (e.g., 10°) in step S206. After that, steps S203 and S204 are executed.

When the above processing is ended throughout the perimeter of the bonded substrate stack 30, the position (representative position) of the first projecting portion is determined in step S207 on the basis of the shift amount (FIG. 15) between the two substrates for the portion of the perimeter of the bonded substrate stack 30 where the first substrate 10 projects. More specifically, the shift amount data obtained for every predetermined angle are approximated to a curve, thereby determining the angle of rotation of the substrate rotating stage 1010, at which, e.g., the shift amount has the maximum value.

In step S208, the substrate rotating table 1010 is made to pivot such that the position of the first projecting portion matches the reference position, as shown in FIG. 10.

[Third Arrangement Example of Positioning Apparatus]

Figure 17:
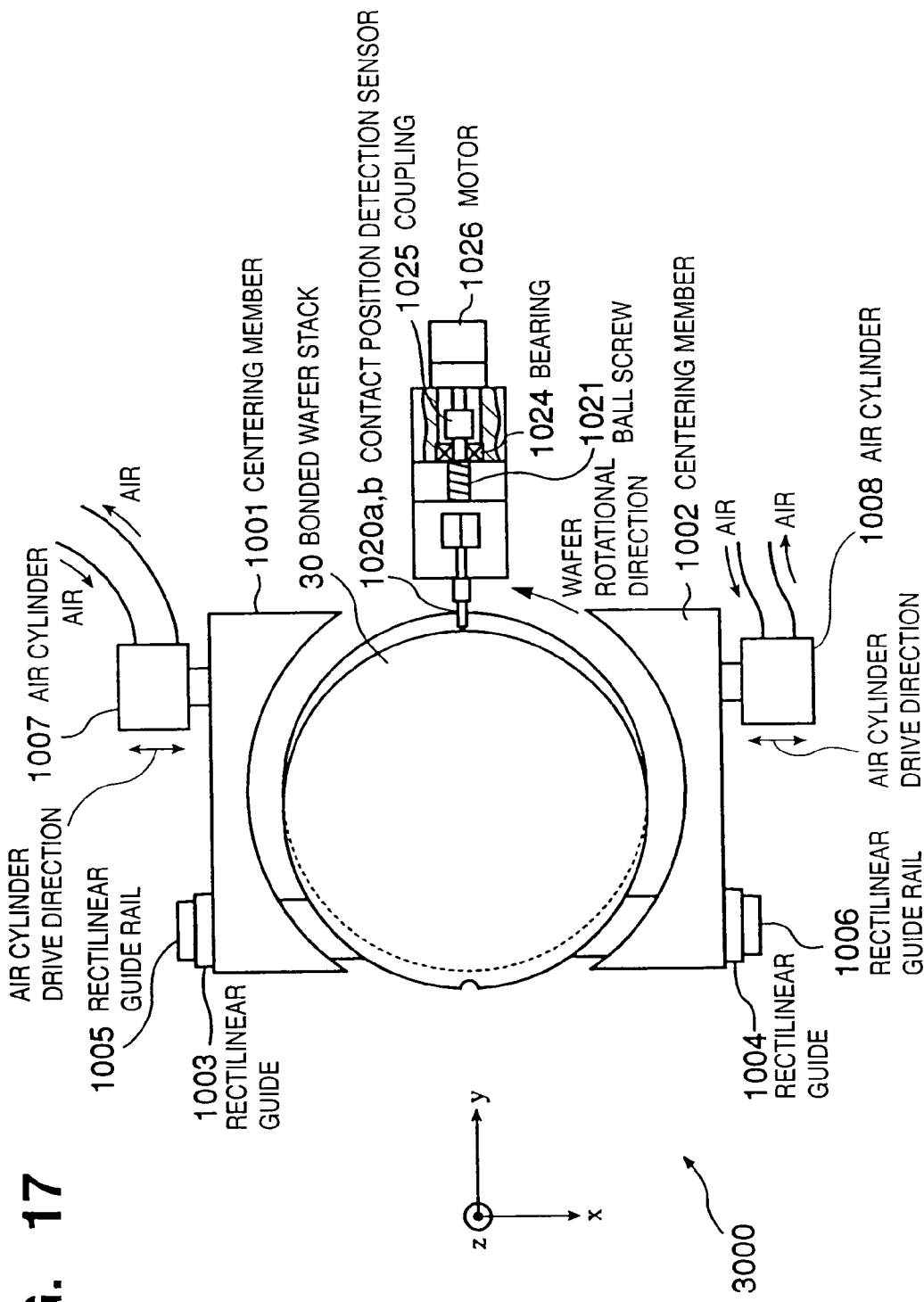
FIG. 17 is a view showing a positioning apparatus according to the third arrangement example.
Figure 18:
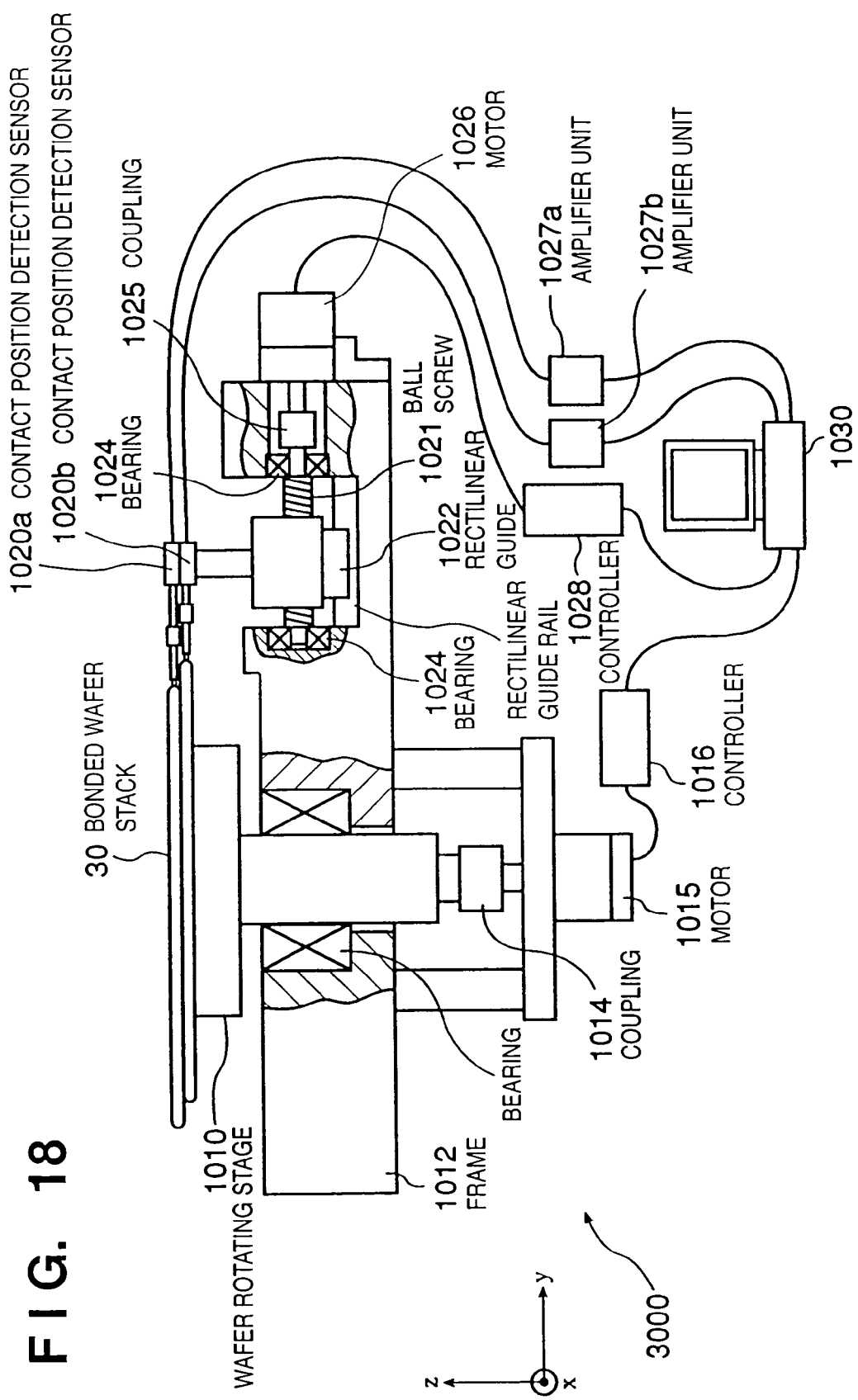
FIG. 18 is a view showing the positioning apparatus according to the third arrangement example.

FIGS. 17 and 18 are views showing a positioning apparatus according to the third arrangement example. A positioning apparatus 3000 centers a bonded substrate stack 30, detects, throughout the perimeter of the bonded substrate stack 30, the shift amount between the edge of a first substrate 10 and the edge of a second substrate 20 by a contact position detection device, detects the position of the first projecting portion on the basis of the shift amount, and rotates the bonded substrate stack 30 to make the first projecting portion match the reference position.

The positioning apparatus 3000 has a substrate rotating stage 1010 for rotating the bonded substrate stack 30 in the X-Y plane. The substrate rotating stage 1010 is connected to the rotating shaft of a motor 1015 through a rotating shaft 1013 and coupling 1014. The motor 1015 operates in accordance with an instruction from a controller 1016 controlled by a computer 1030.

The positioning apparatus 3000 has a pair of centering members 1001 and 1002 for sandwiching the edge of the bonded substrate stack 30 from both sides as a mechanism for centering the bonded substrate stack 30 placed on the substrate rotating stage 1010 by a transfer robot (not shown). The centering member 1001 is driven along a guide rail 1005 by an air cylinder 1007. The centering member 1002 is driven along a guide rail 1006 by an air cylinder 1008. The centering members 1001 and 1002 are pushed by the air cylinders 1007 and 1008, and the bonded substrate stack 30 is sandwiched by the centering members 1001 and 1002 from both sides, thereby centering the bonded substrate stack 30.

The position apparatus 3000 has two contact position detection sensor 1020a and 1020b as a position detection device for detecting the positions (Y-direction positions) of the edges of the first and second substrates 10 and 20 of the bonded substrate stack 30. The contact position detection sensors 1020a and 1020b have contacts that abut against the edges of the first and second substrates 10 and 20 to be subjected to position detection. The positions of the contact position detection sensors 1020a and 1020b are adjusted in the horizontal direction (Y direction) by a ball screw 1021 rotatably driven by a motor 1026. The motor 1026 operates in accordance with an instruction from a controller 1028 controlled by the computer 1030. The outputs from the contact position detection devices 1020a and 1020b are amplified by amplifier units 1027a and 1027b and supplied to the computer 1030. In this arrangement, the edges of the first substrate 10 and second substrate of the bonded substrate stack 30 are detected by the contact position detection devices 1020a and 1020b throughout the perimeter of the bonded substrate stack 30 while rotating the substrate rotating table 1010.

Figure 19:
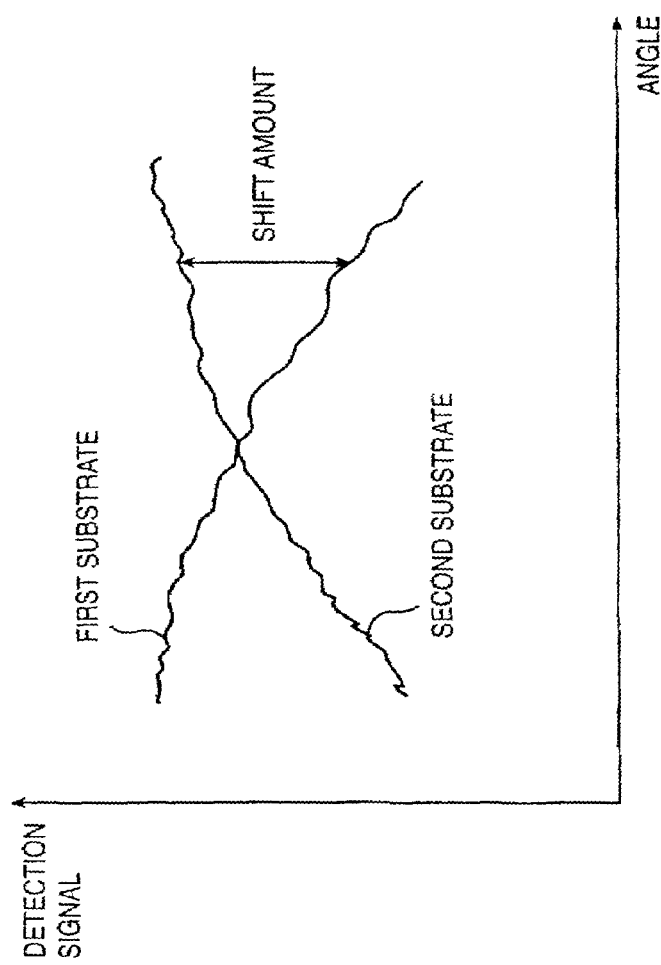
FIG. 19 is a graph showing examples of edges of first and second substrates of a bonded substrate stack, which are detected by contact position detection sensors in the positioning apparatus according to the third arrangement example.

FIG. 19 is a graph showing examples of the edges of the first substrate 10 and second substrate 20 of the bonded substrate stack 30, which are detected by the contact position detection sensors 1020a and 1020b. Referring to FIG. 19, the abscissa represents the angle of rotation of the substrate rotating stage 1010, and the ordinate represents signals (detection signals) obtained by amplifying the outputs from the contact position detection sensors 1020a and 1020b by the amplifier units 1027a and 1027b. The computer 1030 can detect the shift amount (projecting amount) between the edge of the first substrate 10 and the edge of the second substrate 20 on the basis of the difference of the two detection signals.

Figure 20:
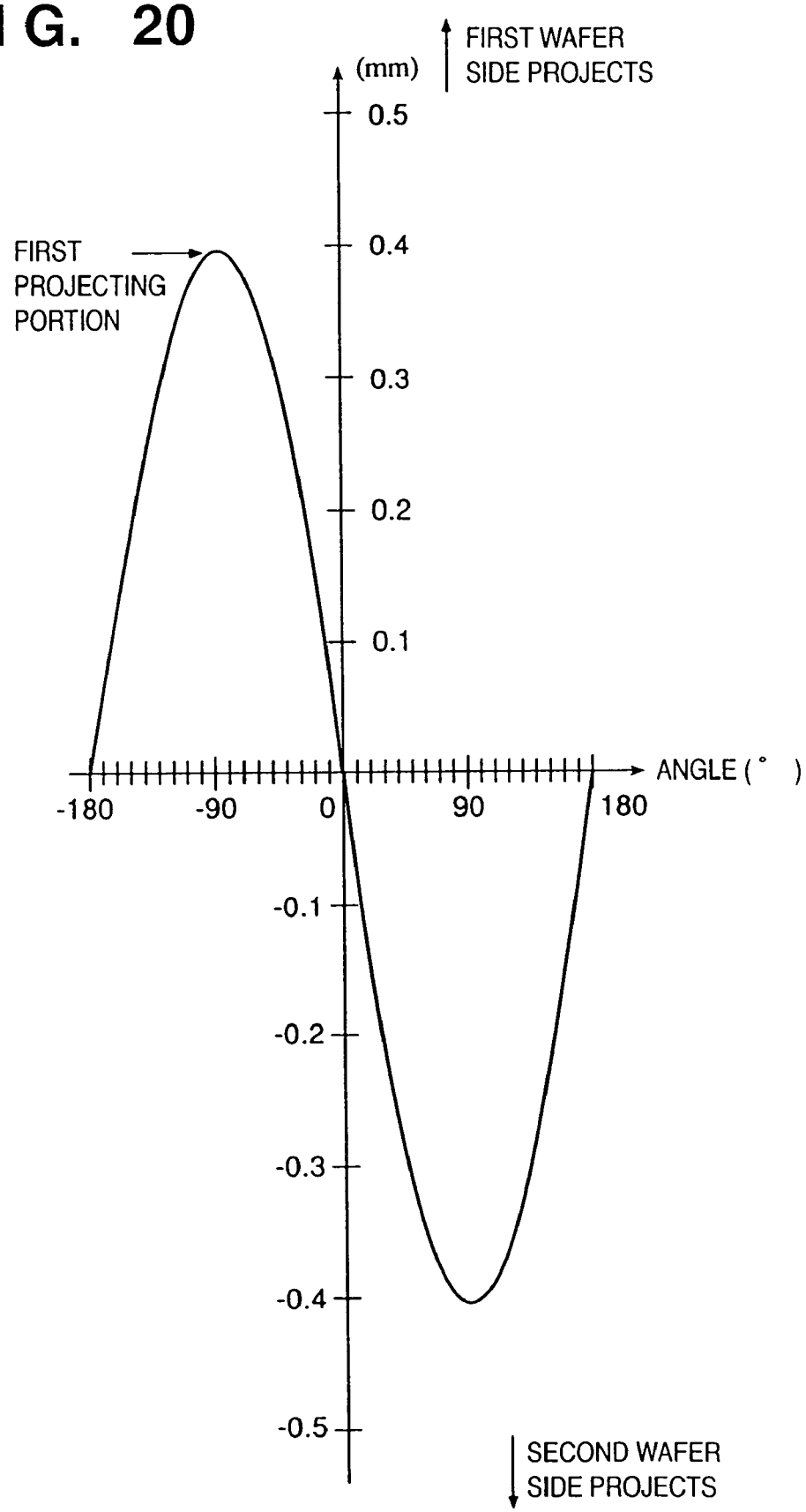
FIG. 20 is a graph showing the result of shift amount detection executed throughout the perimeter of the bonded substrate stack in the positioning apparatus according to the third arrangement example.

FIG. 20 is a graph showing the result of shift amount detection executed throughout the perimeter of the bonded substrate stack 30. Referring to FIG. 20, the abscissa represents the angle of rotation of the substrate rotating stage 1010, and the ordinate represents the shift amount between the edge of the first substrate 10 and that of the second substrate 20. A shift amount detected when the edge of the first substrate 10 projects outside the edge of the second substrate 20 is represented by a positive value, and a shift amount detected when the edge of the second substrate 20 projects outside the edge of the first substrate 10 is represented by a negative value. As shown in FIG. 20, at the first projecting portion, the shift amount has a positive value, and the representative position of the first projecting portion is preferably a position where the shift amount has a positive maximal value. The position (representative position) of the first projecting portion is specified by, e.g., the angle of rotation of the substrate rotating stage 1010 (in the case shown in FIG. 20, the position of the first projecting portion corresponds to −90°).

After the position of the first projecting portion is detected, the bonded substrate stack 30 is positioned by the substrate rotating stage 1010 such that the first projecting portion matches a predetermined reference position (e.g., a position opposing the contact position detection sensors 1020a and 1020b).

In this arrangement example, the shift amount between the first substrate 10 and the second substrate 20 of the bonded substrate stack 30 can be continuously detected while rotating the bonded substrate stack 30.

Figure 21:
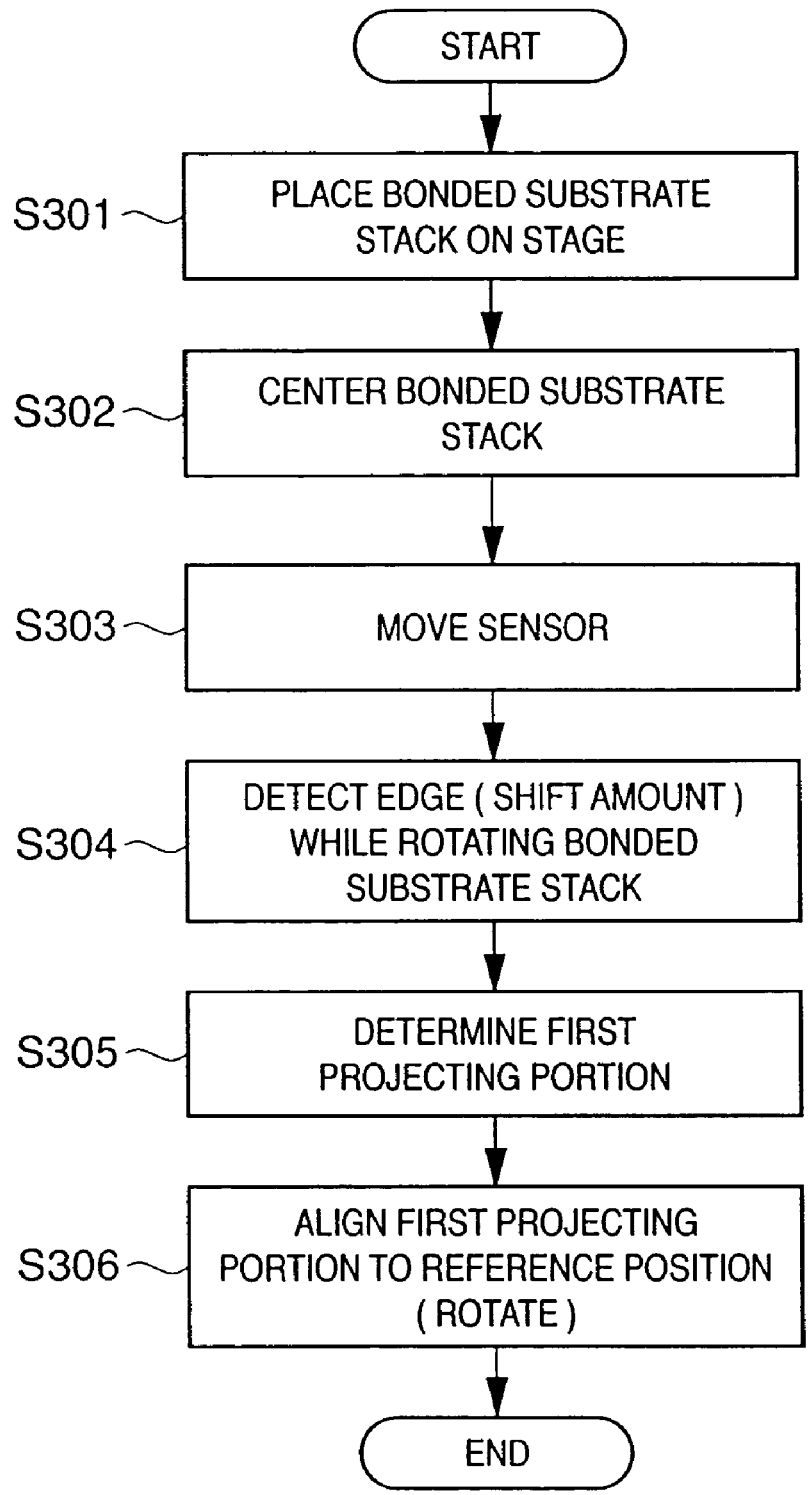
FIG. 21 is a flow chart for explaining the procedure of positioning in the positioning apparatus according to the third arrangement example.

The procedure of positioning in the positioning apparatus 3000 will be described next with reference to the flow chart shown in FIG. 21. The processing shown in this flow chart is controlled by the computer 1030.

In step S301, the bonded substrate stack 30 is placed on the substrate rotating stage 1010 by a transfer robot (e.g., a transfer robot 1100 shown in FIG. 10). At this time, the center of the bonded substrate stack 30 is roughly aligned to the rotational center of the substrate rotating stage 1010. The upper and lower sides of the bonded substrate stack 30 are determined in advance, supplied from another apparatus or operator to the computer 1030 in placing the bonded substrate stack 30 on the substrate rotating stage 1010, or acquired by the computer 1030.

In step S302, the centering members 1001 and 1002 sandwich the bonded substrate stack 30 from both sides to align the center of the bonded substrate stack 30 to the rotational center of the substrate rotating stage 1010.

In step S303, the motor 1026 is operated to make the contacts of the contact position detection sensors 1020a and 1020b abut against the edge of the bonded substrate stack 30.

In step S304, while rotating the substrate rotating table 1010 (bonded substrate stack 30) by operating the motor 1015, the positions of the edges of the first substrate 10 and second substrate 20 of the bonded substrate stack 30 are detected by the contact position detection sensors 1020a and 1020b. In addition, the shift amount between the substrates 10 and 20 is detected on the basis of the difference between the two detection results. This detection is done throughout the perimeter of the bonded substrate stack 30.

In step S305, the position (representative position) of the first projecting portion is determined on the basis of the shift amount (FIG. 20) between the two substrates for a portion of the perimeter of the bonded substrate stack 30 where the first substrate 10 projects. More specifically, for example, the angle of rotation of the substrate rotating stage 1010, at which, e.g., the shift amount has the maximum value, is determined.

In step S306, the substrate rotating table 1010 is made to pivot such that the position of the first projecting portion matches the reference position, as shown in FIG. 10.

According to this embodiment, independently of which of the first substrate 10 and second substrate of the bonded substrate stack 30 is set on the upper side (or lower side), the position of the first projecting portion 31 (or a portion at which a separation start portion is to be formed) can be detected and made to match the reference position. To do this, however, the upper and lower sides of the bonded substrate stack 30 must be determined in advance, supplied to the computer 1030 in placing the bonded substrate stack 30 on the substrate rotating stage 1010, or acquired by the computer 1030. Typically, a plurality of bonded substrate stacks 30 whose upper and lower sides are set in the same directions are extracted one by one from a wafer carrier that stores the bonded substrate stacks 30 and supplied to the positioning apparatus 3000. The upper and lower sides are determined in advance.

Additionally, according to this embodiment, since the shift amount between the first and second substrates of the bonded substrate stack 30 can be continuously detected throughout the perimeter of the bonded substrate stack 30, the first projecting portion can be detected at a high speed.

[Fourth Arrangement Example of Positioning Apparatus]

Figure 22:
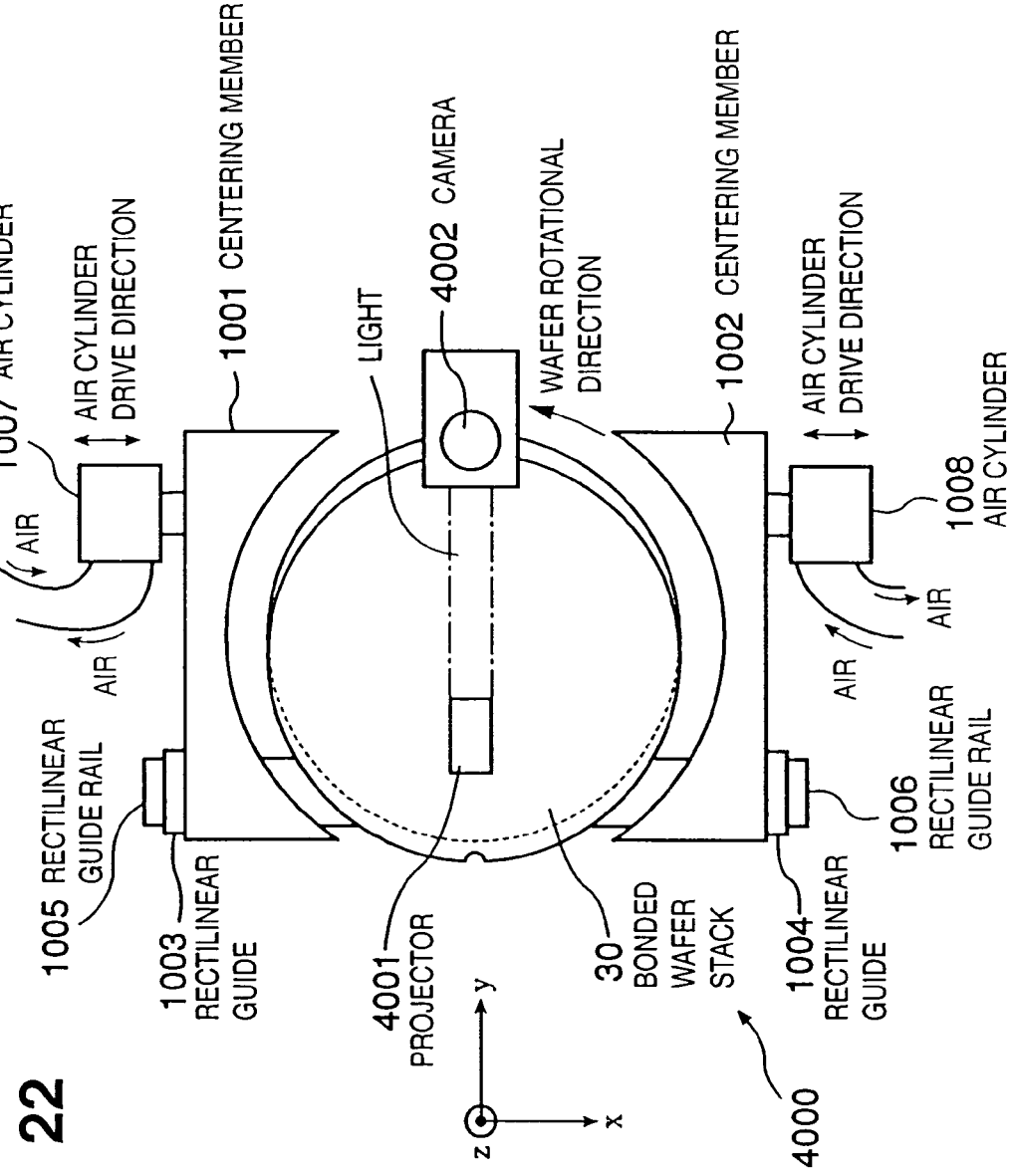
FIG. 22 is a view showing a positioning apparatus according to the fourth arrangement example.
Figure 23:
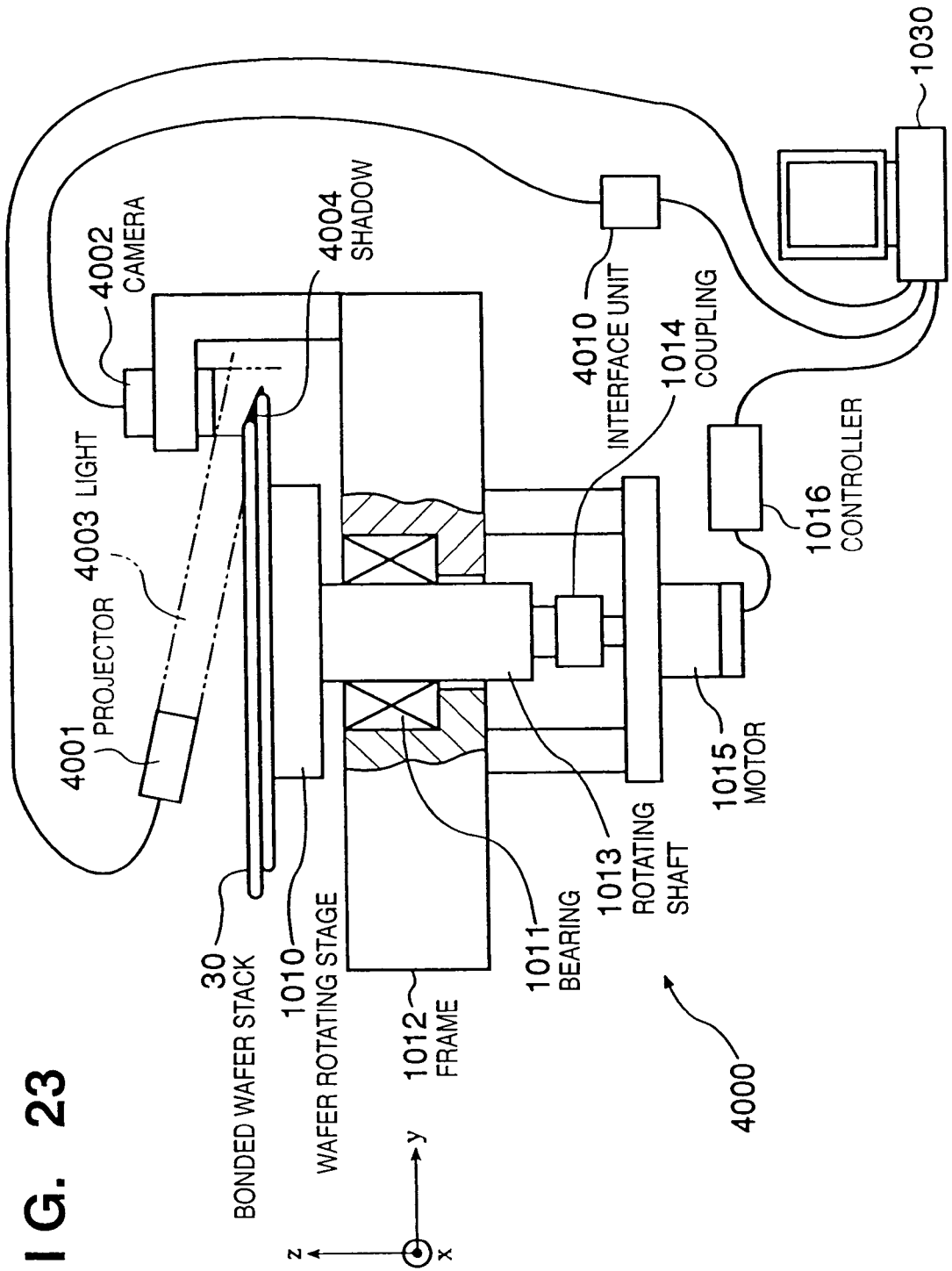
FIG. 23 is a view showing the positioning apparatus according to the fourth arrangement example.

FIGS. 22 and 23 are views showing a positioning apparatus according to the fourth arrangement example. A positioning apparatus 4000 centers a bonded substrate stack 30, detects the shift amount between the edge of a first substrate 10 and the edge of a second substrate using an image processing technique, detects the position of the first projecting portion on the basis of the shift amount, and rotates the bonded substrate stack 30 to make the first projecting portion match the reference position.

The positioning apparatus 4000 has a substrate rotating stage 1010 for rotating the bonded substrate stack 30 in the X-Y plane. The bonded substrate stack 30 is placed on the substrate rotating stage 1010 such that the first substrate 10 is set on the lower side. The substrate rotating stage 1010 is connected to the rotating shaft of a motor 1015 through a rotating shaft 1013 and coupling 1014. The motor 1015 operates in accordance with an instruction from a controller 1016 controlled by a computer 1030.

The positioning apparatus 4000 has a pair of centering members 1001 and 1002 for sandwiching the edge of the bonded substrate stack 30 from both sides as a mechanism for centering the bonded substrate stack 30 placed on the substrate rotating stage 1010 by a transfer robot (not shown). The centering member 1001 is driven along a guide rail 1005 by an air cylinder 1007. The centering member 1002 is driven along a guide rail 1006 by an air cylinder 1008. The centering members 1001 and 1002 are pushed by the air cylinders 1007 and 1008, and the bonded substrate stack 30 is sandwiched by the centering members 1001 and 1002 from both sides, thereby centering the bonded substrate stack 30.

The positioning apparatus 4000 also has a projector (light source) 4001 and camera (image sensing device) 4002 to detect the shift amount between the first substrate 10 and the second substrate 20 of the bonded substrate stack 30. The camera 4002 is connected to the computer 1030 through an interface unit (e.g., a video capture board) 4010. The projector 4001 illuminates the bonded substrate stack 30 so as to illuminate the second substrate 20 and shadow the first substrate 10 through the second substrate 20 at the first projecting portion of the bonded substrate stack 30. The camera 4002 senses a region including the edge of the bonded substrate stack 30 and supplies the image to the computer 1030 through the interface unit 4010. This image sensing is executed throughout the perimeter of the bonded substrate stack 30 while rotating the bonded substrate stack 30. The image sensing may be executed while continuously rotating the bonded substrate stack 30. Alternatively, pivot and stop operations may be repeated, and an image may be sensed every time the bonded substrate stack 30 is stopped.

Figure 24:
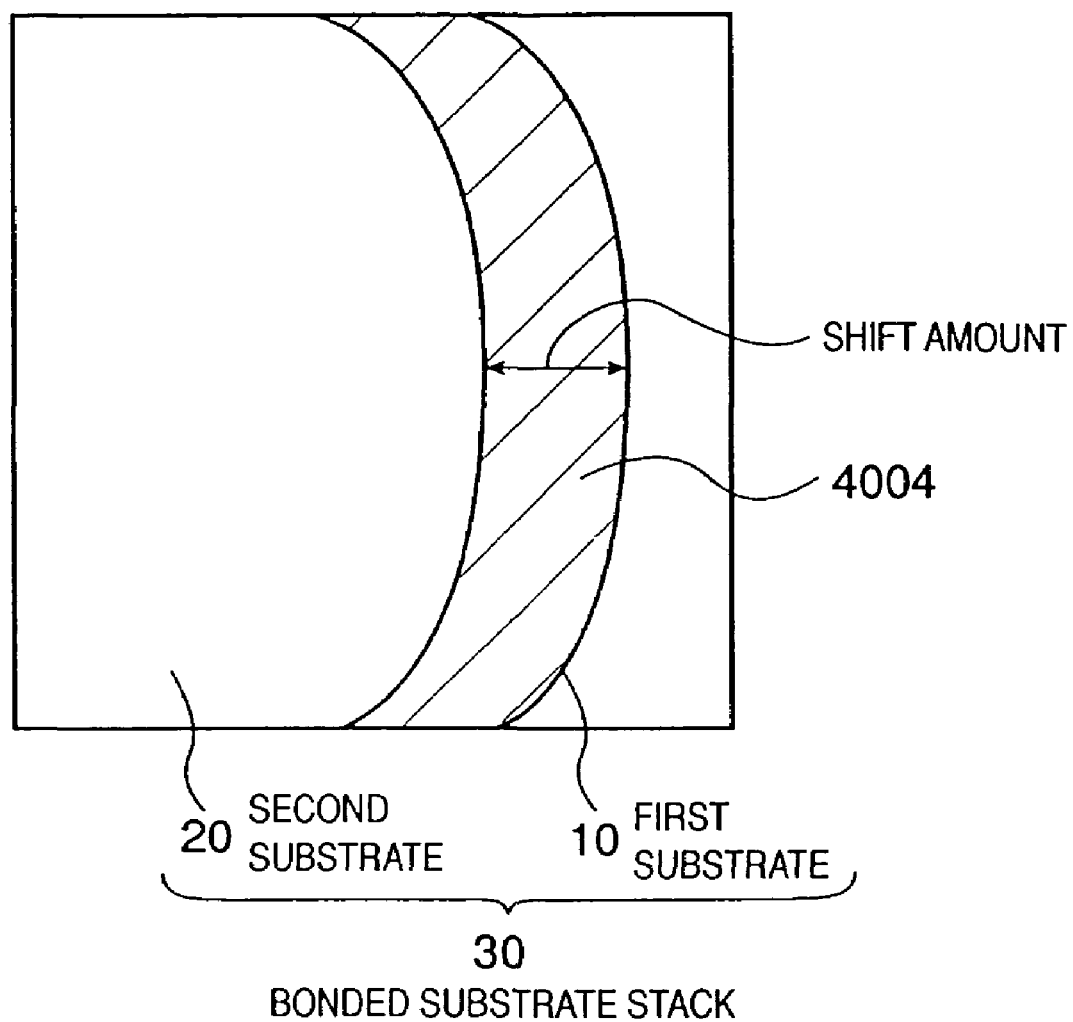
FIG. 24 is a graph showing an example of an image supplied from a camera to a computer through an interface unit in the positioning apparatus according to the fourth arrangement example.

FIG. 24 is a graph showing an example of an image supplied from the camera 4002 to the computer 1030 through the interface unit 4010. The length of a shadow 4004 formed by the second substrate 20 corresponds to the shift amount between the first substrate 10 and the second substrate 20. The computer 1030 extracts the shadow 4004 by, e.g., binarizing the image supplied from the camera 4002, and detects the shift amount between the first substrate 10 and the second substrate 20 on the basis of the shadow 4004. Another projector is preferably used to clarify the edge position of the first substrate 10 as the lower substrate. This projector can be laid out to, e.g., illuminate the background of the bonded substrate stack 30 (the outside of the bonded substrate stack).

Figure 25:
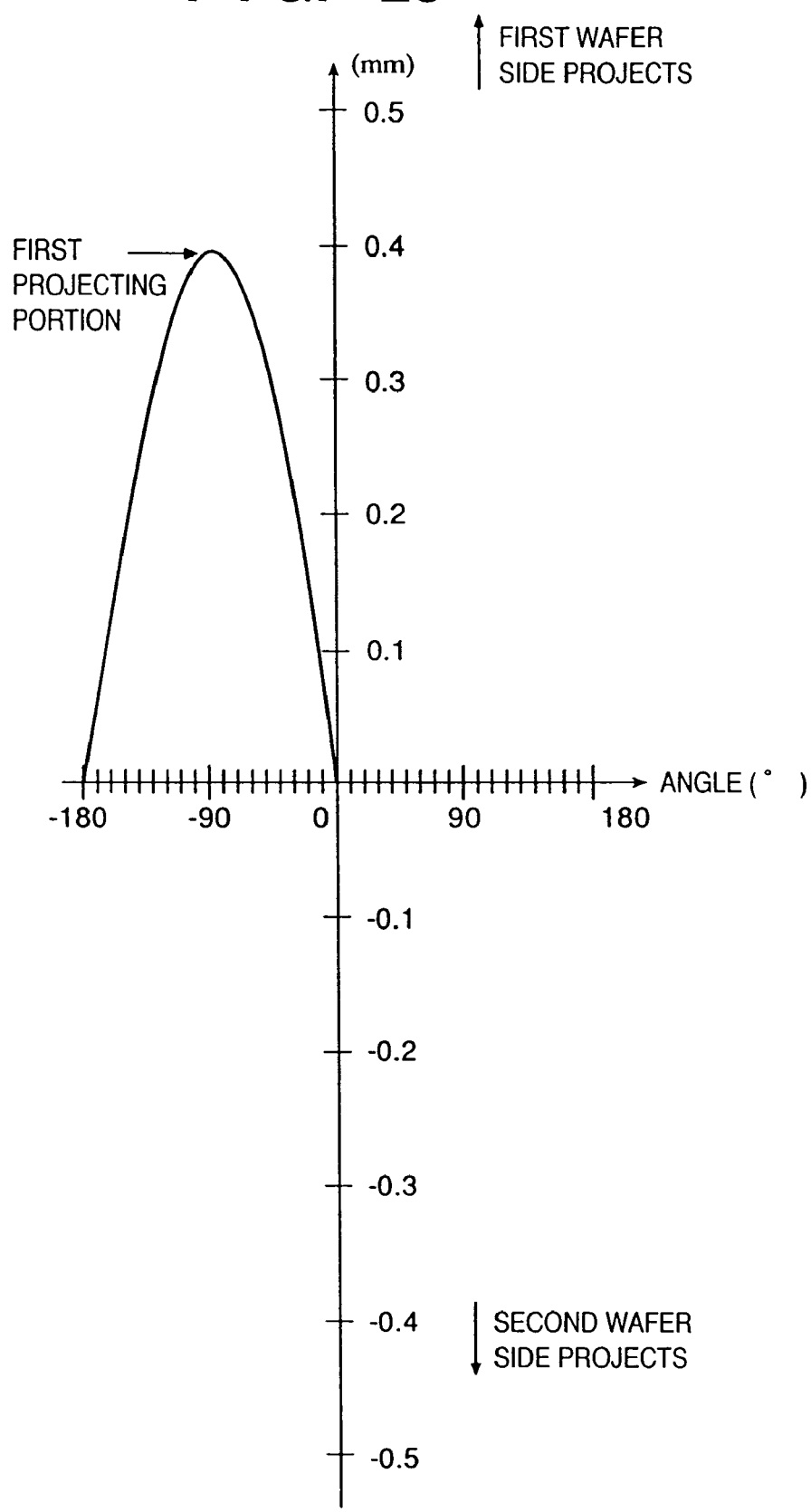
FIG. 25 is a graph showing the result of shift amount detection executed throughout the perimeter of the bonded substrate stack in the positioning apparatus according to the fourth arrangement example.

FIG. 25 is a graph showing the result of shift amount detection executed throughout the perimeter of the bonded substrate stack 30. Referring to FIG. 25, the abscissa represents the angle of rotation of the substrate rotating stage 1010, and the ordinate represents the shift amount (corresponding to the length of the shadow) between the edge of the first substrate 10 and that of the second substrate 20. The first projecting portion is a portion where the shift amount has a value larger than 0, and its representative position is preferably a position where the shift amount has a maximal value. The position (representative position) of the first projecting portion is specified by, e.g., the angle of rotation of the substrate rotating stage 1010 (in the case shown in FIG. 25, the position of the first projecting portion corresponds to −90°).

After the position of the first projecting portion is detected, the bonded substrate stack 30 is positioned by the substrate rotating stage 1010 such that the first projecting portion matches a predetermined reference position.

In this arrangement example, although the layout direction of the bonded substrate stack 30 (the first substrate 10 must be set on the lower side) is limited by the layout of the projector 4001 and camera 4002, this limitation can be eliminated by, e.g., arranging another projector and camera at appropriate positions (e.g., positions symmetrical to the projector 4001 and camera 4002 with respect to the surface of the bonded substrate stack).

Figure 26:
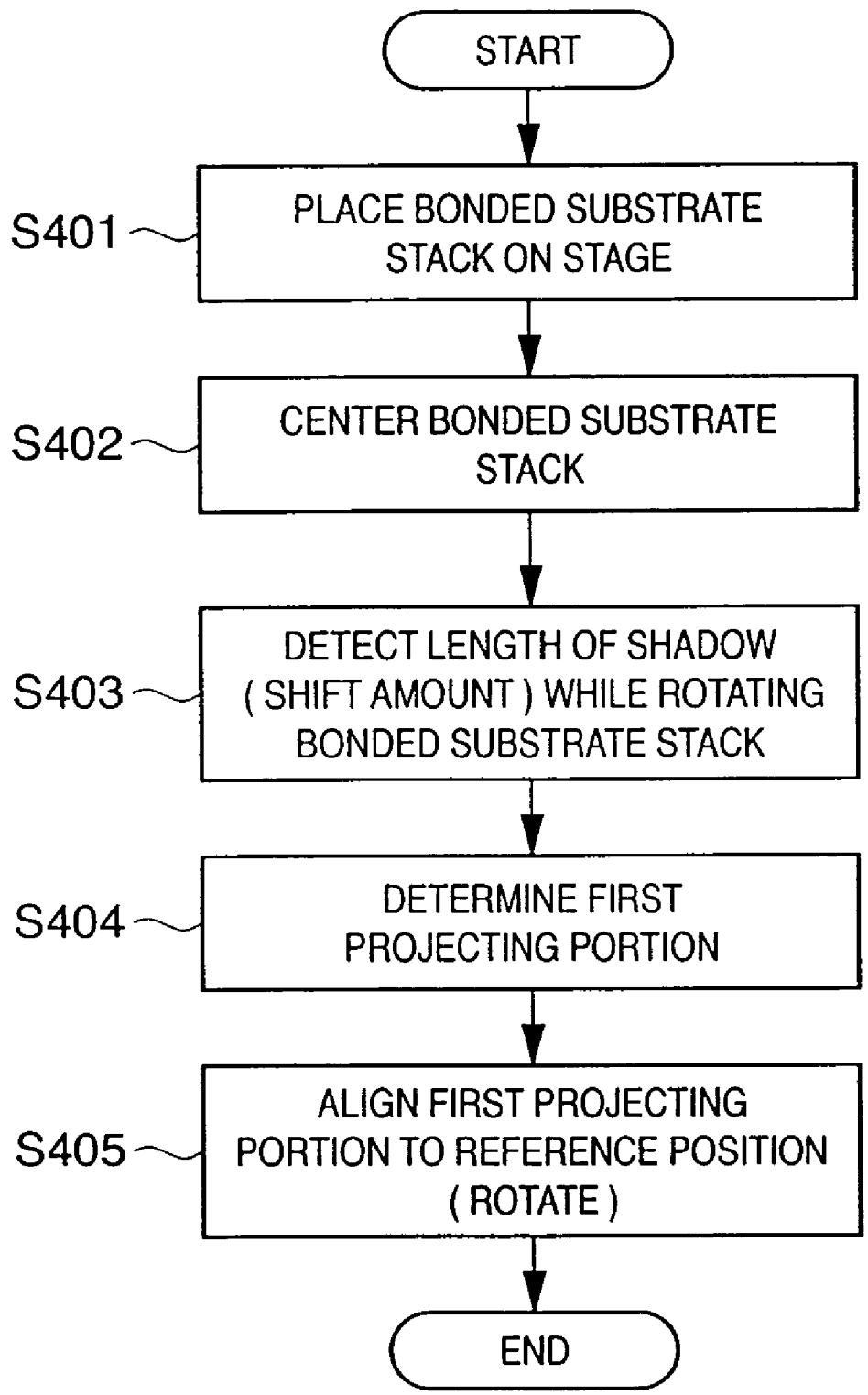
FIG. 26 is a flow chart for explaining the procedure of positioning in the positioning apparatus according to the fourth arrangement example.

The procedure of positioning in the positioning apparatus 4000 will be described next with reference to the flow chart shown in FIG. 26. The processing shown in this flow chart is controlled by the computer 1030.

In step S401, the bonded substrate stack 30 with the first substrate 10 set on the lower side is placed on the substrate rotating stage 1010 by a transfer robot (e.g., a transfer robot 1100 shown in FIG. 10). At this time, the center of the bonded substrate stack 30 is roughly aligned to the rotational center of the substrate rotating stage 1010.

In step S402, the centering members 1001 and 1002 sandwich the bonded substrate stack 30 from both sides to align the center of the bonded substrate stack 30 to the rotational center of the substrate rotating stage 1010.

In step S403, while rotating the substrate rotating table 1010 (bonded substrate stack 30) by operating the motor 1015, the length of the shadow formed by the shift between the first substrate 10 and the second substrate 20 is detected using the projector 4001 and camera 4002, and the shift amount between the substrates 10 and 20 is detected on the basis of the length of the shadow. This detection is done throughout the perimeter of the bonded substrate stack 30.

In step S404, the position (representative position) of the first projecting portion is determined on the basis of the shift amount (FIG. 25) between the two substrates for a portion of the perimeter of the bonded substrate stack 30 where the first substrate 10 projects.

In step S405, the substrate rotating table 1010 is made to pivot such that the position of the first projecting portion matches the reference position, as shown in FIG. 10.

[Fifth Arrangement Example of Positioning Apparatus]

Figure 27:
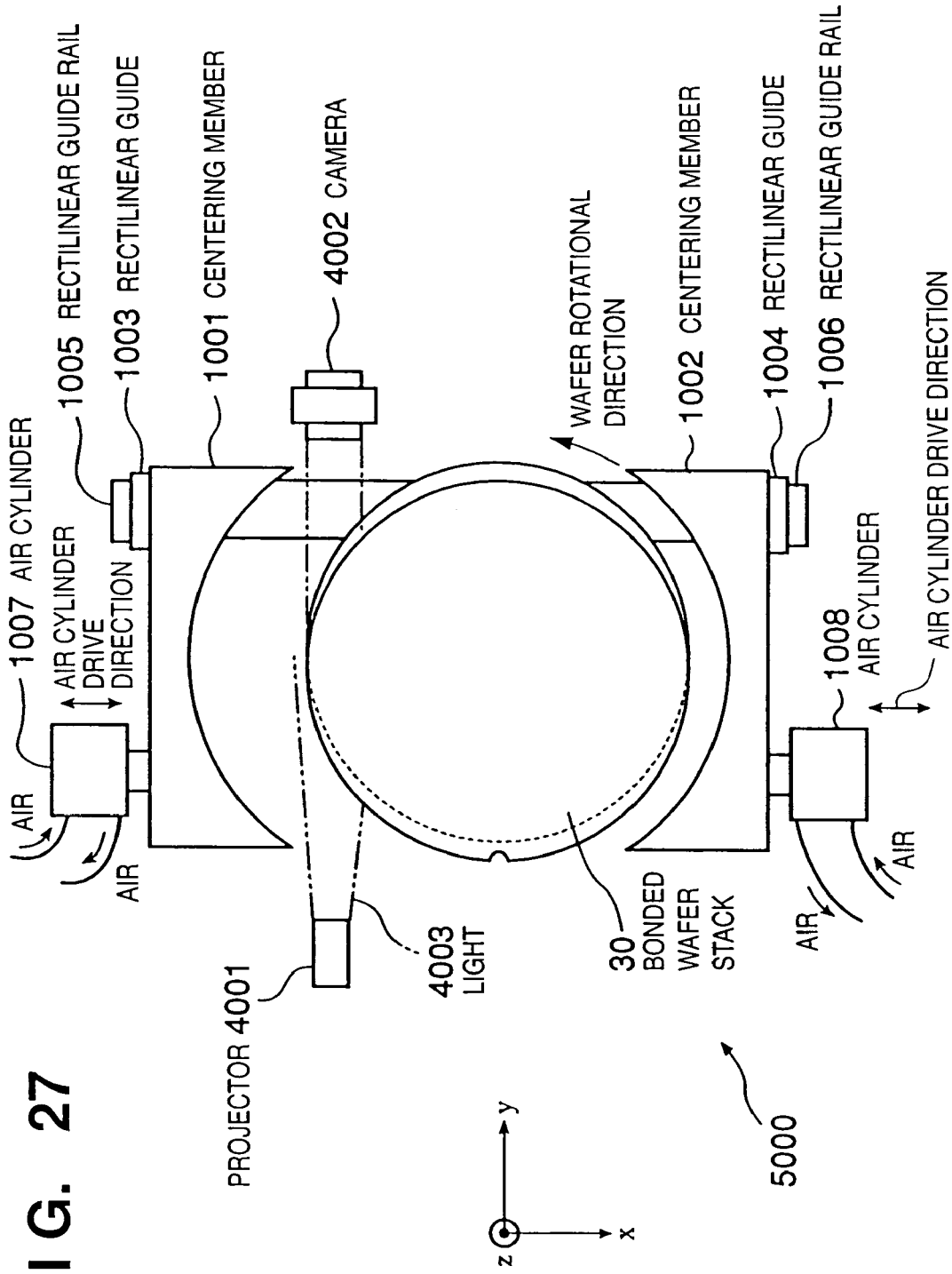
FIG. 27 is a view showing a positioning apparatus according to the fifth arrangement example.
Figure 28:
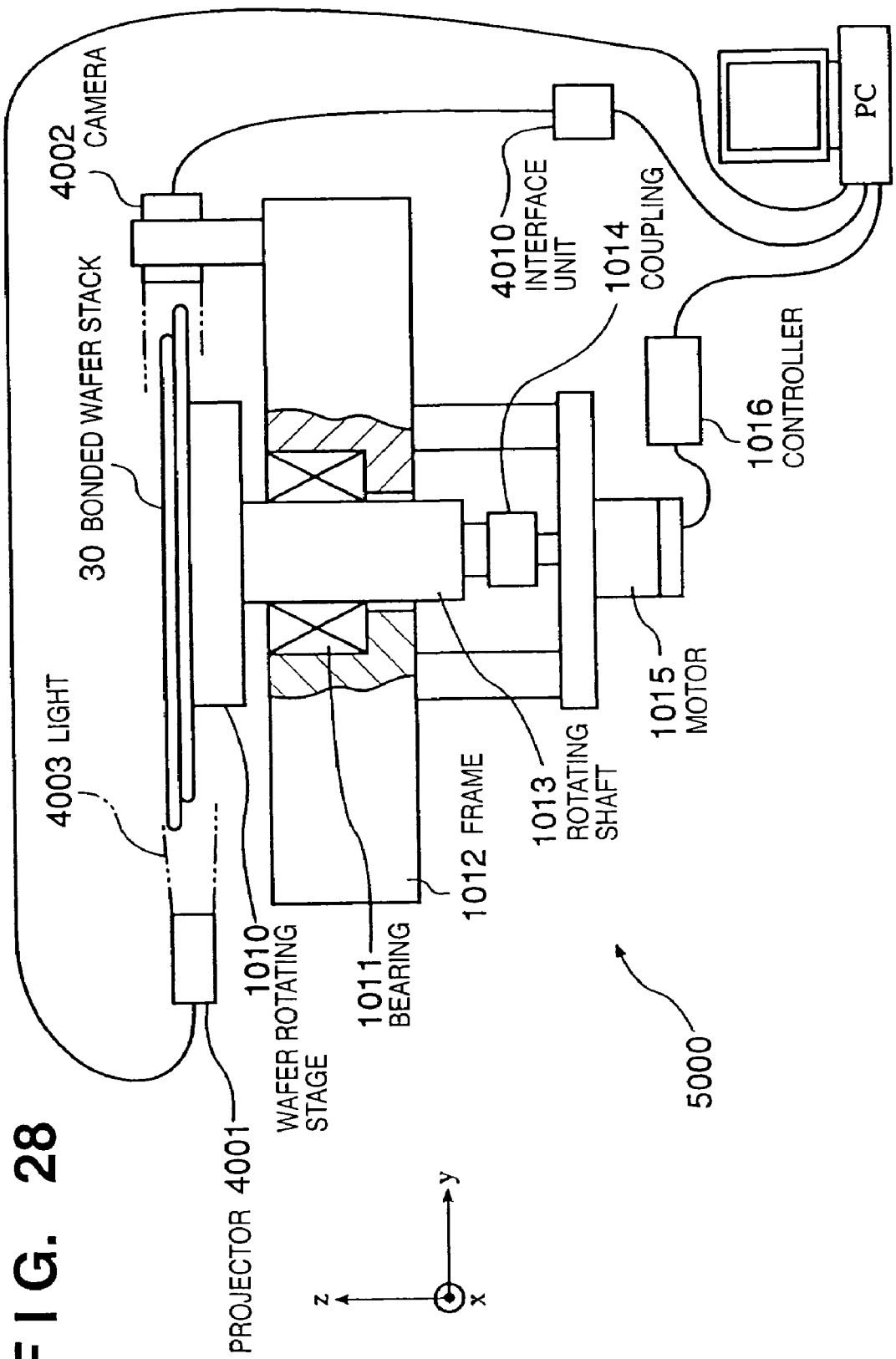
FIG. 28 is a view showing the positioning apparatus according to the fifth arrangement example.

FIGS. 27 and 28 are views showing a positioning apparatus according to the fifth arrangement example. A positioning apparatus 5000 centers a bonded substrate stack 30, detects the shift amount between the edge of a first substrate 10 and the edge of a second substrate using an image processing technique, detects the position of the first projecting portion on the basis of the shift amount, and rotates the bonded substrate stack 30 to make the first projecting portion match the reference position.

The positioning apparatus 5000 has a substrate rotating stage 1010 for rotating the bonded substrate stack 30 in the X-Y plane. The substrate rotating stage 1010 is connected to the rotating shaft of a motor 1015 through a rotating shaft 1013 and coupling 1014. The motor 1015 operates in accordance with an instruction from a controller 1016 controlled by a computer 1030.

The positioning apparatus 5000 has a pair of centering members 1001 and 1002 for sandwiching the edge of the bonded substrate stack 30 from both sides as a mechanism for centering the bonded substrate stack 30 placed on the substrate rotating stage 1010 by a transfer robot (not shown). The centering member 1001 is driven along a guide rail 1005 by an air cylinder 1007. The centering member 1002 is driven along a guide rail 1006 by an air cylinder 1008. The centering members 1001 and 1002 are pushed by the air cylinders 1007 and 1008, and the bonded substrate stack 30 is sandwiched by the centering members 1001 and 1002 from both sides, thereby centering the bonded substrate stack 30.

The positioning apparatus 5000 also has a projector (light source) 4001 and camera (image sensing device) 4002 to detect the shift amount between the first substrate 10 and the second substrate 20 of the bonded substrate stack 30. The camera 4002 is connected to the computer 1030 through an interface unit (e.g., a video capture board) 4010. The projector 4001 illuminates a region including the edge of the bonded substrate stack 30. The projector 4001 senses the edge of the bonded substrate stack 30 from the tangent direction and supplies the image to the computer 1030 through the interface unit 4010. This image sensing is executed throughout the perimeter of the bonded substrate stack 30 while rotating the bonded substrate stack 30. The image sensing may be executed while continuously rotating the bonded substrate stack 30. Alternatively, pivot and stop operations may be repeated, and an image may be sensed every time the bonded substrate stack 30 is stopped.

Figure 29:
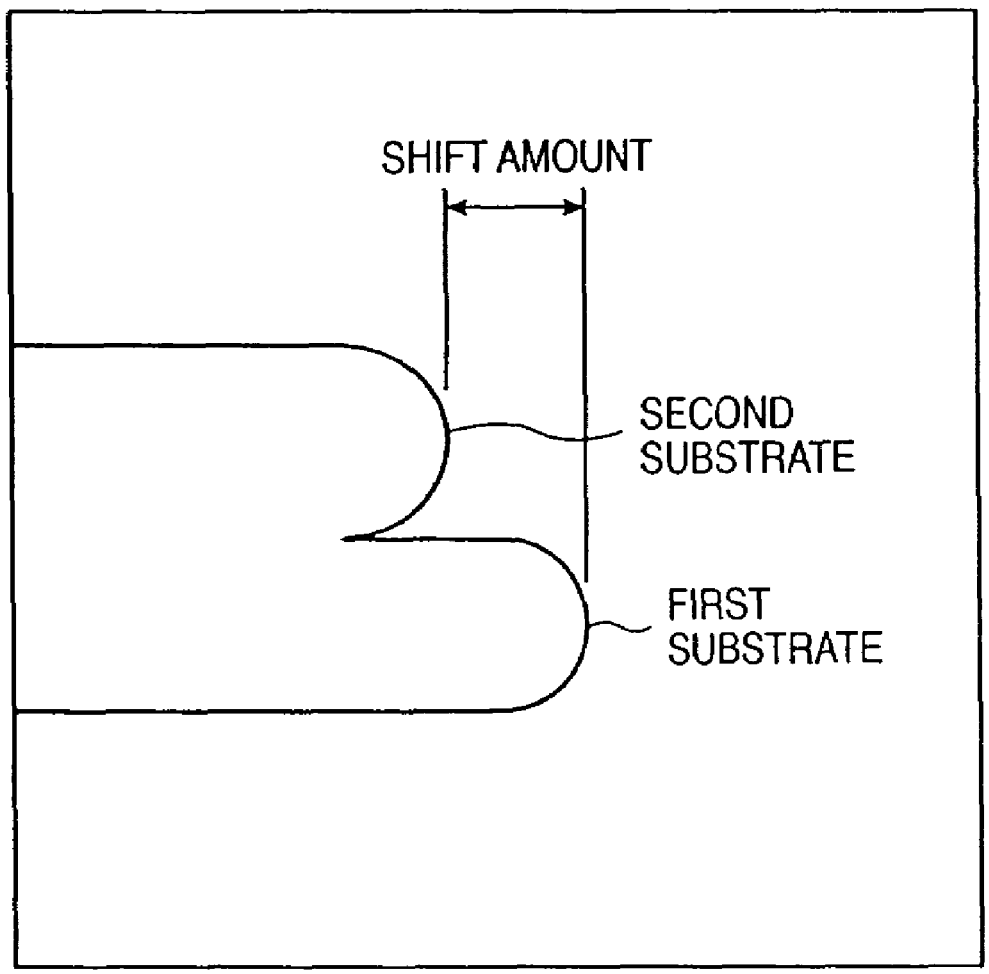
FIG. 29 is a graph showing an example of an image supplied from a camera to a computer through an interface unit in the positioning apparatus according to the fifth arrangement example.

FIG. 29 is a graph showing an example of an image supplied from the camera 4002 to the computer 1030 through the interface unit 4010. The computer 1030 extracts the contour of the edges of the first substrate 10 and second substrate of the bonded substrate stack 30 by, e.g., binarizing the image supplied from the camera 4002, and detects the shift amount between the first substrate 10 and the second substrate 20 on the basis of the contour.

Figure 30:
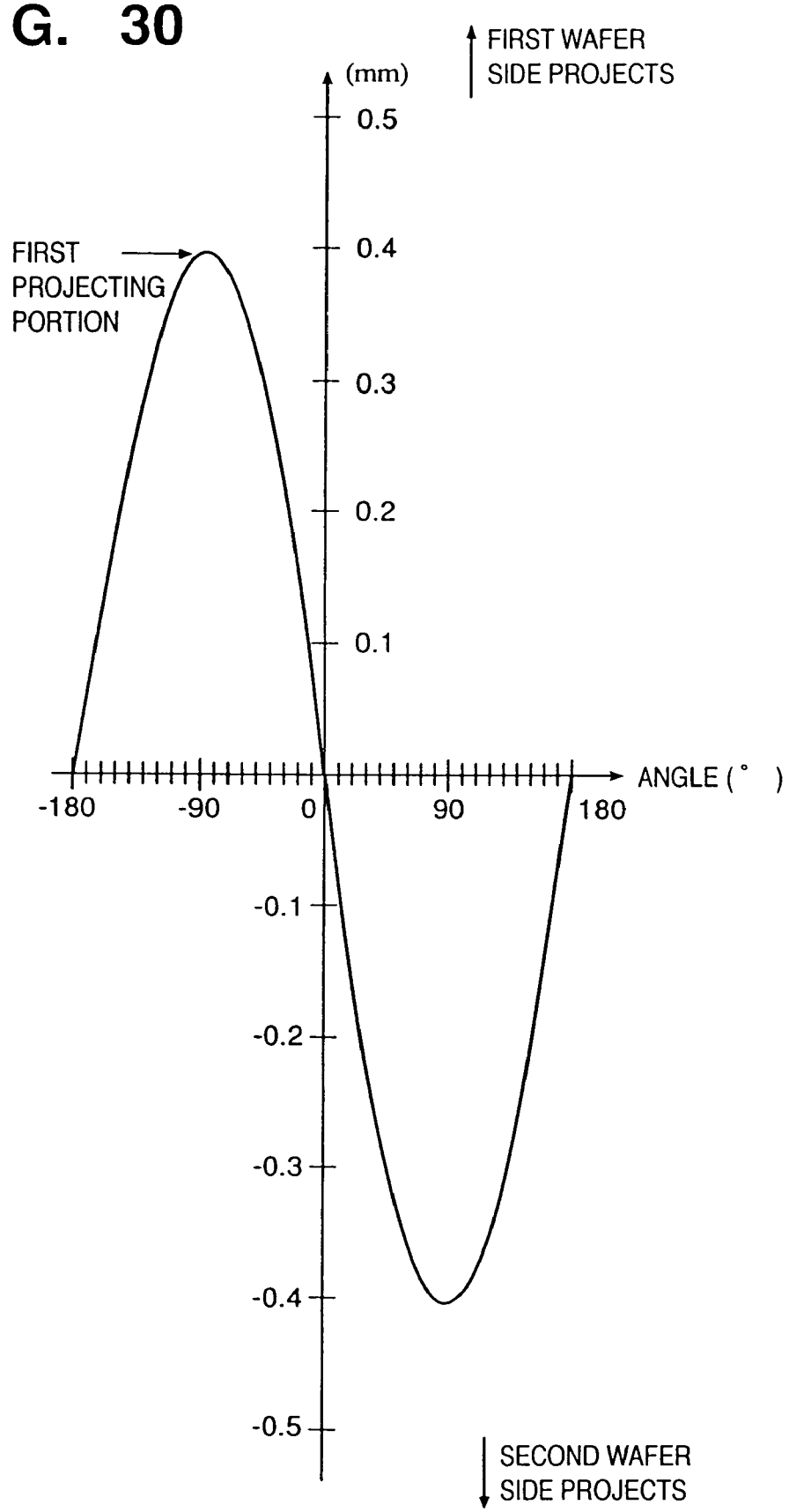
FIG. 30 is a graph showing the result of shift amount detection executed throughout the perimeter of the bonded substrate stack in the positioning apparatus according to the fifth arrangement example.

FIG. 30 is a graph showing the result of shift amount detection executed throughout the perimeter of the bonded substrate stack 30. Referring to FIG. 30, the abscissa represents the angle of rotation of the substrate rotating stage 1010, and the ordinate represents the shift amount between the edge of the first substrate 10 and that of the second substrate 20. A shift amount detected when the edge of the first substrate 10 projects outside the edge of the second substrate 20 is represented by a positive value, and a shift amount detected when the edge of the second substrate 20 projects outside the edge of the first substrate 10 is represented by a negative value. As shown in FIG. 30, at the first projecting portion, the shift amount has a positive value, and its representative position is preferably a portion where the shift amount has a positive maximal value. The position (representative position) of the first projecting portion is specified by, e.g., the angle of rotation of the substrate rotating stage 1010 (in the case shown in FIG. 30, the position of the first projecting portion corresponds to −90°).

After the position of the first projecting portion is detected, the bonded substrate stack 30 is positioned by the substrate rotating stage 1010 such that the first projecting portion matches a predetermined reference position.

Figure 31:
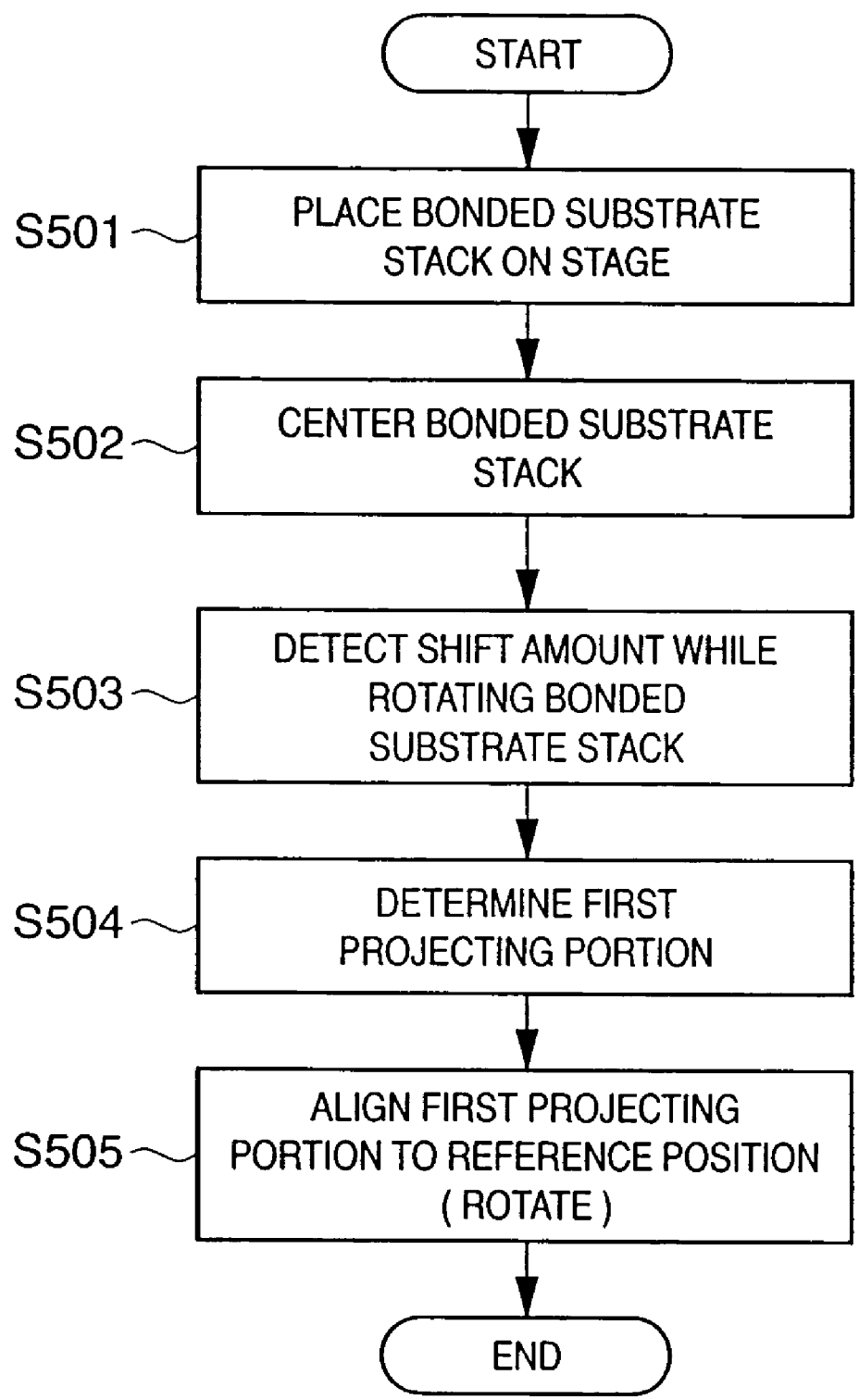
FIG. 31 is a flow chart for explaining the procedure of positioning in the positioning apparatus according to the fifth arrangement example.

The procedure of positioning in the positioning apparatus 5000 will be described next with reference to the flow chart shown in FIG. 31. The processing shown in this flow chart is controlled by the computer 1030.

In step S501, the bonded substrate stack 30 with the first substrate 10 set on the lower side is placed on the substrate rotating stage 1010 by a transfer robot (e.g., a transfer robot 1100 shown in FIG. 10). At this time, the center of the bonded substrate stack 30 is roughly aligned to the rotational center of the substrate rotating stage 1010. In addition, the upper and lower sides of the bonded substrate stack 30 are determined in advance, supplied from another apparatus or operator to the computer 1030 in placing the bonded substrate stack 30 on the substrate rotating stage 1010, or acquired by the computer 1030.

In step S502, the centering members 1001 and 1002 sandwich the bonded substrate stack 30 from both sides to align the center of the bonded substrate stack 30 to the rotational center of the substrate rotating stage 1010.

In step S503, while rotating the substrate rotating table 1010 (bonded substrate stack 30) by operating the motor 1015, the contour of the first substrate 10 and second substrate 20 of the bonded substrate stack 30 is detected using the projector 4001 and camera 4002, and the shift amount between the substrates 10 and 20 is detected on the basis of the contour. This detection is done throughout the perimeter of the bonded substrate stack 30.

In step S504, the position (representative position) of the first projecting portion is determined on the basis of the shift amount (FIG. 30) between the two substrates for a portion of the perimeter of the bonded substrate stack 30 where the first substrate 10 projects.

In step S505, the substrate rotating table 1010 is made to pivot such that the position of the first projecting portion matches the reference position, as shown in FIG. 10.

[Sixth Arrangement Example of Positioning Apparatus]

Figure 32:
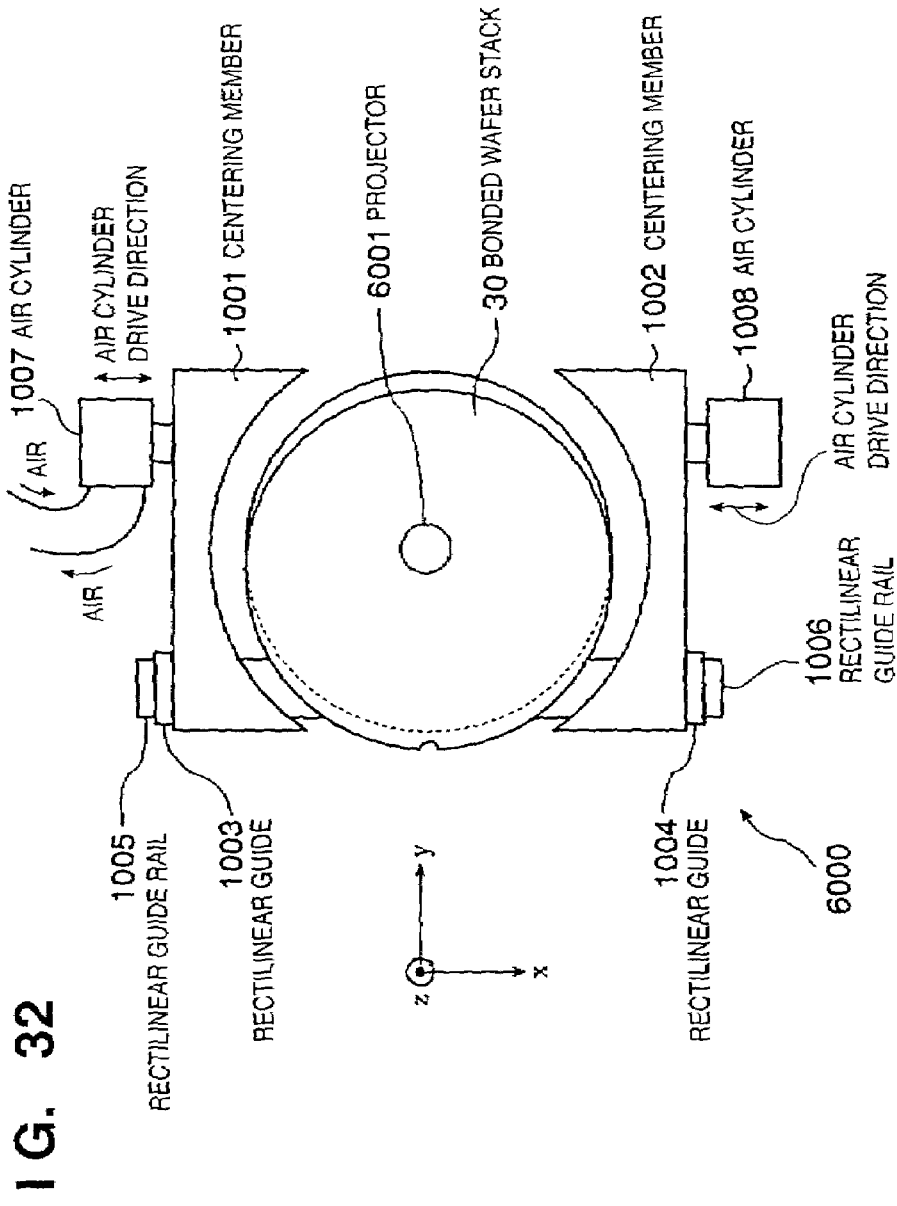
FIG. 32 is a view showing a positioning apparatus according to the sixth arrangement example.
Figure 33:
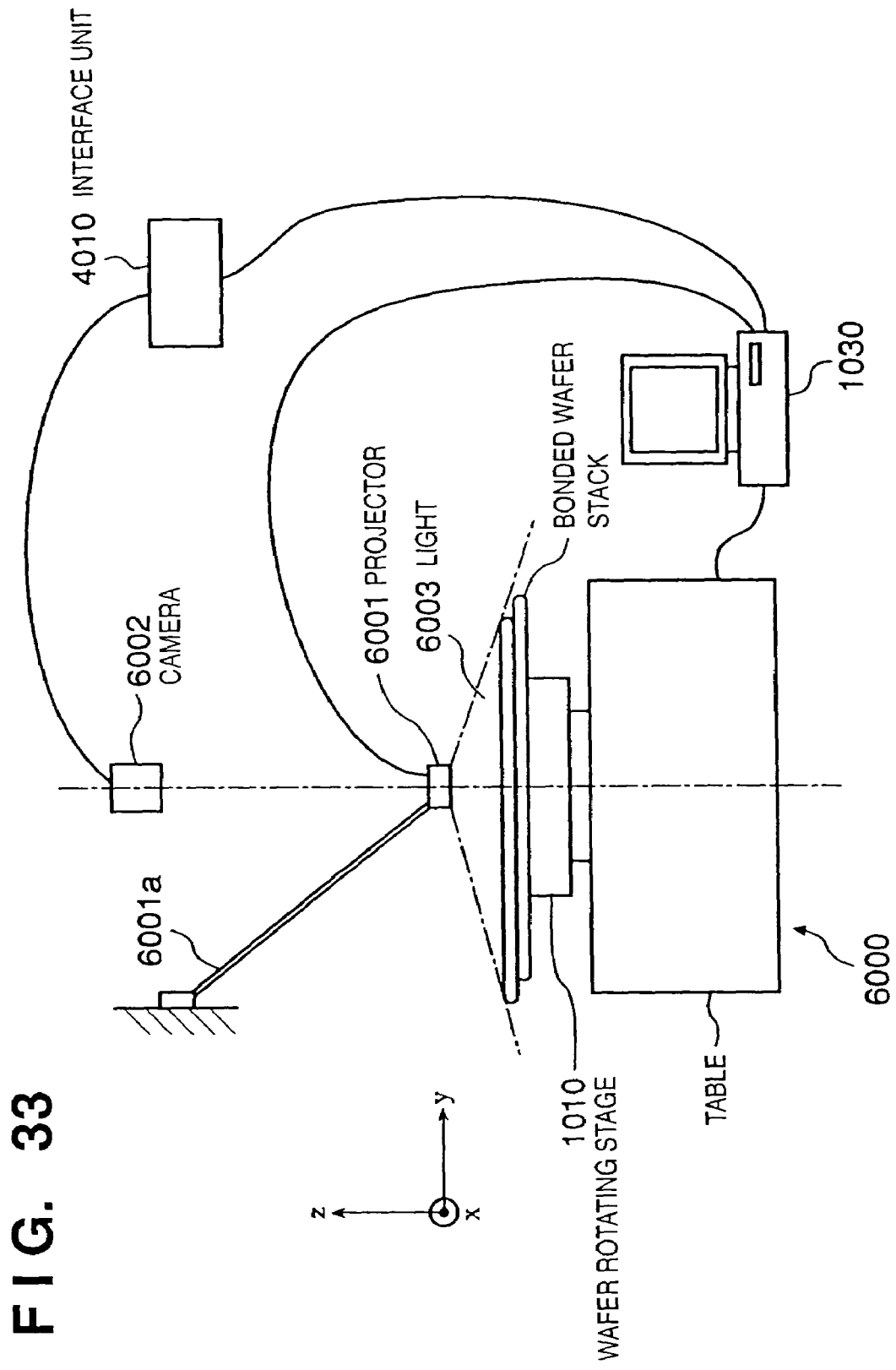
FIG. 33 is a view showing the positioning apparatus according to the sixth arrangement example.

FIGS. 32 and 33 are views showing a positioning apparatus according to the sixth arrangement example. A positioning apparatus 6000 centers a bonded substrate stack 30, detects the shift amount between the edge of a first substrate 10 and the edge of a second substrate using an image processing technique, detects the position of the first projecting portion on the basis of the shift amount, and rotates the bonded substrate stack 30 to make the first projecting portion match the reference position.

The positioning apparatus 6000 has a substrate rotating stage 1010 for rotating the bonded substrate stack 30 in the X-Y plane. The bonded substrate stack 30 is placed on the substrate rotating stage 1010 such that the first substrate 10 is set on the lower side. The substrate rotating stage 1010 is connected to the rotating shaft of a motor 1015 through a rotating shaft 1013 and coupling 1014. The motor 1015 operates in accordance with an instruction from a controller 1016 controlled by a computer 1030.

The positioning apparatus 6000 has a pair of centering members 1001 and 1002 for sandwiching the edge of the bonded substrate stack 30 from both sides as a mechanism for centering the bonded substrate stack 30 placed on the substrate rotating stage 1010 by a transfer robot (not shown). The centering member 1001 is driven along a guide rail 1005 by an air cylinder 1007. The centering member 1002 is driven along a guide rail 1006 by an air cylinder 1008. The centering members 1001 and 1002 are pushed by the air cylinders 1007 and 1008, and the bonded substrate stack 30 is sandwiched by the centering members 1001 and 1002 from both sides, thereby centering the bonded substrate stack 30.

The positioning apparatus 6000 also has a projector (light source) 6001 and camera (image sensing device) 6002 to detect the shift amount between the first substrate 10 and the second substrate 20 of the bonded substrate stack 30. The camera 6002 is connected to the computer 1030 through an interface unit (e.g., a video capture board) 4010. The projector 6001 illuminates the entire surface of the second substrate 20 of the bonded substrate stack 30 so as to illuminate the second substrate 20 and shadow the first substrate 10 through the second substrate 20 at the first projecting portion of the bonded substrate stack 30. The camera 6002 is arranged at a position where the edge of the bonded substrate stack 30 can be sensed throughout its perimeter so as to sense the edge of the bonded substrate stack 30 throughout its perimeter and supply the image to the computer 1030 through the interface unit 4010. The projector 6001 is supported by a support member 6001a. Preferably, the support member 6001a has a sufficiently small size not to affect the image of the bonded substrate stack 30 that is sensed by the camera 6002 and is arranged at an out-of-focus position.

According to this arrangement, the position of the first projecting portion can be detected without rotating the bonded substrate stack 30. Hence, the first projecting portion can be detected at a high speed.

Figure 34:
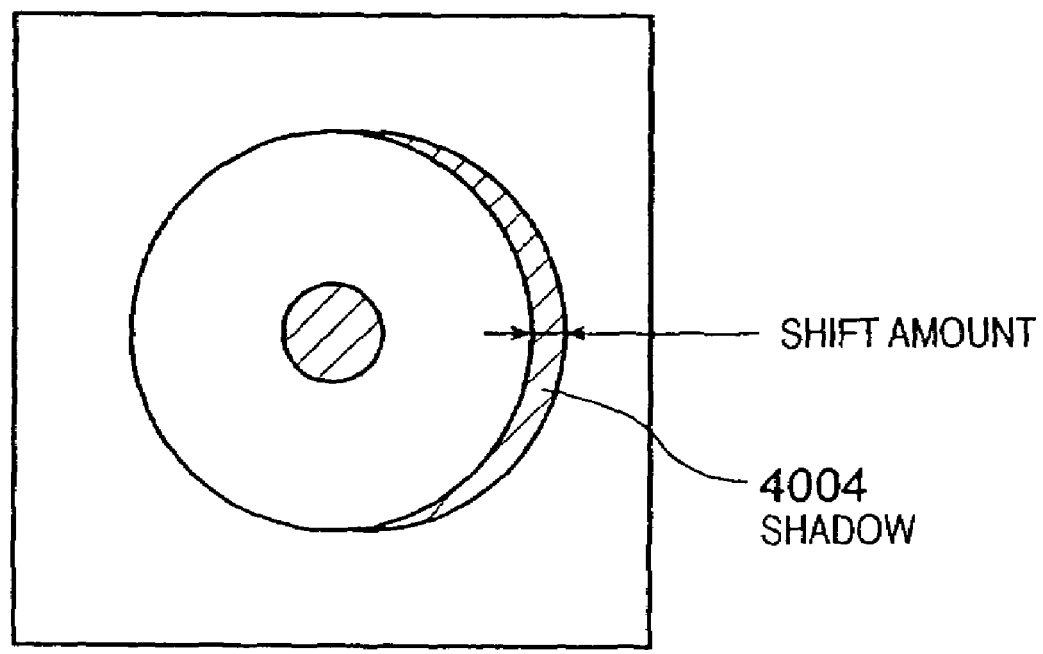
FIG. 34 is a graph showing an example of an image supplied from a camera to a computer through an interface unit in the positioning apparatus according to the sixth arrangement example.

FIG. 34 is a graph showing an example of an image supplied from the camera 6002 to the computer 1030 through the interface unit 4010. The length of a shadow 4004 formed by the second substrate 20 corresponds to the shift amount between the first substrate 10 and the second substrate 20. The computer 1030 extracts the shadow 4004 by, e.g., binarizing the image supplied from the camera 6002, detects the shift amount between the first substrate 10 and the second substrate 20 on the basis of the shadow 4004 throughout the perimeter of the bonded substrate stack 30, and determines the position of the first projecting portion on the basis of the detection result. Another projector is preferably used to clarify the edge position of the first substrate 10 as the lower substrate. This projector can be laid out to, e.g., illuminate the background of the bonded substrate stack 30 (the outside of the bonded substrate stack).

After the position of the first projecting portion is detected, the bonded substrate stack 30 is positioned by the substrate rotating stage 1010 such that the first projecting portion matches a predetermined reference position.

[Another Processing Example in Positioning Apparatus]

In the above-described first to sixth positioning apparatuses, the shift amount between the edge of the first substrate 10 and that of the second substrate is detected throughout the perimeter (i.e., along the perimeter) of the bonded substrate stack 30, and the first projecting portion is determined on the basis of the result. However, if the position of the first projecting portion is roughly known in advance, detection of the shift amount between the edge of the first substrate 10 and that of the second substrate suffices only for a range of the perimeter of the bonded substrate stack 30 where the first projecting portion is present. For example, when the bonded substrate stack has a notch, and the positional relationship between the notch and the first projecting portion is roughly defined, the position of the first projecting portion can be roughly recognized in advance on the basis of the position of the notch.

A processing system to which a positioning apparatus represented by the above first to second positioning apparatuses is applied will be described below.

[First Arrangement Example of Processing System]

Figure 35:
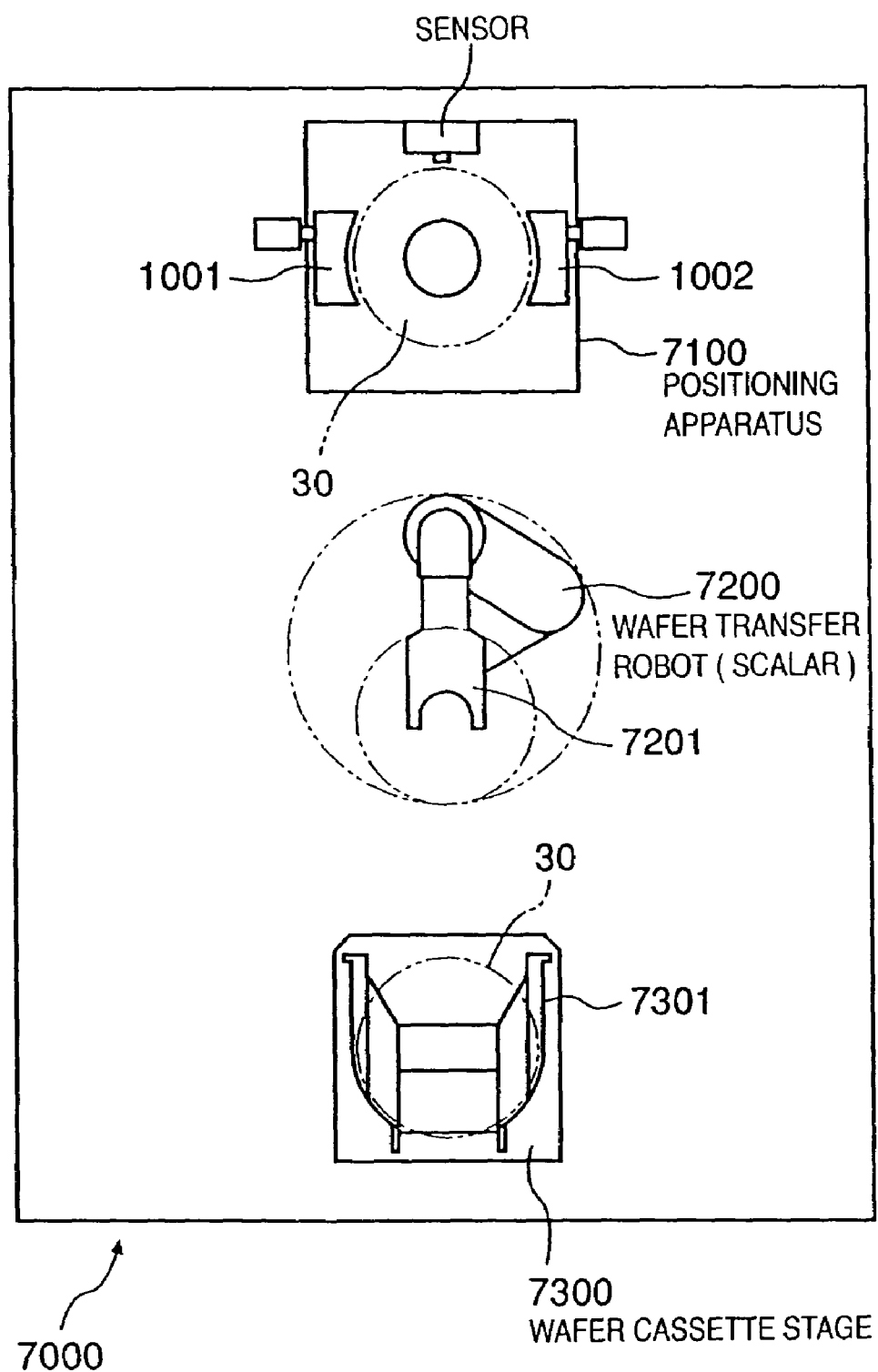
FIG. 35 is a view showing a processing system according to the first arrangement example.

FIG. 35 is a view showing a processing system according to the first arrangement example. In a processing system 7000, a bonded substrate stack 30 is extracted from a wafer cassette 7301 which stores a plurality of bonded substrate stacks 30, and transferred to a positioning apparatus 7100, the first projecting portion of the bonded substrate stack 30 is made to match the reference position in the positioning apparatus 7100, and the bonded substrate stack 30 is returned to the wafer cassette 7301. The positioning apparatus 7100 is a positioning apparatus represented by, e.g., the above first to sixth arrangement examples.

A wafer transfer robot 7200 has a mechanism for translating, e.g., a robot hand 7201 and a mechanism for rotating the robot hand 7201. The wafer transfer robot 7200 transfers the bonded substrate stack 30 between the positioning apparatus 7100 and the wafer cassette 7301 on a wafer cassette stage 7300. The wafer transfer robot 7200 can align the first projecting portion of the bonded substrate stack 30, which is aligned to the first reference position (e.g., the reference position in the positioning apparatus 7100) by the positioning apparatus 7100, to the second reference position (e.g., the reference position in the wafer cassette 7301).

When all the bonded substrate stacks 30 stored in the wafer cassette 7301 are completely positioned, the wafer cassette 7301 is transferred to a predetermined position of a separating apparatus by a transfer robot (not shown) or the like. This transfer is softly done such that the bonded substrate stacks 30 are not shifted from the second reference position.

[Second Arrangement Example of Processing System]

Figure 36:
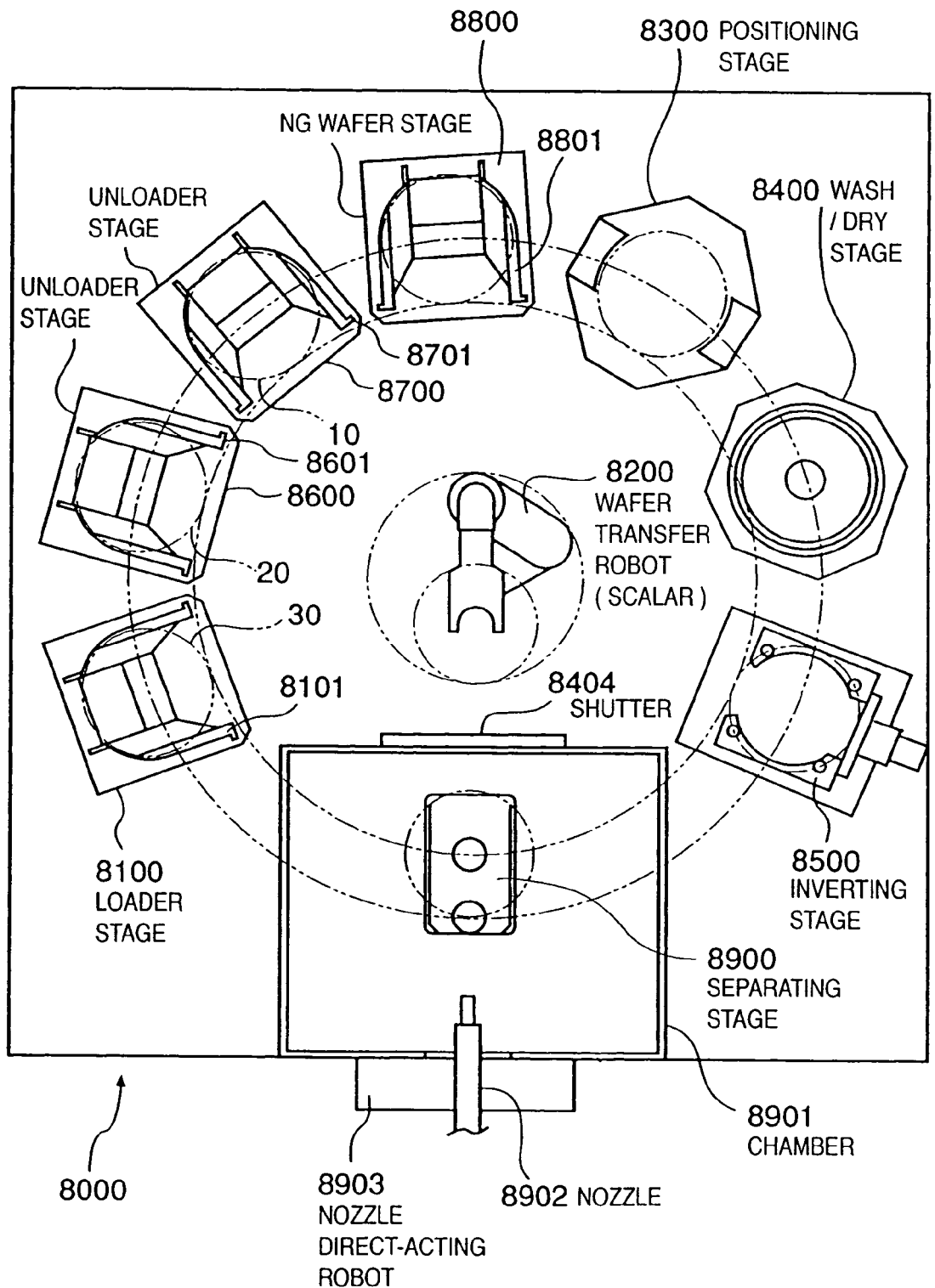
FIG. 36 is a view showing a processing system according to the second arrangement example.

FIG. 36 is a view showing a processing system according to the second arrangement example. A processing system 8000 comprises a loader stage 8100 on which a cassette 8101 that stores a plurality of bonded substrate stacks 30 to be processed is placed, a wafer transfer robot 8200 for transferring the bonded substrate stack 30 and substrates 10 and 20 after separation, a positioning stage 8300 represented by the above first to sixth positioning apparatuses 1000 to 6000, a wash/dry stage 8400 for washing and drying a separated substrate, an inverting stage 8500 for turning over a substrate, an unloader stage 8600 on which a cassette 8601 that stores separated second substrates 20 is placed, an unloader 8700 on which a cassette 8701 that stores separated first substrates 10 is placed, an NG wafer stage 8800 on which a cassette 8801 that stores substrates having errors generated by separation processing or the like is placed, and a separating apparatus 8900 represented by the first separating apparatus 100. In this processing system, a scalar robot is employed as the wafer transfer robot 8200, and the respective stages are laid out at almost equidistant positions from the wafer transfer robot 8200, i.e., at almost equidistant positions from the rotational axis of the scalar robot.

In this processing system 8000, first, a bonded substrate stack 30 is extracted from the cassette 8101 placed on the loader stage 8100 and transferred to the positioning stage 8300 by the transfer robot 8200.

The positioning stage 8300 centers the bonded substrate stack 30 and makes the first projecting portion of the bonded substrate stack 30 match the first reference position (e.g., the reference position in the positioning stage). With this operation, positioning of the bonded substrate stack 30 is ended.

After positioning, the bonded substrate stack 30 is transferred to the separating stage 8900 by the transfer robot 8200. At this time, the first projecting portion of the bonded substrate stack 30 is positioned to the second reference position (e.g., the reference position in the separating stage 8900). In the separating stage 8900, the bonded substrate stack 30 is separated at the porous layer using a fluid. The separation processing is executed in a chamber 8901 to prevent the fluid from scattering to the remaining apparatuses. The chamber 8901 has a shutter 8404 that is opened to insert/remove the substrate. The separating stage 8900 has a nozzle 8902 for injecting a fluid and a nozzle direct-acting robot 8903 for moving the nozzle 8902. In the separating stage 8900, a fluid is injected from the nozzle 8902 to the first projecting portion positioned to the second reference position, thereby forming a separation start portion at the first projecting portion. Next, separation processing is executed from the separation start portion. This separation processing is executed by injecting the fluid into the porous layer of the bonded substrate stack 30 while rotating the bonded substrate stack 30.

The separated first and second substrates 10 and 20 are transferred to the wash/dry apparatus 8400 by the transfer robot 8200, washed and dried, and transferred to the cassettes 8701 and 8601 on the unloader stages 8700 and 8600, respectively. Of the separated substrates 10 and 20, a substrate with its separated surface facing downward is inverted by the inverting stage 8500 such that that surface faces upward and then is transferred and stored in a corresponding cassette by the transfer robot 8200.

A substrate having an error generated by separation processing (e.g., a broken substrate) is transferred and stored in a cassette on the NG wafer stage 8800 by the transfer robot 8200.

[Third Arrangement Example of Processing System]

FIG. 37 is a view showing a processing system according to the third arrangement example. A processing system 9000 comprises a loader stage 8100 on which a cassette 8101 that stores a plurality of bonded substrate stacks 30 to be processed is placed, a wafer transfer robot 9100 for transferring the bonded substrate stack 30 and substrates 10 and 20 after separation, a positioning stage 8300 represented by the above first to sixth positioning apparatuses 1000 to 6000, a wash/dry stage 8400 for washing and drying a separated substrate, an inverting stage 8500 for turning over a substrate, an unloader stage 8600 on which a cassette 8601 that stores separated second substrates 20 is placed, an unloader 8700 on which a cassette 8701 that stores separated first substrates 10 is placed, an NG wafer stage 8800 on which a cassette 8801 that stores substrates having errors generated by separation processing or the like is placed, and a separating apparatus 8900 represented by the first separating apparatus 100. In this processing system 9000, a robot made by combining a scalar robot and a direct-acting robot that linearly moves along the horizontal drive shaft is employed as the wafer transfer robot 9100, and the respective stages are laid out at almost equidistant positions from the horizontal drive shaft of the wafer transfer robot 9100.

In this processing system 9000, first, a bonded substrate stack 30 is extracted from the cassette 8101 placed on the loader stage 8100 and transferred to the positioning stage 8300 by the transfer robot 9100.

The positioning stage 8300 centers the bonded substrate stack 30 and makes the first projecting portion of the bonded substrate stack 30 match the first reference position (e.g., the reference position in the positioning stage). With this operation, positioning of the bonded substrate stack 30 is ended.

After positioning, the bonded substrate stack 30 is transferred to the separating stage 8900 by the transfer robot 9100. At this time, the first projecting portion of the bonded substrate stack 30 is positioned to the second reference position (e.g., the reference position in the separating stage 8900). In the separating stage 8900, the bonded substrate stack 30 is separated at the porous layer using a fluid. The separation processing is executed in a chamber 8901 to prevent the fluid from scattering to the remaining apparatuses. The chamber 8901 has a shutter 8404 that is opened to insert/remove the substrate. The separating stage 8900 has a nozzle 8902 for injecting a fluid and a nozzle direct-acting robot 8903 for moving the nozzle 8902. In the separating stage 8900, a fluid is injected from the nozzle 8902 to the first projecting portion positioned to the second reference position, thereby forming a separation start portion at the first projecting portion. Next, separation processing is executed from the separation start portion. This separation processing is executed by injecting the fluid into the porous layer of the bonded substrate stack 30 while rotating the bonded substrate stack 30.

The separated first and second substrates 10 and 20 are transferred to the wash/dry apparatus 8400 by the transfer robot 9100, washed and dried, and transferred to the cassettes 8701 and 8601 on the unloader stages 8700 and 8600, respectively. Of the separated substrates 10 and 20, a substrate with its separated surface facing downward is inverted by the inverting stage 8500 such that that surface faces upward and then is transferred and stored in a corresponding cassette by the transfer robot 9100.

A substrate having an error generated by separation processing (e.g., a broken substrate) is transferred and stored in a cassette on the NG wafer stage 8800 by the transfer robot 9100.

[Example of Semiconductor Device]

A semiconductor device using a semiconductor substrate that can be manufactured by the above substrate manufacturing method (FIGS. 1A to 1G) and a method of manufacturing the device will be described next with reference to FIGS. 38A to 38D.

FIGS. 38A to 38D are sectional views showing a method of manufacturing a semiconductor device using a semiconductor substrate that can be manufactured using the substrate manufacturing method according to the preferred embodiment of the present invention.

First, an SOI substrate having a semiconductor layer as a non-porous layer 13 and an insulating layer as a non-porous layer 14 is manufactured using the above substrate manufacturing method. An active region 13' where a transistor is to be formed and an element isolation region 54 are formed by a method of patterning a non-porous semiconductor layer (SOI layer) 103 on the buried insulating layer 14 into an island shape or an oxidation method called LOCOS (FIG. 38A).

Figure 38A:
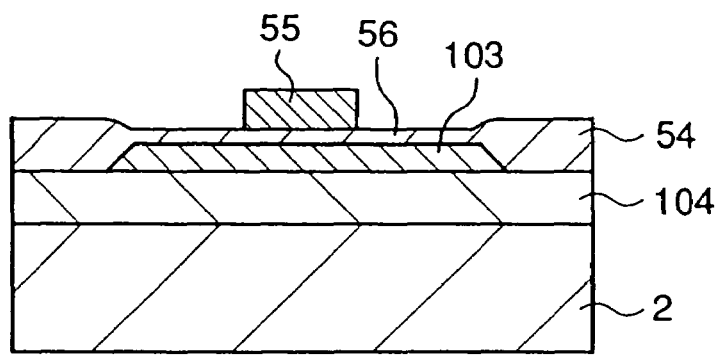
FIGS. 38A to 38D are sectional views showing a method of manufacturing a semiconductor device using a semiconductor substrate manufactured using the substrate manufacturing method according to the preferred embodiment of the present invention.

Next, a gate insulating film 56 is formed on the surface of the SOI layer (FIG. 38A). Examples of the material of the gate insulating film 56 are silicon oxide, silicon nitride, silicon oxynitride, aluminum oxide, tantalum oxide, hafnium oxide, titanium oxide, scandium oxide, yttrium oxide, gadolinium oxide, lanthanum oxide, zirconium oxide, and a glass mixture thereof. The gate insulating film 56 can be formed by, e.g., oxidizing the surface of the SOI layer or depositing an appropriate substance on the surface of the SOI layer by CVD or PVD.

A gate electrode 55 is formed on the gate insulating film 56 (FIG. 38A). The gate electrode 55 can be formed from, e.g., polysilicon doped with a p- or n-type impurity, a metal such as tungsten, molybdenum, titanium, tantalum, aluminum, or copper or an alloy containing at least one of them, a metal silicide such as molybdenum silicide, tungsten silicide, or cobalt silicide, or a metal nitride such as titanium nitride, tungsten nitride, or tantalum nitride. The gate insulating film 56 may be formed by stacking a plurality of layers formed from different materials. The gate electrode 55 can be formed either by, e.g., a method called Salicide (self-align silicide) or by a method called a damascene gate process, or by any other method. With the above process, a structure shown in FIG. 38A is obtained.

Figure 38B:
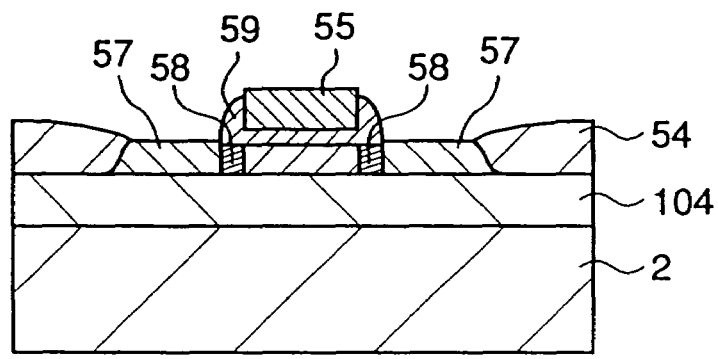

Next, an n-type impurity such as phosphor, arsenic, or antimony or a p-type impurity such as boron is doped into the active region 103', thereby forming relatively lightly-doped source and drain regions 58 (FIG. 38B). The impurity can be doped by, e.g., ion implantation and annealing.

An insulating film is formed to cover the gate electrode 55 and then etched back, thereby forming a side wall 59 on the side surface of the gate electrode 55.

An impurity having the same conductivity type as described above is doped into the active region 103' again, thereby forming relatively heavily-doped source and drain regions 57. With the above process, a structure shown in FIG. 38B is obtained.

Figure 38C:
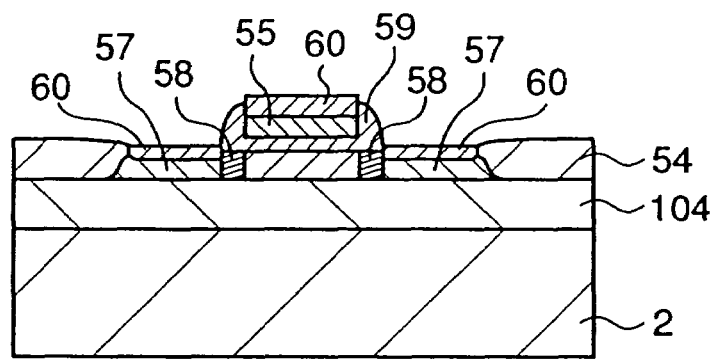

A metal silicide layer 60 is formed on the upper surface of the gate electrode 55 and on the upper surfaces of the source and drain regions 57. Examples of the material of the metal silicide layer 60 are nickel silicide, titanium silicide, cobalt silicide, molybdenum silicide, and tungsten silicide. Such a silicide can be formed by depositing a metal on the upper surface of the gate electrode 55 and on the upper surfaces of the source and drain regions 57, performing annealing to cause the metal to react with underlying silicon, and removing an unreacted portion of the metal using an etchant such as sulfuric acid. The surface of the silicide layer may be nitrided as needed. With the above process, a structure shown in FIG. 38C is obtained.

Figure 38D:
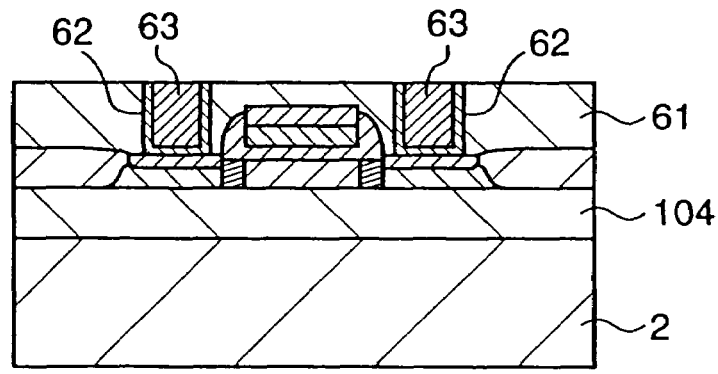

An insulating film 61 is formed on the upper surface of the gate electrode and on the upper surfaces of the source and drain regions, which are converted into a silicide (FIG. 38D). As the material of the insulating film 61, silicon oxide containing phosphor and/or boron can be used.

Contact holes are formed in the insulating film 61 by CMP, as needed. When photolithography using a KrF excimer laser, an ArF excimer laser, an $F_2$ excimer laser, an electron beam, or X-rays is used, a rectangular contact hole with a side smaller than 0.25 μm or a circular contact hole having a diameter smaller than 0.25 μm can be formed.

Next, the contact holes are filled with a conductor. To fill the contact holes with a conductor, a film of a refractory metal or a nitride thereof, which serves as a barrier metal, is formed on the inner surface of each contact hole, and after that, a conductor 63 such as a tungsten alloy, aluminum, aluminum alloy, copper, or copper alloy is deposited by CVD, PVD, or plating. A conductor may be deposited to a level higher than the upper surface of the insulating film 61 and removed by etch back or CMP. Alternatively, before the contact holes are filled with the conductor, the surface of the silicide layer in the source and drain regions, which is exposed to the bottom portion of each contact hole, may be nitrided. With the above process, a transistor such as an FET can be formed on the SOI layer, and a semiconductor device having a transistor with a structure shown in FIG. 38D can be obtained.

When the thickness and impurity concentration of the active layer (SOI layer) 13' are defined such that a depletion layer formed upon applying a voltage to the gate electrode reaches the upper surface of the buried insulating layer 14, the formed transistor operates a complete depletion type transistor. When the thickness and impurity concentration of the active layer (SOI layer) 13' are defined such that the depletion layer does not reach the upper surface of the buried insulating layer 14, the formed transistor operates a partial depletion type transistor.

According to the present invention, a composite member such as a bonded substrate stack can be appropriately separated at a separation layer such as a porous layer.

As many apparently widely different embodiments of the present invention can be made without departing from the spirit and scope thereof, it is to be understood that the invention is not limited to the specific embodiments thereof except as defined in the appended claims.

What is claimed is:

1. A detection method of detecting a feature portion of a composite member having a structure in which a first member having a separation layer inside is brought into tight contact with a second member, the composite member having, as the feature portion, a portion at which a peripheral edge of the first member projects outside a peripheral edge of the second member, the method comprising:
   the shift detection step of detecting a shift between the peripheral edge of the first member and the peripheral edge of the second member along an outer periphery of the composite member using a sensor; and
   the determination step of determining the feature portion on the basis of a detection result in the shift detection step.

2. The method according to claim 1, wherein, in the shift detection step, the shift between the peripheral edge of the first member and the peripheral edge of the second member is detected along a perimeter of the composite member.

3. The method according to claim 1, wherein the sensor includes a noncontact sensor.

4. The method according to claim 1, wherein the sensor includes a contact sensor.

5. The method according to claim 1, wherein the sensor is arranged on a side of a peripheral edge of the composite member.

6. The method according to claim 1, wherein the sensor is arranged at a position opposing a bonding interface between the first and second members.

7. The method according to claim 1, wherein the sensor includes an image sensing device and, in the detection step, the projection portion is detected by sensing the composite member with the image sensing device and processing a sensed image.

8. The method according to claim 1, wherein the sensor includes an image sensing device and, in the detection step, the projection portion is detected by sensing the composite member with the image sensing device and while illuminating the composite member so as to form a shadow at the projecting portion, and processing a sensed image.

9. The method according to claim 1, wherein the sensor includes an image sensing device arranged in a tangent direction of a peripheral edge of the composite member and, in the detection step, the projection portion is detected by sensing the peripheral edge of the composite member with the image sensing device and processing a sensed image.

10. The method according to claim 1, wherein, in the determination step, a portion where the peripheral edge of the first member most largely projects is determined as the feature portion.

11. A processing method of positioning, to a predetermined position, a feature portion of a composite member having a structure in which a first member having a separation layer inside is brought into tight contact with a second member, the composite member having, as the feature portion, a portion at which a peripheral edge of the first member projects outside a peripheral edge of the second member, the method comprising:

the shift detection step of detecting a shift between the peripheral edge of the first member and the peripheral edge of the second member along an outer periphery of the composite member;

the determination step of determining the feature portion on the basis of a detection result in the shift detection step; and the arrangement step of arranging the composite member to make the feature portion determined in the determination step match the predetermined position.

* * * * *

UNITED STATES PATENT AND TRADEMARK OFFICE
CERTIFICATE OF CORRECTION

PATENT NO. : 6,979,629 B2
DATED : December 27, 2005
INVENTOR(S) : Kazutaka Yanagita et al.

It is certified that error appears in the above-identified patent and that said Letters Patent is hereby corrected as shown below:

Column 8,
Line 58, "edge" should read -- edge of the first member projects outside a peripheral edge --.

Column 20,
Line 54, "first" should read -- second -- and "10 is" should read -- 20 projects outside the edge of the first substrate 10 is --.

Column 21,
Line 48, "every" should read -- for every --.

Signed and Sealed this

Sixth Day of June, 2006

JON W. DUDAS
*Director of the United States Patent and Trademark Office*